(12) United States Patent
Abe et al.

(10) Patent No.: US 9,028,980 B2
(45) Date of Patent: May 12, 2015

(54) ORGANIC ELECTROLUMINESCENT ELEMENT, COMPOSITION FOR ORGANIC ELECTROLUMINESCENT ELEMENT, AND ORGANIC ELECTROLUMINESCENT DEVICE

(71) Applicant: Mitsubishi Chemical Corporation, Chiyoda-ku (JP)

(72) Inventors: Tomohiro Abe, Kanagawa (JP); Futoshi Tanaka, Kanagawa (JP); Kazuki Okabe, Kanagawa (JP); Atsushi Takahashi, Kanagawa (JP); Koichiro Iida, Kanagawa (JP); Ichiro Imada, Kanagawa (JP)

(73) Assignee: Mitsubishi Chemical Corporation, Chiyoda-ku (JP)

( * ) Notice: Subject to any disclaimer, the term of this patent is extended or adjusted under 35 U.S.C. 154(b) by 59 days.

(21) Appl. No.: 13/941,828

(22) Filed: Jul. 15, 2013

(65) Prior Publication Data

US 2013/0334512 A1    Dec. 19, 2013

Related U.S. Application Data

(63) Continuation of application No. PCT/JP2012/050521, filed on Jan. 12, 2012.

(30) Foreign Application Priority Data

Jan. 14, 2011  (JP) .................................. 2011-006014
Nov. 15, 2011  (JP) .................................. 2011-249769

(51) Int. Cl.
*H01L 51/00*     (2006.01)
*C08G 73/02*    (2006.01)
(Continued)

(52) U.S. Cl.
CPC .......... *H01L 51/0035* (2013.01); *C08G 73/026* (2013.01); *C08L 79/02* (2013.01);
(Continued)

(58) Field of Classification Search
CPC .. C08G 73/026; C08G 79/02; H01L 51/0043; H01L 51/0035; H01L 51/5064; C09B 57/00; C09B 57/008; C09B 1/00
See application file for complete search history.

(56) References Cited

U.S. PATENT DOCUMENTS 5,728,801 A    3/1998   Wu et al.
5,948,552 A *  9/1999   Antoniadis et al. ........... 428/690
(Continued)

FOREIGN PATENT DOCUMENTS

JP      6-314594    11/1994
JP     10-308280    11/1998
(Continued)

OTHER PUBLICATIONS

Sun et al., Applied Physics Letters, vol. 89, 153501 (2006).*
(Continued)

*Primary Examiner* — Dawn L. Garrett
(74) *Attorney, Agent, or Firm* — Oblon, McClelland, Maier & Neustadt, L.L.P.

(57) ABSTRACT

The present invention relates to an organic electroluminescent element which comprises two or more hole injection/transport layers each formed by a wet film formation method using a composition containing, as a hole-injecting/transporting compound, an arylamine polymer compound that has a repeating unit having a triarylamine structure therein, in which when the number of atoms present on the path which is the smallest in the number of atoms present thereon, of the paths which each connect the nonaromatic tertiary nitrogen atoms contained in any two triarylamine structures present in each polymer compound, is taken as N: the minimum number of atoms between nitrogen atoms in the compound, then the N in each hole injection/transport layer is in a specific state.

53 Claims, 1 Drawing Sheet

(51) Int. Cl.
*C08L 79/02* (2006.01)
*H01L 51/50* (2006.01)
*C09B 57/00* (2006.01)
*C09B 1/00* (2006.01)

(52) U.S. Cl.
CPC ........ *H01L51/0043* (2013.01); *H01L 51/5064* (2013.01); *C09B 57/00* (2013.01); *C09B 57/008* (2013.01); *C09B 1/00* (2013.01); *Y10S 428/917* (2013.01)

(56) References Cited

U.S. PATENT DOCUMENTS

| | | | |
|---|---|---|---|
| 2005/0147846 A1* | 7/2005 | Marks et al. | 428/690 |
| 2009/0062440 A1* | 3/2009 | Marks et al. | 524/188 |
| 2010/0045174 A1 | 2/2010 | Okabe et al. | |
| 2011/0114926 A1 | 5/2011 | Okabe et al. | |
| 2012/0286653 A1 | 11/2012 | Abe et al. | |

FOREIGN PATENT DOCUMENTS

| | | |
|---|---|---|
| JP | 2008-69367 | 3/2008 |
| JP | 2008-223012 | 9/2008 |
| JP | 2008-239948 | 10/2008 |
| JP | 2008-248241 | 10/2008 |
| JP | 2009-79092 | 4/2009 |
| JP | 2009-158535 | 7/2009 |
| JP | 2009-278076 | 11/2009 |
| WO | WO 2008/108430 A1 | 9/2008 |

OTHER PUBLICATIONS

U.S. Appl. No. 14/273,992, filed May 9, 2014, Tanaka, et al.
International Search Report issued Apr. 17, 2012, in International application No. PCT/JP2012/050521.

* cited by examiner

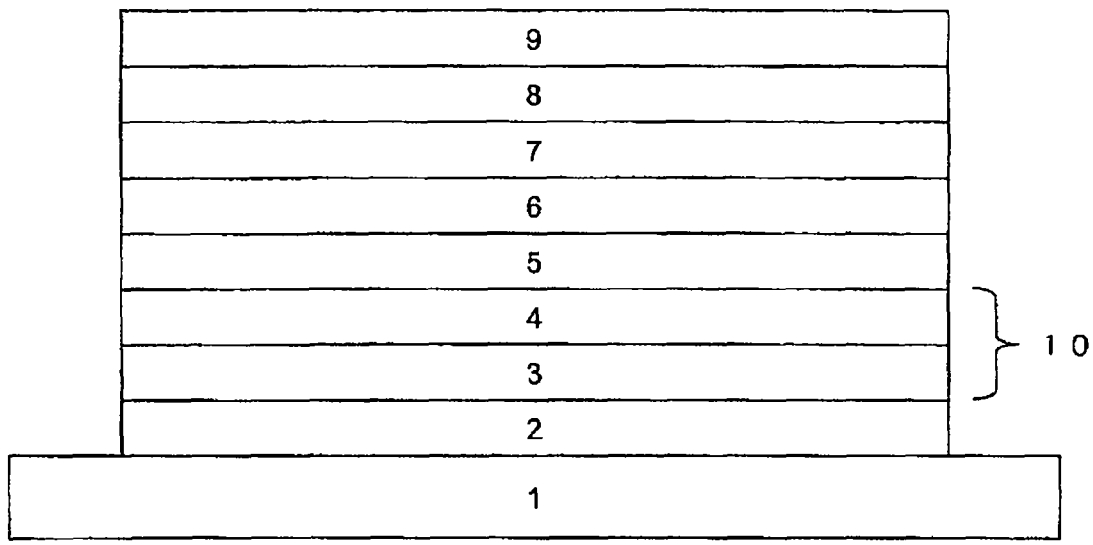

ORGANIC ELECTROLUMINESCENT ELEMENT, COMPOSITION FOR ORGANIC ELECTROLUMINESCENT ELEMENT, AND ORGANIC ELECTROLUMINESCENT DEVICE

TECHNICAL FIELD

The present invention relates to an organic electroluminescent element, a composition for organic electroluminescent element, and an organic electroluminescent device.

BACKGROUND ART

In recent years, organic electroluminescent elements are being developed enthusiastically as a technique for producing light-emitting devices such as displays, illuminators, and the like because the elements can be made to emit light of various colors using a simple element configuration.

An organic electroluminescent element is an element in which positive and negative charges (carriers) are injected into an organic layer interposed between electrodes and the carriers are recombined to thereby obtain luminescence. Specifically, such organic electroluminescent elements which have been disclosed include, for example, an organic electroluminescent element that has a hole injection/transport layer obtained by forming a film of a composition containing an arylamine polymer compound by a wet process (see patent literatures 1 and 2). Furthermore, an organic electroluminescent element having a hole injection/transport layer which contains two arylamine polymers and a similar organic electroluminescent element have been disclosed (see patent literatures 3 and 4).

CITATION LIST

Patent Literature

Patent Literature 1: JP-A-10-308280
Patent Literature 2: JP-A-2008-69367
Patent Literature 3: JP-A-2008-223012
Patent Literature 4: JP-A-2009-79092

SUMMARY OF INVENTION

Technical Problem

However, the conventional organic electroluminescent elements are still insufficient for the practical use thereof as light-emitting devices, and there is a need for a further reduction in operating voltage and a further reduction in power consumption.

The invention has been achieved in view of these problems, and an object of the invention is to provide an organic electroluminescent element which has a low operating voltage.

Solution to Problem

The present inventors diligently made investigations in order to overcome those problems. As a result, the inventors have found that an organic electroluminescent element capable of eliminating the problems is obtained by employing a configuration which includes two or more hole injection/transport layers interposed between an anode and a luminescent layer and formed by a wet film formation method using a composition containing, as a hole-injecting/transporting compound, an arylamine polymer compound that has repeating units having a triarylamine structure therein and in which when the number of atoms present on the path which is the smallest in the number of atoms present thereon, of the paths which each connect the nonaromatic tertiary nitrogen atoms contained in any two triarylamine structures present in each arylamine polymer compound, is taken as the minimum number of atoms between nitrogen atoms in the compound and expressed by N, then the N in each hole injection/transport layer is in a specific state. The invention has been thus completed.

Namely, a first essential point of the invention resides in an organic electroluminescent element, which at least comprises an anode, a hole injection/transport layer A, a luminescent layer and a cathode, in this order, wherein the hole injection/transport layer A comprises two or more layers each formed by a wet film formation method using a composition which contains a hole-injecting/transporting compound, and satisfies all of the following requirements (a) to (c):

(a) the number of kind of the hole-injecting/transporting compound contained in the composition to be used for forming the hole injection/transport layer A is 3 or more in total, with the proviso that when the hole-injecting/transporting compound is a polymer compound, two or more polymer compounds which differ only in copolymerization ratio are regarded to be the same kind;

(b) the compositions to be used for forming the at least two layers included in the hole injection/transport layer A each contain, as a hole-injecting/transporting compound, at least one kind of arylamine polymer compound which has a repeating unit having a triarylamine structure therein, the arylamine polymer compounds being different from each other in kind; and (c) when the number of atom present on the path which is the smallest in the number of atoms present thereon, of the paths which each connect the nonaromatic tertiary nitrogen atoms contained in any two triarylamine structures present in each arylamine polymer compound, is taken as N: the minimum number of atoms between nitrogen atoms in the compound, and when the layer located most on the cathode side and the layer located most on the anode side, among the two or more layers each formed using a composition containing the arylamine polymer compound, are expressed by Lc and La, respectively, the maximum value of N for all arylamine polymer compounds contained in the composition to be used for forming the layer Lc is expressed by $Nc_{max}$, and the minimum value of N for all arylamine polymer compounds contained in the composition to be used for forming the layer La is expressed by $Na_{min}$, then the $Nc_{max}$ and the $Na_{min}$ satisfy $Nc_{max} \geq Na_{min}$.

A second essential point of the invention resides in the organic electroluminescent element according to the first essential point, wherein the $Nc_{max}$ and the $Na_{min}$ satisfy $Nc_{max} > Na_{min}$.

A third essential point of the invention resides in the organic electroluminescent element according to the first or second essential point, wherein when, of any two or more of the layers each formed by a wet film formation method using a composition containing the arylamine polymer compound, the layer located more on the cathode side is expressed by Lc' and the layer located more on the anode side is expressed by La' and when the minimum value of N for all arylamine polymer compounds contained in the composition to be used for forming the layer Lc' is expressed by $Nc'_{min}$ and the maximum value of N for all arylamine polymer compounds contained in the composition to be used for forming the layer La' is expressed by Na'$_{max}$, then the Nc'$_{min}$ and the Na'$_{max}$ satisfy Nc'$_{min}$≥Na'$_{max}$.

A fourth essential point of the invention resides in the organic electroluminescent element according to the third essential point, wherein the Nc'$_{min}$ and the Na'$_{max}$ satisfy Nc'$_{min}$>Na'$_{max}$.

A fifth essential point of the invention resides in the organic electroluminescent element according to any one of the first to fourth essential points, wherein the Na$_{min}$ is 2 or more but 10 or less.

A sixth essential point of the invention resides in the organic electroluminescent element according to any one of the first to fifth essential points, wherein the Nc$_{max}$ is 9 or larger.

A seventh essential point of the invention resides in the organic electroluminescent element according to any one of the first to sixth essential points, wherein with respect to any two adjoining layers among the two or more layers each formed by a wet film formation method using a composition containing the arylamine polymer compound, the composition to be used for forming the anode-side layer contains one or more kinds of the arylamine compounds, and the composition for forming the layer which adjoins the cathode-side surface contains two or more kinds of the arylamine compounds.

An eighth essential point of the invention resides in the organic electroluminescent element according to any one of the first to sixth essential points, wherein with respect to any two adjoining layers among the two or more layers each formed by a wet film formation method using a composition containing the arylamine polymer compound, the composition to be used for forming the cathode-side layer contains one or more kinds of the arylamine compounds, and the composition for forming the layer which adjoins the anode-side surface contains two or more kinds of the arylamine compounds.

A ninth essential point of the invention resides in the organic electroluminescent element according to any one of the first to eighth essential points, wherein the hole injection/transport layer A comprises three or more layers.

A tenth essential point of the invention resides in the organic electroluminescent element according to any one of the first to ninth essential points, wherein the compositions to be used for forming all layers possessed by the hole injection/transport layer A each contain the arylamine polymer compound.

An eleventh essential point of the invention resides in the organic electroluminescent element according to any one of the first to tenth essential points, wherein each of the compositions to be used for forming layers possessed by the hole injection/transport layer A contains arylamine polymer compounds which are different in kind from each other.

A twelfth essential point of the invention resides in the organic electroluminescent element according to any one of the first to eleventh essential points, wherein the nonaromatic tertiary nitrogen atoms possessed by each arylamine polymer compound each are contained in the main chain of the arylamine polymer compound.

A thirteenth essential point of the invention resides in the organic electroluminescent element according to any one of the first to twelfth essential points, wherein at least one of the arylamine polymer compounds has a crosslinkable group.

A fourteenth essential point of the invention resides in the organic electroluminescent element according to any one of the first to thirteenth essential points, wherein the composition to be used for forming the layer La, among the layers possessed by the hole injection/transport layer A, contains an electron-accepting compound in an amount of 0.1% by weight or more but less than 50% by weight.

A fifteen essential point of the invention resides in the organic electroluminescent element according to the fourteenth essential point, wherein the electron-accepting compound forms an ion pair with the hole-injecting/transporting compound in the layer La.

A sixteen essential point of the invention resides in a composition for organic electroluminescent element which is for forming a layer to be interposed between an anode and a luminescent layer of an organic electroluminescent element by a wet film formation method, and satisfies the following requirements (d) and (e):

(d) the composition contains three or more kinds of arylamine polymer compounds which have a repeating unit having a triarylamine structure therein, with the proviso that when the hole-injecting/transporting compound is a polymer compound, two or more polymer compounds which differ only in copolymerization ratio are regarded to be the same kind; and (e) when the number of atoms present on the path which is the smallest in the number of atoms present thereon, of the paths which each connect the nonaromatic tertiary nitrogen atoms contained in any two triarylamine structures present in each arylamine polymer compound, is taken as N: the minimum number of atoms between nitrogen atoms in the compound, then two or more of the three or more kinds of arylamine polymer compounds differ in N from each other.

A seventeenth essential point of the invention resides in the composition for organic electroluminescent element according to the sixteenth essential point, which comprises three or more of the arylamine polymer compounds that differ in N from each other.

An eighteenth essential point of the invention resides in the composition for organic electroluminescent element according to the sixteenth or seventeenth essential point, wherein when the minimum value and maximum value of N for the arylamine polymer compounds contained in the composition are expressed by N$_{min}$ and N$_{max}$, respectively, the N$_{max}$ is larger than 2.0 times the N$_{min}$ (N$_{max}$>2.0N$_{min}$).

A nineteenth essential point of the invention resides in the composition for organic electroluminescent element according to any one of the sixteenth to eighteenth essential points, wherein when the minimum value and maximum value of N for the arylamine polymer compounds contained in the composition are expressed by N$_{min}$ and N$_{max}$, respectively, then the composition contains an arylamine polymer compound in which the value of N is (N$_{max}$−4) or less but (N$_{min}$+4) or larger (N$_{max}$−4≥N≥N$_{min}$+4).

A twentieth essential point of the invention resides in an organic electroluminescent element comprising a layer formed by a wet film formation method using the composition for organic electroluminescent element according to any one of the sixteenth to nineteenth essential points.

A twenty first essential point of the invention resides in an organic electroluminescent device comprising the organic electroluminescent element according to any one of the first to fifteenth and twentieth essential points.

A twenty second essential point of the invention resides in the organic electroluminescent device according to the twenty first essential poing, wherein the device has two or more organic electroluminescent elements which differ from each other in the color of luminescence, and at least one of the organic electroluminescent elements is the organic electroluminescent element according to any one of the first to fifteenth and twentieth essential points.

A twenty third essential point of the invention resides in the organic electroluminescent device according to the twenty second essential point, wherein all of the organic electroluminescent elements are the organic electroluminescent element according to any one of the first to fifteenth and twentieth essential points.

A twenty fourth essential point of the invention resides in the organic electroluminescent device according to the twenty second or twenty third essential point, wherein any of the hole injection/transport layers possessed by the two or more organic electroluminescent elements have the same composition.

Advantageous Effects of Invention

According to the invention, it is possible to provide an organic electroluminescent element which can be operated at a low voltage. With this element, it is possible to obtain light sources for low-power-consumption flat-panel displays for office automation (OA) computers, wall-mounting TVs, etc. or for display panels, marker lamps, and light sources of copiers and light sources which take advantage of the feature of a surface light emitter, e.g., the backlights of liquid-crystal displays and instruments, etc., by using the element.

BRIEF DESCRIPTION OF DRAWING

FIG. 1 is an example of a sectional view of an organic electroluminescent element according to an embodiment of the invention.

DESCRIPTION OF EMBODIMENTS

Embodiments of the organic electroluminescent element, composition for organic electroluminescent element, and organic electroluminescent device of the invention are explained below in detail. However, the following explanations are for embodiments (representative embodiments) of the invention, and the invention should not be construed as being limited to the embodiments unless the invention departs from the spirit thereof.

The organic electroluminescent element of the invention at least includes an anode, a hole injection/transport layer A, a luminescent layer, and a cathode in this order.

The composition of the invention for organic electroluminescent elements is a composition which is suitable for forming a layer, preferably a hole injection/transport layer, between the anode and luminescent layer of such an organic electroluminescent element by a wet film formation method.

The hole injection/transport layer A according to the invention is a layer having the property of injecting/transporting holes, and all of the layers which are called a hole injection/transport layer, hole injection layer, and hole transport layer are included in the hole injection/transport layer A. Usually, the one or more layers located between the anode and the luminescent layer are a hole injection/transport layer A. The hole injection/transport layer A according to the invention is composed of two or more layers.

It is preferred, from the standpoint of facilitating low-voltage operation, that the number of layers included in the hole injection/transport layer A should be large. The number thereof is preferably 3 or larger. Meanwhile, from the standpoint of process simplicity, it is preferred that the number thereof should be small, and the number thereof is preferably 5 or less.

Each of the layers in the hole injection/transport layer A according to the invention is obtained by forming a layer by a wet film formation method using a composition which contains a hole-injecting/transporting compound. The wet film formation method will be described later. It is preferred that the hole-injecting/transporting compounds to be used for forming the hole injection/transport layer A should be of different kinds because different properties, such as hole-accepting properties, hole-transporting properties, and hole-injecting properties, can be allotted to the respective compounds. From this standpoint, (a) three or more hole-injecting/transporting compounds, in total, are contained in the compositions to be used for forming the layers included in the hole injection/transport layer A according to the invention.

The reasons therefor are presumed to be as follows.

Usually, the spread of electron clouds of compounds varies depending on the kinds of compounds. In the case where there are three or more hole-injecting/transporting compounds, holes can be moved successively from a compound in which the spread of electron clouds is narrow to a compound in which the spread of electron clouds is wide (electrons can be moved successively from a compound in which the spread of electron clouds is wide to a compound in which the spread of electron clouds is narrow). Consequently, the holes are efficiently transported by means of the compound in which the spread of electron clouds is wide, without remaining in the compound in which the spread of electron clouds is narrow. As a result, a sufficient voltage-lowering effect is obtained. Meanwhile, in the case where there are only two hole-injecting/transporting compounds, these two compounds considerably differ in the spread of electron clouds and, hence, sufficient movement of holes from the compound in which the spread of electron clouds is narrow to the compound in which the spread of electron clouds is wide does not occur and the holes are apt to remain in the compound in which the spread of electron clouds is narrow. As a result, a reduction in operating voltage is not attained.

It is preferred that the hole-injecting/transporting compounds contained in the compositions to be used for forming the layers included in the hole injection/transport layer A according to the invention should be polymer compounds.

The reasons therefor are presumed to be as follows.

When the hole-injecting/transporting compounds according to the invention are polymer compounds, holes that have moved to a compound in which the spread of electron clouds is wide are apt to move along the polymer chain because the electron clouds range along the polymer chain. Consequently, the holes are efficiently transported by means of the compound in which the spread of electron clouds is wide, without remaining in the compound in which the spread of electron clouds is narrow.

From the standpoint of more easily obtaining the effect described above, the polymer compounds more preferably are arylamine polymer compounds, and especially preferably, are compounds which have repeating units having a triarylamine structure therein (hereinafter, these arylamine polymer compounds are referred to as "arylamine polymer compounds according to the invention"). It is preferred that since the lone pairs of the nonaromatic tertiary nitrogen atoms in the triarylamine structures affect the charge-receiving and charge-transporting properties of the arylamine polymer compounds, it is preferred that each arylamine polymer compound should have the tertiary nitrogen atoms in the main chain of the repeating units.

Hereinafter, the term "arylamine polymer compound according to the invention" means both "an arylamine polymer compound which has repeating units having a triarylamine structure therein and which is contained in a composition to be used for forming the hole injection/transport layer A of the organic electroluminescent element of the invention" and "an arylamine polymer compound which has repeating units having a triarylamine structure therein and which is contained in the composition of the invention for organic electroluminescent elements".

In the case where there are three or more kinds of arylamine polymer compounds according to the invention, this configuration is presumed to be preferred for the following reason. Holes can be moved successively from a compound in which the spread of electron clouds is narrow to a compound in which the spread of electron clouds is wide (electrons can be moved successively from a compound in which the spread of electron clouds is wide to a compound in which the spread of electron clouds is narrow). Consequently, the holes are efficiently transported by means of the compound in which the spread of electron clouds is wide (the value of N is large), without remaining in the compound in which the spread of electron clouds is narrow (the value of N is small). As a result, a sufficient voltage-lowering effect is obtained. Incidentally, N will be described later.

In the invention, (b) the compositions to be used for forming the at least two layers included in the hole injection/transport layer A each contain, as a hole-injecting/transporting compound, at least one kind of arylamine polymer compound according to the invention, these arylamine polymer compounds being different from each other in kind.

In the invention, the expression "being different" in kind or "being different from each other" in kind used for arylamine polymer compounds means that the compounds differ in the structure of repeating units and/or end groups. In other words, two or more arylamine polymer compounds which differ only in copolymerization ratio are not regarded as "being different" or "being different from each other" in kind, because these compounds are equal in the spread of electron clouds which will be described later. Arylamine polymer compounds according to the invention may be of different kinds due to a difference in the structure of repeating units, or may be of different kinds due to a difference in the structure of molecular-end groups, or may be of different kinds due to both a difference in repeating units and a difference in molecular-end groups. However, it is more preferred that the compositions should contain arylamine polymer compounds which are of "different kinds" due to a difference in the structure of repeating units, since this difference more affects the spread of electron clouds. Incidentally, the expression "being different in the structure" of repeating units or molecular-end groups is not limited to that for compounds which differ in framework structure, and compounds that have the same framework structure but differ in as to whether substituents are present or in the number of substituents, kind of substituents, or positions of the substituents are regarded as of different kinds.

Next, an explanation is given on how to count the "minimum number of atoms between nitrogen atoms, N" of an arylamine polymer compound according to the invention. N is the number of atoms present on the path which is the smallest in the number of atoms present thereon, of the paths which each connect the nonaromatic tertiary nitrogen atoms contained in any two triarylamine structures present in the arylamine polymer compound.

A simplified explanation is as follows. When, for example, the arylamine polymer compound has three nonaromatic tertiary nitrogen atoms (N1 to N3) and when there are three atoms on the shortest path which connects N1 and N2 and there are ten atoms on the shortest path which connects N2 and N3, then N is 3.

More detailed explanations are given below using structure examples.

Example 1

In the case where an arylamine polymer compound has a p-phenylenediamine structure represented by the following left-hand side formula in each of repeating units thereof, the benzene ring in this structure has been substituted with tertiary nitrogen atoms at the 1- and 4-positions. In this case, the carbon atoms located at the 1- to 4-positions are the atoms present on the shortest path, and the minimum number of atoms between nitrogen atoms is 4.

Example 2

In the case where an arylamine polymer compound has a m-phenylenediamine structure represented by the following central formula in each of repeating units thereof, the carbon atoms located at the 1- to 3-positions are the atoms present on the shortest path. The minimum number of atoms between nitrogen atoms is hence 3.

Example 3

In the case where an arylamine polymer compound has a p-phenylenediamine structure and a benzidine structure (two kinds of arylamine structures) which are represented by the following right-hand side formula in each of repeating units thereof, the number of atoms present on the shortest path in the p-phenylene diamine structure is 4 and the number of atoms present on the shortest path in the benzidine structure is 8. Consequently, the minimum number of atoms between nitrogen atoms is 4.

[Chem. 1]

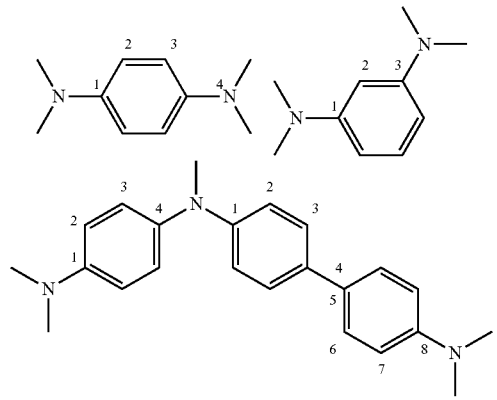

When the layer located most on the cathode side and the layer located most on the anode side, among the two or more layers each formed by a wet film formation method using a composition containing the arylamine polymer compound, are expressed by Lc and La, respectively, and when the maximum value of N for all arylamine polymer compounds contained in the composition to be used for forming the layer Lc is expressed by $Nc_{max}$ and the minimum value of N for all arylamine polymer compounds contained in the composition to be used for forming the layer La is expressed by $Na_{min}$, then (c) $Nc_{max} \geq Na_{min}$ holds. It is preferred that $Nc_{max}$ and $Na_{min}$ should satisfy $Nc_{max} > Na_{min}$.

It is also preferred that when, of the two or more layers each formed by a wet film formation method using a composition containing the arylamine polymer compound, the layer located more on the cathode side is expressed by Lc' and the layer located more on the anode side is expressed by La' and when the minimum value of N for all arylamine polymer compounds contained in the composition to be used for forming the layer Lc' is expressed by $Nc'_{min}$ and the maximum value of N for all arylamine polymer compounds contained in the composition to be used for forming the layer La' is expressed by $Na'_{max}$, then $Nc'_{min} \geq Na'_{max}$ should hold. It is more preferred that $Nc'_{min} > Na'_{max}$ should hold.

The minimum value of N for all arylamine polymer compounds contained in the composition to be used for forming the layer La, $Na_{min}$, is preferably 2 or larger, more preferably 4 or larger. Meanwhile, the value of $Na_{min}$ is preferably 10 or less, more preferably 8 or less. It is especially preferred that $Na_{min}$ should be within the range from the preferred lower limit to the preferred upper limit. By thus configuring the layer La, electrons are rendered more apt to be abstracted from the layer La by the anode or by the material which is in contact with the anode-side surface of the layer La.

Furthermore, the maximum value of N for all arylamine polymer compounds contained in the composition to be used for forming the layer Lc, $Nc_{max}$, is preferably 9 or larger, more preferably 13 or larger. Meanwhile, the value of $Nc_{max}$ is preferably 33 or less. It is especially preferred that $Nc_{max}$ should be within the range from the preferred lower limit to the preferred upper limit. By thus configuring the layer Lc, the components of the layer Lc are rendered less apt to inhibit the luminescence of the luminescent layer.

It is preferred that the difference between the value of N for the arylamine polymer compounds contained in the composition to be used for forming the layer Lc' and the value of N for the arylamine polymer compounds contained in the composition to be used for forming the layer La' should be small from the standpoint of transfer of electrons. Specifically, the difference between $Nc'_{max}$ and $Na'_{min}$ is preferably 30 or less, more preferably 26 or less. Meanwhile, the difference therebetween is preferably 1 or larger, more preferably 4 or larger. It is especially preferred that the difference therebetween should be within that range with respect to two layers which adjoin each other.

The reasons why an organic electroluminescent element having a low operating voltage is obtained when N is in the state described above are explained in detail.

In an arylamine polymer compound, the spread of electron clouds between the lone pairs possessed by the nonaromatic tertiary nitrogen atoms in the triarylamine structures of the compound can be controlled by means of the value of N. In the case where N is small, the distance between the lone pairs possessed by the nitrogen atoms is short and the electron cloud present between lone pairs is formed in a narrow range. Consequently, there are a large number of electrons which are abstracted, and holes are apt to be efficiently injected from the anode. It is therefore preferred that the composition to be used for forming the layer La should contain an arylamine polymer compound in which the value of N is small. In contrast, in the case where N is large, the distance between the lone pairs possessed by the nitrogen atoms is long and the electron cloud present between lone pairs is formed over a wide range. Holes are hence distributed in a wide range and are apt to move. Consequently, holes are apt to be efficiently moved toward the cathode side. In addition, when N is large, the interaction between the lone pairs possessed by the nitrogen atoms is weak and this hole-injecting/transporting compound has a widened band gap and is less apt to inhibit the luminescence of the luminescent layer. It is therefore preferred that the composition to be used for forming the layer Lc should contain an arylamine polymer compound in which the value of N is large. Consequently, it is thought that the value of $Nc_{max}$ is desirably equal to or larger than the value of $Na_{min}$, and is more desirably larger than the value of $Na_{min}$. Furthermore, the value of $Nc'_{min}$ is preferably equal to or larger than the value of $Na'_{max}$, and is more preferably larger than the value of $Na'_{max}$. This configuration makes it possible to obtain a hole injection/transport layer which is excellent especially in terms of suitability for hole injection from the anode side and for transport of the holes and which is less apt to inhibit the luminescence of the luminescent layer. It is thought that this organic electroluminescent element is thus made to have a lowered operating voltage by improving both electrical properties and luminescent properties.

It is preferred that the compositions to be used for forming the hole injection/transport layer A according to the invention (hereinafter often referred to as "compositions for forming the hole injection/transport layer A according to the invention") should contain three or more kinds of arylamine polymer compounds according to the invention in total. In the case where the compositions for forming the hole injection/transport layer A according to the invention contain three or more kinds of arylamine polymer compounds according to the invention in total, it is preferred, from the standpoint of suitability for hole injection, that the minimum value of N for all the arylamine polymer compounds contained in the compositions for forming the hole injection/transport layer A according to the invention should be $Na_{min}$, and it is preferred, from the standpoints of attaining excellent hole-transporting properties and being less apt to inhibit the luminescence of the luminescent layer, that the maximum value of N for all the arylamine polymer compounds contained in the compositions for forming the hole injection/transport layer A according to the invention should be $Nc_{max}$. Here, there may be one or more arylamine polymer compounds in which the maximum value of N is $Nc_{max}$, and there may be one or more arylamine polymer compounds in which the minimum value of N is $Na_{min}$.

When the value of N for the arylamine polymer compound(s) other than that arylamine polymer compound among the three or more kinds of arylamine polymer compounds according to the invention in which the value of N is $Nc_{max}$ (i.e., that arylamine polymer compound among the arylamine polymer compounds contained in the composition to be used for layer Lc formation which has the largest value of N) and than that arylamine polymer compound among the three or more kinds of arylamine polymer compounds according to the invention in which the value of N is $Na_{min}$ (i.e., that arylamine polymer compound among the arylamine polymer compounds contained in the composition to be used for layer La formation which has the smallest value of N) is expressed by $N_{other}$, then it is preferred that $N_{other} > Na_{min}$ or $Nc_{max} > N_{other}$ should hold, and it is more preferred that $Nc_{max} > N_{other} > Na_{min}$ should hold.

Namely, when arylamine compounds in which $Nc_{max}$, $N_{other}$, and $Na_{min}$ satisfy the relationship described above are contained in the compositions for forming the hole injection/transport layer A according to the invention, holes can be moved successively from a compound in which the spread of electron clouds is narrow to a compound in which the spread of electron clouds is wide [holes can be successively moved in the order of (compound in which N is $Na_{min}$)→(compound in which N is $N_{other}$)→(compound in which N is $Nc_{max}$)]. Consequently, holes are efficiently transported to the compound in which the spread of electron clouds is wide (N is $N_{other}$) and to the compound in which the spread of electron clouds is wider (N is $Nc_{max}$), without remaining in the compound in which the spread of electron clouds is narrow (N is $Na_{min}$). It is presumed that a sufficient voltage-lowering effect is thus obtained.

It is preferred that the maximum value of N for all arylamine polymer compounds contained in the composition to be used for forming the layer Lc should be not smaller than the maximum value of N for all arylamine polymer compounds contained in the composition to be used for forming the layer which adjoins the anode-side surface of the layer Lc. This is because that layer in the hole injection/transport layer A which is located most on the luminescent-layer side is a layer which has high hole-transporting properties and is less apt to inhibit the luminescence of the luminescent layer, and because the organic electroluminescent element can hence be made to have a lowered operating voltage by improving both the electrical properties and the luminescent properties. It is preferred that the minimum value of N for all arylamine polymer compounds contained in the composition to be used for forming the layer La should be not larger than the minimum value of N for all arylamine polymer compounds contained in the composition to be used for forming the layer which adjoins the cathode-side surface of the layer La. This is because that layer in the hole injection/transport layer A which is located most on the anode side is a layer having high suitability for hole injection and holes can be efficiently injected thereinto from the anode, making it possible to lower the operating voltage of the organic electroluminescent element.

The hole injection/transport layer A according to the invention may have a multilayer structure including a layer formed by using a composition which contains two or more hole-injecting/transporting compounds and a layer formed by using a composition which contains one or more hole-injecting/transporting compounds, or may have a multilayer structure including three layers each formed by using a composition which contains one or more hole-injecting/transporting compounds. Preferred of these is the configuration in which the hole injection/transport layer A includes a layer formed by using a composition that contains two or more hole-injecting/transporting compounds. The reason for this is that when compounds of a plurality of kinds are contained in one layer, charge transfer between compounds is thought to occur not only at the interface between that layer and another layer but also throughout the whole layer.

With respect to the number of the kinds of the arylamine polymer compounds contained in the compositions for forming the hole injection/transport layer A according to the invention, the compositions for forming any adjoining two layers in the hole injection/transport layer A are preferably as follows. From the standpoint of suitability for hole injection from the anode into the hole injection/transport layer A, it is preferred that the composition to be used for forming the anode-side layer should contain one or more kinds of the arylamine compounds and the composition for forming the layer which adjoins the cathode-side surface of that layer should contain two or more kinds of the arylamine compounds. Meanwhile, however, from the standpoint of suitability for hole injection from the anode-side layer into the cathode-side layer, it is preferred that the composition to be used for forming the anode-side layer should contain two or more kinds of the arylamine compounds and the composition for forming the layer which adjoins the cathode-side surface of that layer should contain one or more kinds of the arylamine compounds.

In particular, from the standpoints of both suitability for hole injection from the anode into the hole injection/transport layer A and suitability for hole injection within the hole injection/transport layer A from an anode-side layer to the cathode-side layer, it is preferred that the compositions to be used for forming all layers possessed by the hole injection/transport layer A each should contain an arylamine polymer compound, and it is more preferred that the compositions to be used for forming all layers possessed by the hole injection/transport layer A should respectively contain arylamine polymer compounds which differ in kind from each other.

Next, the amounts of the arylamine polymer compounds according to the invention which are contained in the compositions for forming the hole injection/transport layer A according to the invention are explained.

In the case where the composition for forming the layer Lc contains only one "arylamine polymer compound according to the invention" as a hole-injecting/transporting compound, it is desirable that generally 50% by weight or more, preferably 70% by weight or more, of the hole-injecting/transporting compound(s) contained in the composition for forming the layer Lc should be accounted for by an "arylamine polymer compound in which N is $Nc_{max}$". In the case where the composition for forming the layer Lc contains two "arylamine polymer compounds according to the invention" as hole-injecting/transporting compounds, it is desirable that generally 20% by weight or more, preferably 30% by weight or more, more preferably 45% by weight or more, of the hole-injecting/transporting compounds contained in the composition for forming the layer Lc should be accounted for by an "arylamine polymer compound in which N is $Nc_{max}$". Furthermore, in the case where the composition for forming the layer Lc contains three or more "arylamine polymer compounds according to the invention" as hole-injecting/transporting compounds, it is desirable that generally 10% by weight or more, preferably 20% by weight or more, more preferably 25% by weight or more, of the hole-injecting/transporting compounds should be accounted for by an "arylamine polymer compound in which N is $Nc_{max}$". When the amount of the "arylamine polymer compound in which N is $Nc_{max}$" is not less than the lower limit, the layer Lc according to the invention has excellent hole-transporting properties and is less apt to inhibit the luminescence of the luminescent layer. Incidentally, an upper limit of the amount of the "arylamine polymer compound in which N is $Nc_{max}$" is usually 100% by weight.

It is desirable that in the "arylamine polymer compound in which N is $Nc_{max}$", units in which N is $Nc_{max}$ should be contained in an amount of generally 5 unit % or more, preferably 10 unit % or more, more preferably 20 unit % or more, especially preferably 33 unit % or more. When the content of units in which N is $Nc_{max}$ is not less than the lower limit, the layer Lc has excellent hole-transporting properties and is less apt to inhibit the luminescence of the luminescent layer. An upper limit of the amount of units in which N is $Nc_{max}$ is generally 100 unit %.

It is desirable that generally 1% by weight or more, preferably 5% by weight or more, more preferably 10% by weight or more, of the hole-injecting/transporting compound(s) contained in the composition for forming the layer La should be accounted for by an "arylamine polymer compound in which N is $Na_{min}$". When the amount of the "arylamine polymer compound in which N is $Na_{min}$" is not less than the lower limit, the layer La has excellent hole-injecting properties. An upper limit of the amount of the "arylamine polymer compound in which N is $Na_{min}$" is generally 100% by weight.

It is desirable that in the "arylamine polymer compound in which N is $Na_{min}$", units in which N is $Na_{min}$ should be contained in an amount of generally 5 unit % or more, preferably 10 unit % or more, more preferably 20 unit % or more, especially preferably 33 unit % or more. When the content of units in which N is $Na_{min}$ is not less than the lower limit, the layer La has excellent hole-injecting properties. An upper limit of the amount of units in which N is $Na_{min}$ is generally 100 unit %.

In the case where the compositions for forming the hole injection/transport layer A according to the invention contain three or more "arylamine polymer compounds according to the invention" which differ in N from each other, it is preferred that the arylamine polymer compound(s) other than both the "arylamine polymer compound in which N is $Nc_{max}$" and the "arylamine polymer compound in which N is $Na_{min}$" (i.e., the arylamine polymer compound(s) in which N is $N_{other}$) should be in the state described above. Specifically, preferably 50% by weight or more, more preferably 80% by weight or more, especially preferably 90% by weight or more, of the arylamine polymer compounds according to the invention are accounted for by one or more arylamine polymer compounds in which "N is $Nc_{max}$ or less". Furthermore, preferably 50% by weight or more, more preferably 80% by weight or more, especially preferably 90% by weight or more, of the arylamine polymer compounds according to the invention are accounted for by one or more arylamine polymer compounds in which "N is $Na_{min}$ or larger". Incidentally, an upper limit of the amount of such compounds in either case is generally 100% by weight. Namely, it is preferred that, of the arylamine polymer compounds according to the invention, all of the arylamine polymer compounds ($N_{other}$) other than both the "arylamine polymer compound in which N is $Nc_{max}$" and the "arylamine polymer compound in which N is $Na_{min}$" should satisfy $N_{other}>Na_{min}$ or $Nc_{max}>N_{other}$. It is more preferred that all of such other arylamine polymer compounds should satisfy $Nc_{max}>N_{other}>Na_{min}$.

It is preferred that the arylamine polymer compounds according to the invention should have repeating units that have therein an arylamine structure to which at least one aromatic ring group has been bonded. It is more preferred that the arylamine polymer compounds should have repeating units in which the main chain thereof has an arylamine structure to which at least one aromatic ring group has been bonded. From the standpoint of charge-transporting properties, it is preferred that the arylamine polymer compounds according to the invention should have repeating units that have therein an arylamine structure to which three aromatic ring groups have been bonded, and it is more preferred that the compounds should have repeating units in which the main chain thereof has an arylamine structure to which three aromatic ring groups have been bonded.

It is preferred that the aromatic ring group (hereinafter, this aromatic ring group is sometimes referred to as "aromatic ring group according to the invention") should be an aromatic hydrocarbon ring group having 4-60 carbon atoms or an aromatic heterocyclic group which each may have substituents.

Examples of the aromatic hydrocarbon ring group include the following aromatic groups each having a free valence of 1 or 2: 5- or 6-membered monocycles or fused rings which each are composed of two to five such monocycles fused together and rings each made up of a plurality of such rings directly bonded together, such as a benzene ring, naphthalene ring, phenanthrene ring, anthracene ring, triphenylene ring, chrysene ring, naphthacene ring, perylene ring, coronene ring, acenaphthene ring, fluoranthene ring, and fluorene ring. The term free valence herein means a valence which is capable of combining with another free valence, as described in *Yūki-kagaku/Sei-kagaku Meimei-hō (Jō)* (revised version, second edition, Nankodo Co., Ltd., 1992). For example, "a benzene ring having a free valence of 1" means a phenyl group, and "a benzene ring having a free valence of 2" means a phenylene group.

Examples of the aromatic heterocyclic group include the following heterocyclic groups each having a free valence of 1 or 2: 5- or 6-membered heteromonocycles or fused rings which each are composed of two to four such heteromonocycles fused together and rings each made up of a plurality of such rings directly bonded together, such as a furan ring, benzofuran ring, thiophene ring, benzothiophene ring, pyrrole ring, pyrazole ring, imidazole ring, oxadiazole ring, indole ring, carbazole ring, pyrroloimidazole ring, pyrrolopyrazole ring, pyrrolopyrrole ring, thienopyrrole ring, thienothiophene ring, furopyrrole ring, furofuran ring, thienofuran ring, benzisooxazole ring, benzisothiazole ring, benzimidazole ring, pyridine ring, pyrazine ring, pyridazine ring, pyrimidine ring, triazine ring, quinoline ring, isoquinoline ring, cinnoline ring, quinoxaline ring, phenanthridine ring, benzimidazole ring, perimidine ring, quinazoline ring, quinazolinone ring, azulene ring, and triazine ring.

In the case where the aromatic ring group is a fused ring having a free valence of 1 or 2, the number of the monocycles fused together is preferably small from the standpoint of obtaining high stability of the ring. The number thereof is preferably 8 or less, more preferably 5 or less. Meanwhile, the lower limit thereof is 2. Specifically, from the standpoints of solubility and heat resistance, preferred examples of the aromatic ring group include the following groups each having a free valence of 1 or 2: monocycles such as a benzene ring, thiophene ring, and pyridine ring; fused rings such as a naphthalene ring, anthracene ring, phenanthrene ring, triphenylene ring, and pyrene ring; and aromatic rings each made up of 2-8 aromatic rings linked to each other, such as a fluorene ring, biphenyl, and terphenyl. More preferred of these are a benzene ring, fluorene ring, biphenyl, and terphenyl each having a free valence of 1 or 2.

Examples of the substituents which may be possessed by the aromatic ring group include saturated hydrocarbon groups having 1-20 carbon atoms, aromatic hydrocarbon ring groups having 6-25 carbon atoms, aromatic heterocyclic groups having 3-20 carbon atoms, diarylamino groups having 12-60 carbon atoms, alkyloxy groups having 1-20 carbon atoms, (hetero)aryloxy groups having 3-20 carbon atoms, alkylthio groups having 1-20 carbon atoms, (hetero)arylthio groups having 3-20 carbon atoms, and cyano. Preferred of these, from the standpoints of solubility and heat resistance, are saturated hydrocarbon groups having 1-20 carbon atoms and aromatic hydrocarbon ring groups having 6-25 carbon atoms.

Specifically, examples of the saturated hydrocarbon groups having 1-20 carbon atoms include methyl, ethyl, propyl, isopropyl, butyl, isobutyl, sec-butyl, tert-butyl, hexyl, octyl, cyclohexyl, decyl, and octadecyl. From the standpoints of the availability and inexpensiveness of starting materials, etc., methyl, ethyl, and isopropyl are preferred of those, and methyl and ethyl are more preferred.

Examples of the monovalent aromatic hydrocarbon ring groups having 6-25 carbon atoms include: phenyl; naphthyl groups such as 1-naphthyl and 2-naphthyl; phenanthyl groups such as 9-phenanthyl and 3-phenanthyl; anthryl groups such as 1-anthryl, 2-anthryl, and 9-anthryl; naphthacenyl groups such as 1-naphthacenyl and 2-naphthacenyl; chrysenyl groups such as 1-chrysenyl, 2-chrysenyl, 3-chrysenyl, 4-chrysenyl, 5-chrysenyl, and 6-chrysenyl; pyrenyl groups such as 1-pyrenyl; triphenylenyl groups such as 1-triphenylenyl; coronenyl groups such as 1-coronenyl; biphenyl groups such as 4-biphenyl and 3-biphenyl; groups having a fluoranthene ring; groups having a fluorene ring; groups having an acenaphthene ring; and substituents having a benzpyrene ring or the like. Preferred of these, from the standpoint of the stability of the compounds, are phenyl, 2-naphthyl, and 3-biphenyl. Phenyl is especially preferred from the standpoint of ease of purification.

Examples of the aromatic heterocyclic groups having 3-20 carbon atoms include: thienyl groups such as 2-thienyl; furyl groups such as 2-furyl; imidazolyl groups such as 2-imidazolyl; carbazolyl groups such as 9-carbazolyl; pyridyl groups such as 2-pyridyl; and triazinyl groups such as 1,3,5-triazin-2-yl. Preferred of these from the standpoint of stability are carbazolyl groups, in particular, 9-carbazolyl.

Examples of the diarylamino groups having 12-60 carbon atoms include diphenylamino, N-1-naphthyl-N-phenylamino, N-2-naphthyl-N-phenylamino, N-9-phenanthryl-N-phenylamino, N-(biphenyl-4-yl)-N-phenylamino, and bis(biphenyl-4-yl)amino. Preferred of these are diphenylamino, N-1-naphthyl-N-phenylamino, and N-2-naphthyl-N-phenylamino. From the standpoint of stability, diphenylamino is especially preferred.

Examples of the alkyloxy groups having 1-20 carbon atoms include methoxy, ethoxy, isopropyloxy, cyclohexyloxy, and octadecyloxy.

Examples of the (hetero)aryloxy groups having 3-20 carbon atoms include aryloxy groups such as phenoxy, 1-naphthyloxy, and 9-anthranyloxy and substituents having a heteroaryloxy group such as 2-thienyloxy.

Examples of the alkylthio groups having 1-20 carbon atoms include methylthio, ethylthio, isopropylthio, and cyclohexylthio.

Examples of the (hetero)arylthio groups having 3-20 carbon atoms include arylthio groups such as phenylthio, 1-naphthylthio, and 9-anthranylthio and heteroarylthio groups such as 2-thienylthio.

In the case where an arylamine polymer compound according to the invention has repeating units that have therein an arylamine structure to which a group that is not an aromatic ring group has been bonded, preferred examples of the group that is not an aromatic ring group include an aliphatic hydrocarbon group having 1-70 carbon atoms and a hetero-aliphatic hydrocarbon group having 1-70 carbon atoms. The term hetero-aliphatic hydrocarbon group as used in the invention means an aliphatic hydrocarbon group which has a heteroatom. Examples of the heteroatom include nitrogen and oxygen atoms. The aliphatic hydrocarbon group may be either of the chain type or cyclic, and may be saturated or unsaturated.

Examples of the aliphatic hydrocarbon group include methyl, ethyl, propyl, isopropyl, butyl, iso-butyl, sec-butyl, tert-butyl, hexyl, octyl, cyclohexyl, decyl, and octadecyl. Preferred of these, from the standpoints of the availability and inexpensiveness of starting materials, etc., are groups having 1-10 carbon atoms, such as methyl, 1,2-ethyl, 1,3-propyl, 1,4-butyl, 1,5-pentyl, and 1,8-octyl. More preferred are groups having 1-8 carbon atoms. From the standpoints of ease of synthesis, etc., groups having 1-3 carbon atoms, such as methyl, ethyl, and isopropyl, are especially preferred, and the groups having 1 or 2 carbon atoms, such as methyl and ethyl, are most preferred. It is preferred that the aliphatic hydrocarbon group should be a saturated hydrocarbon group, from the standpoint of durability in oxidation/reduction.

The aliphatic unsaturated hydrocarbon group preferably is an alkenylene group, and examples thereof include 1,2-vinylene, 1,3-propenylene, 1,2-propenylene, and 1,4-butenylene. Of these, vinylene is especially preferred because this group improves the molecular flatness to enlarge the conjugate plane and delocalize the charges and the stability of the compound is apt to be thus heightened. From the standpoints of flatness and the spread of charges, the number of the carbon atoms possessed by the unsaturated aliphatic hydrocarbon group is preferably 2 or larger, and is preferably 10 or less, more preferably 6 or less.

From the standpoint of enhancing solubility, it is preferred that the number of carbon atoms possessed by the aliphatic hydrocarbon group and by the hetero-aliphatic hydrocarbon group should be large. Meanwhile, it is preferred that the number thereof should be small, from the standpoints of the stability of the compound and film density. Specifically, the number of the carbon atoms is generally 1 or larger, preferably 4 or larger, more preferably 6 or larger, and is generally 70 or less, preferably 60 or less, more preferably 36 or less.

It is preferred that the arylamine polymer compounds according to the invention should have a structure such as a polymer which has repeating units represented by the following formula (1) and which is synthesized by a reaction for forming an N—Ar bond, such as the Buchwald-Hartwing reaction or the Ullmann reaction.

[Chem. 2]

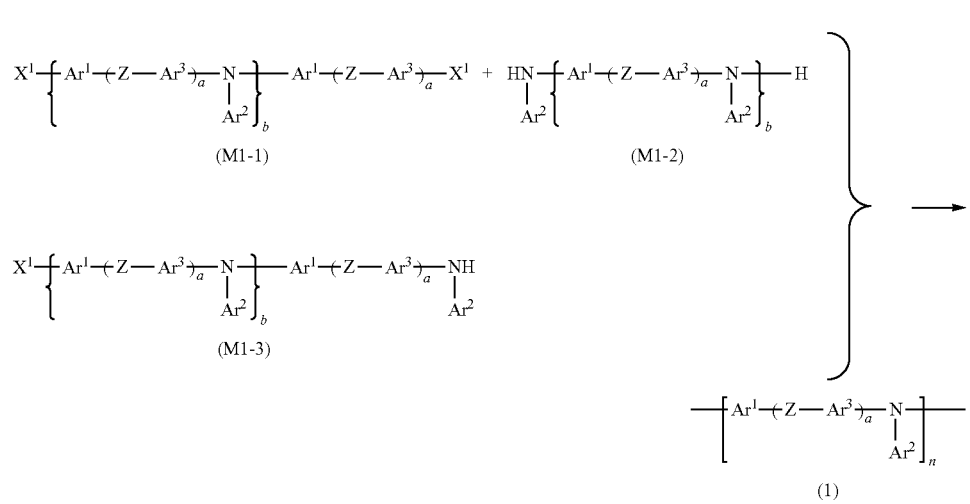

In formula (1), $Ar^1$ to $Ar^3$ each independently represent an aromatic ring group according to the invention, and Z represents a divalent group, and preferably represents a group constituted of 1-24 groups linked to each other and selected from the group consisting of —$CR^1R^2$—, —CO—, —O—, —S—, —$SO_2$—, and —$SiR^3R^4$—. $R^1$ to $R^4$ each independently represent a hydrogen atom, an alkyl group which may have a substituent, or an aromatic ring group according to the invention; $R^1$ and $R^2$ may be bonded to each other to form a ring, and $R^3$ and $R^4$ may be bonded to each other to form a ring. Symbol a represents an integer of 0-8. When a is an integer of 2-8, the $Ar^3$ groups may be different from each other and the Z groups or atoms may be different from each other. Symbol n indicates the number of repetitions of the repeating unit.

In formula (M1-1) to formula (M1-3), $Ar^1$ to $Ar^3$, Z, and a have the same meanings as defined in formula (1). Symbol b represents an integer of 0-8. $X^1$ represents a halogen atom or a sulfonic acid ester group, e.g., trifluoromethanesulfonyloxy ($CF_3SO_2O$—).

With respect to each of formula (M1-1) to (M1-3), one monomer alone or two or more monomers may be used. It is preferred that the number of monomers represented by each formula should be 10 or less.

When there are two or more $Ar^1$'s, $Ar^2$'s, $Ar^3$'s, Z's, a's, or $X^1$'s in formula (1) and formula (M1-1) to formula (M1-3), these may be different.

It is also preferred that the arylamine polymer compounds according to the invention should have a structure such as a polymer which has repeating units represented by the following formula (2) and which is synthesized by a reaction for forming an Ar—Ar bond, such as the Yamamoto reaction, Negishi reaction, Migita-Kosugi-Stile reaction, or Suzuki-Miyaura reaction.

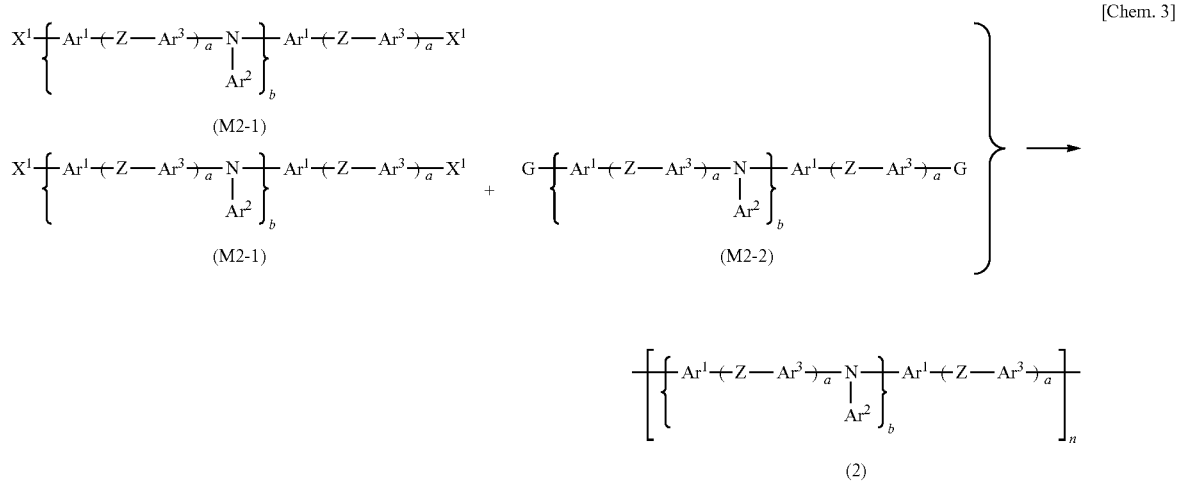

[Chem. 3]

In formula (2), formula (M2-1), and formula (M2-2), $Ar^1$ to $Ar^3$, Z, a, b, $X^1$, and n have the same meanings as defined in formula (1) and formula (M1-1) to formula (M1-3).

In formula (M2-2), G represents: a zinc atom having a substituent, e.g., BrZn—, in the case of the Negishi reaction; a tin atom having substituents, e.g., $(CH_3)_3Sn$—, in the case of the Migita-Kosugi-Stile reaction; or a boron atom having substituents, e.g., $(RO)_2B$— (the R's are hydrogen atoms or alkyl groups which may be bonded to each other to form a ring), in the case of the Suzuki-Miyaura reaction.

When there are two or more $Ar^1$'s, $Ar^2$'s, $Ar^3$'s, Z's, a's, b's, or $X^1$'s in formula (2), formula (M2-1), and formula (M2-2), these may be different.

It is also preferred that the arylamine polymer compounds according to the invention should have a structure such as a polymer which has repeating units represented by formula (3) and which is synthesized by a reaction for forming an O—Ar bond or S—Ar bond.

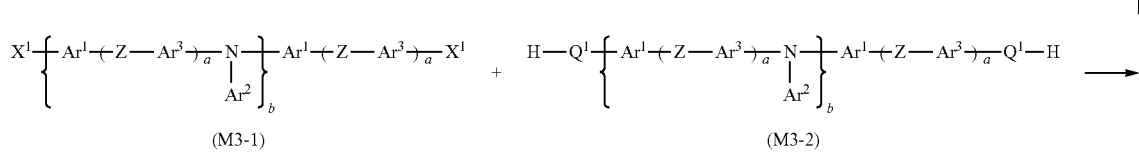

[Chem. 4]

-continued

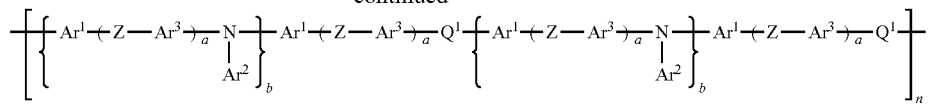

(3)

In formula (3), formula (M3-1), and formula (M3-2), $Ar^1$ to $Ar^3$, Z, a, b, $X^1$, and n have the same meanings as defined in formula (1) and formula (M1-1) to formula (M1-3).

In formula (3) and formula (M3-2), $Q^1$ represents an oxygen atom or a sulfur atom.

When there are two or more $Ar^1$'s, $Ar^2$'s, $Ar^3$'s, Z's, a's, b's, $Q^1$'s, or $X^1$'s in formula (3), formula (M3-1), and formula (M3-2), these may be different.

It is also preferred that the arylamine polymer compounds according to the invention should have a structure such as a polymer which has repeating units represented by the following formula (4) and which is synthesized by a reaction for forming an ester bond and an amide bond.

according to the invention that includes repeating units having therein an arylamine structure to which at least one crosslinkable group has been bonded. Especially preferred is an arylamine polymer compound according to the invention that includes repeating units in which the main chain has an arylamine structure to which at least one crosslinkable group has been bonded. The term crosslinkable group herein means a group which reacts with the same or a different group of another molecule by the action of heat and/or irradiation with actinic energy rays or the like to form a new chemical bond. Usually, in the layers possessed by the hole injection/transport layer A, the crosslinkable groups have reacted with the

[Chem. 5]

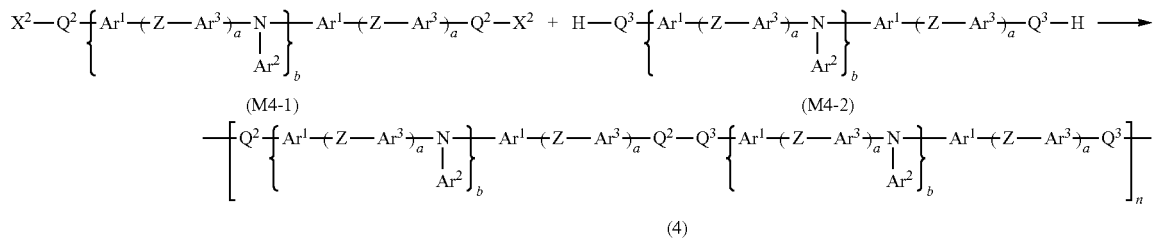

(4)

In formula (4), formula (M4-1), and formula (M4-2), $Ar^1$ to $Ar^3$, Z, a, b, and n have the same meanings as defined in formula (1) and formula (M1-1) to formula (M1-3).

In formula (4), formula (M4-1), and formula (M4-2), $Q^2$ represents a carbonyl group or a sulfonyl group, $Q^3$ represents an oxygen atom, a sulfur atom, or an —$NR^5$— group ($R^5$ represents a hydrogen atom, an alkyl group which may have a substituent, or an aromatic ring group according to the invention), and $X^2$ represents a halogen atom.

When there are two or more $Ar^1$'s, $Ar^2$'s, $Ar^3$'s, Z's, a's, b's, $Q^2$'s, or $Q^3$'s in formula (4), formula (M4-1), and formula (M4-2), these may be different.

Preferred of the polymers shown above as examples of the arylamine polymer compounds according to the invention are the polymers having repeating units represented by formula (1) and formula (2). From the standpoints of hole-transporting properties and durability, the polymer having repeating units represented by formula (1) is more preferred. It is preferred that symbol a in formulae (1) to (4) should be 0 from the standpoint that these repeating units bring about excellent hole-injecting/transporting properties. From the standpoint of attaining a wide band gap and excellent hole-transporting properties, symbol a is preferably 1 or 2, more preferably 1. It is preferred that Z should be —$CR^1R^2$—, because this polymer has excellent durability.

It is preferred that the arylamine polymer compounds according to the invention should have one or more crosslinkable groups, because these compounds impart an excellent charge-transporting ability to the hole injection/transport layer. More preferred is an arylamine polymer compound same or different groups of other molecules upon heating and/or irradiation with actinic energy rays or the like to form new chemical bonds.

Examples of the crosslinkable groups are shown below, but the invention should not be construed as being limited to the following examples. Examples of the crosslinkable groups include the groups shown under [Crosslinkable Groups G2], from the standpoint of ease of insolubilization.

[Crosslinkable Groups G2]

[Chem. 6]

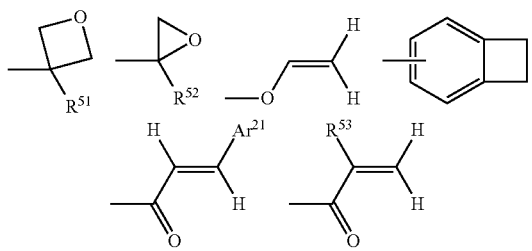

(In the formulae, $R^{51}$ to $R^{53}$ each independently represent a hydrogen atom or an alkyl group. $Ar^{21}$ represents an aromatic ring group which may have a substituent.)

Preferred of these are groups which undergo a crosslinking reaction through cationic polymerization, such as cyclic ether groups, e.g., an epoxy group and an oxetane group, and vinyl ether groups, from the standpoint that these groups have high reactivity and facilitate insolubilization through crosslinking. Especially preferred of these is the oxetane group, from the standpoint that the rate of cationic polymerization is easy to control. From the standpoint of inhibiting the formation of hydroxyl groups, which have the possibility of causing a deterioration of the element, during cationic polymerization, the vinyl ether group is especially preferred. Especially preferred, from the standpoint of imparting high electrochemical stability to the hole injection/transport layer, are arylvinylcarbonyl groups, e.g., cinnamoyl, and groups having reactivity in cyclization/addition reaction, such as a benzocyclobutene ring having a free valence of 1. From the standpoint of enabling the crosslinked structure to have high stability, a benzocyclobutene ring having a free valence of 1 is the most preferred.

Specifically, a benzocyclobutene ring represented by the following formula (II), which has a free valence of 1, is preferred as the crosslinkable group. Although the benzocyclobutene ring of formula (II) is unsubstituted, the benzocyclobutene ring which has one or more substituents is also preferred. These substituents may be bonded to each other to form a ring.

[Chem. 7]

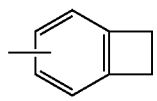

(II)

In the case where an arylamine polymer compound according to the invention includes repeating units having therein an arylamine structure to which an aromatic ring group has been bonded, a crosslinkable group may have been directly bonded to the aromatic ring group or may be directly bonded to a group other than the aromatic ring group, or may be bonded to these groups through any desired divalent group. It is preferred that the divalent group should be a group constituted of 1-30 groups which have been linked to each other in any order and selected from the group consisting of —O—, —C(=O)—, and (optionally substituted)-CH$_2$— groups. Preferred examples of the crosslinkable group bonded through any of these divalent groups include the groups shown under the following <Crosslinkable-Group-Containing Groups G3>. However, the invention should not be construed as being limited to the following examples.

[Crosslinkable-Group-Containing Groups G3]

[Chem. 8]

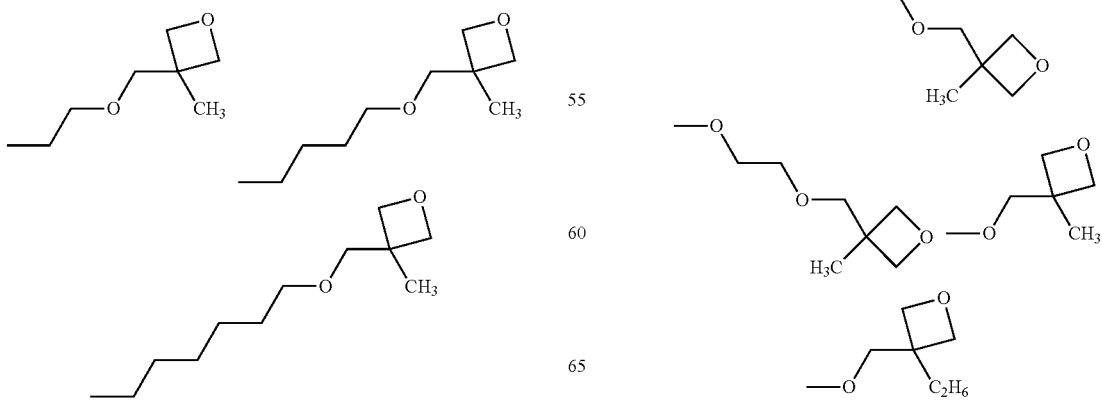

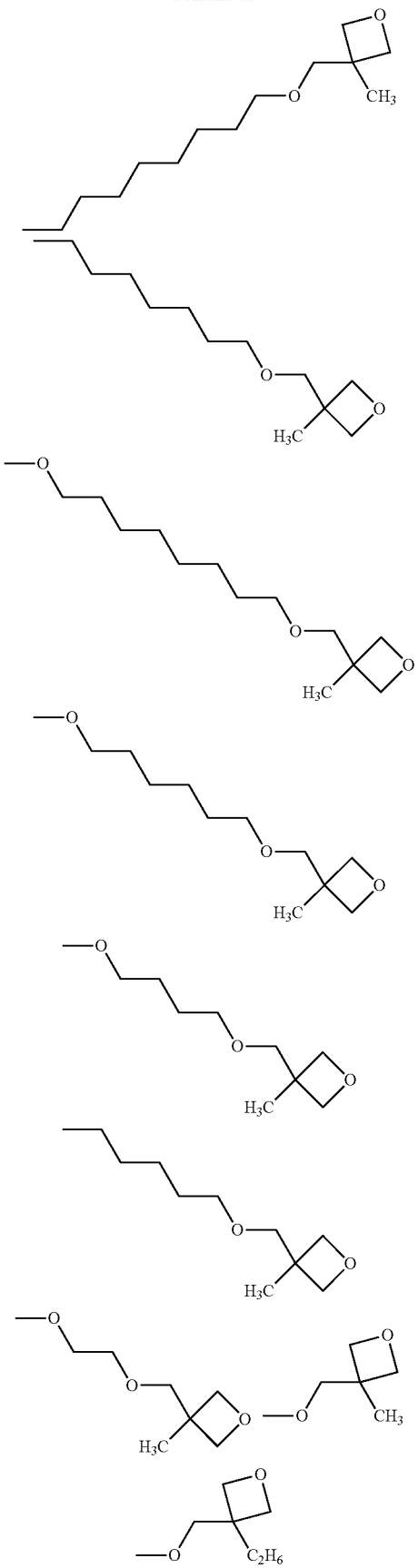

23
-continued
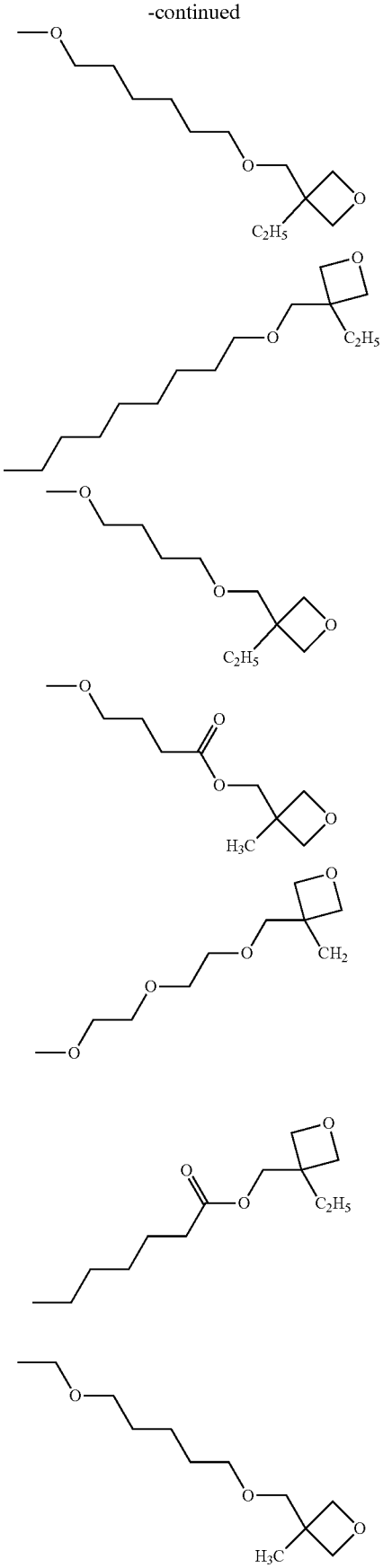
24
-continued
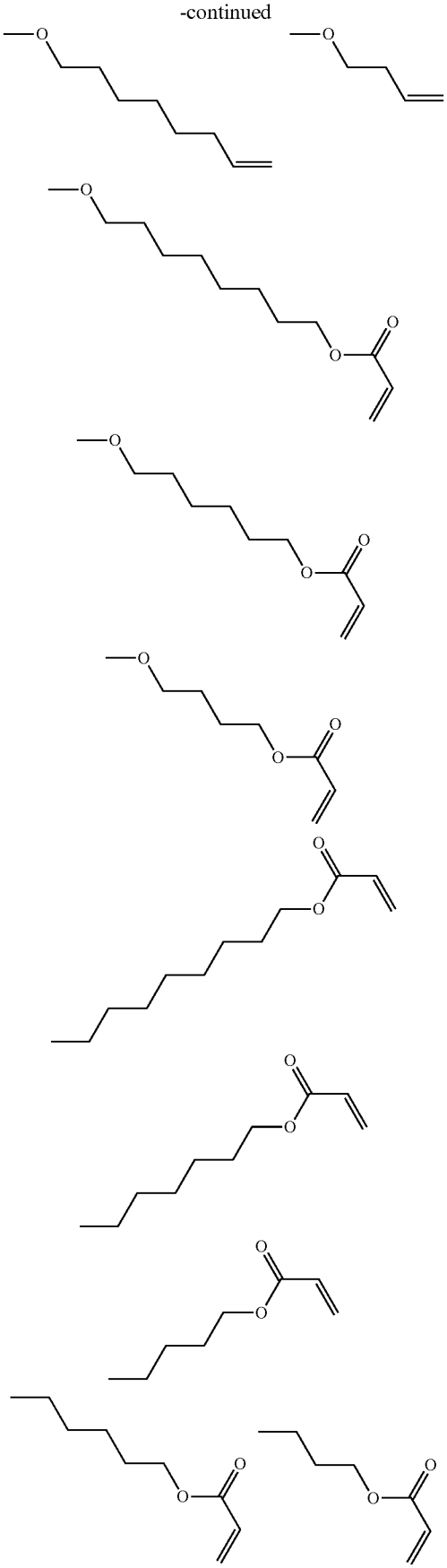

-continued
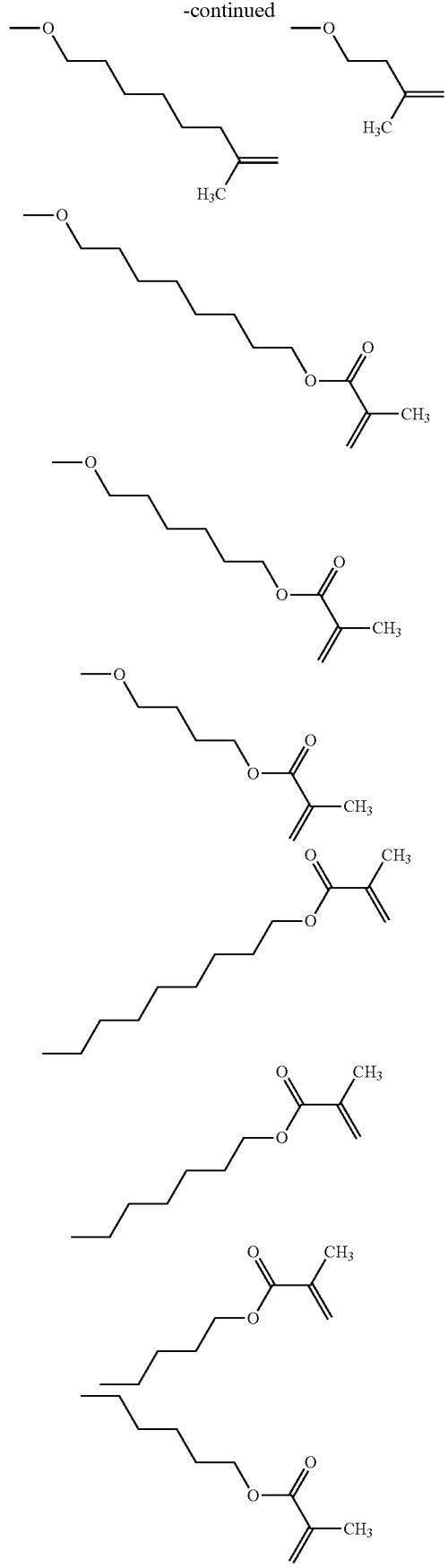
-continued
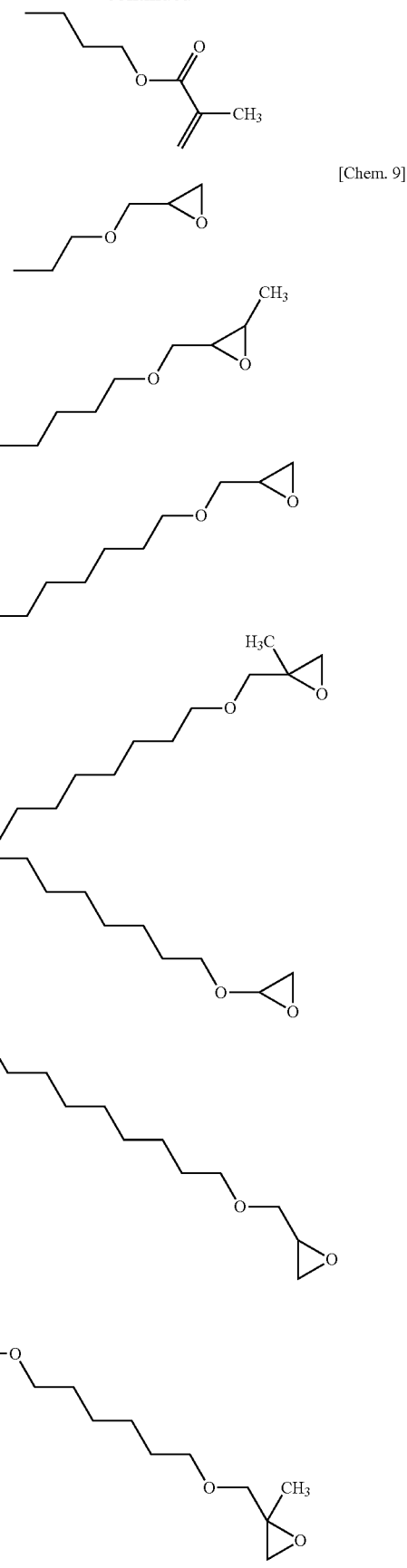
[Chem. 9]

27
-continued
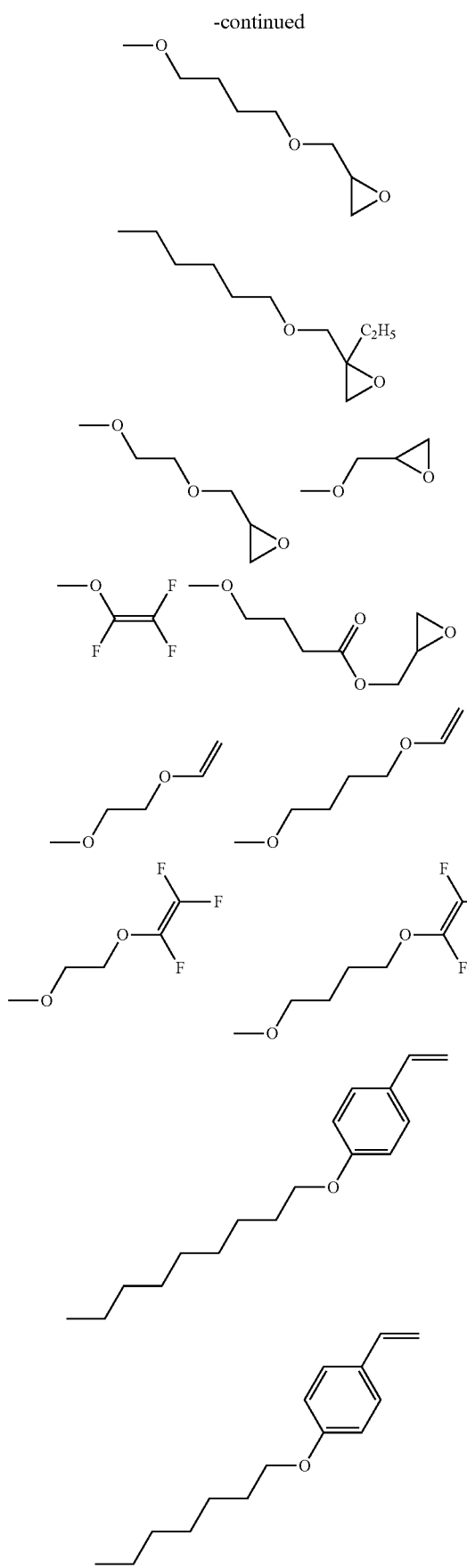
28
-continued
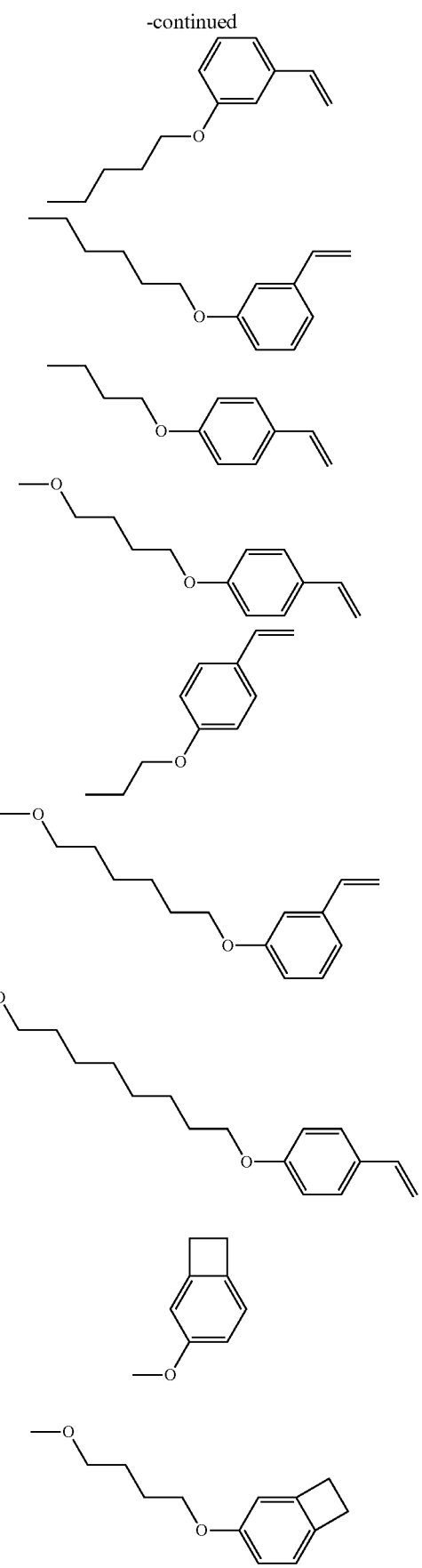

-continued
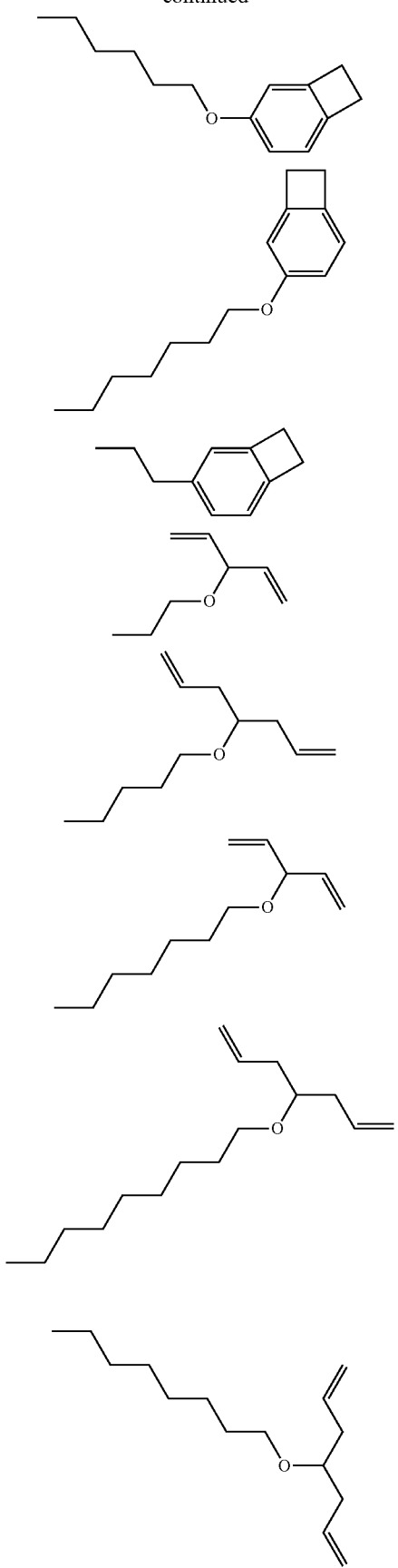
-continued
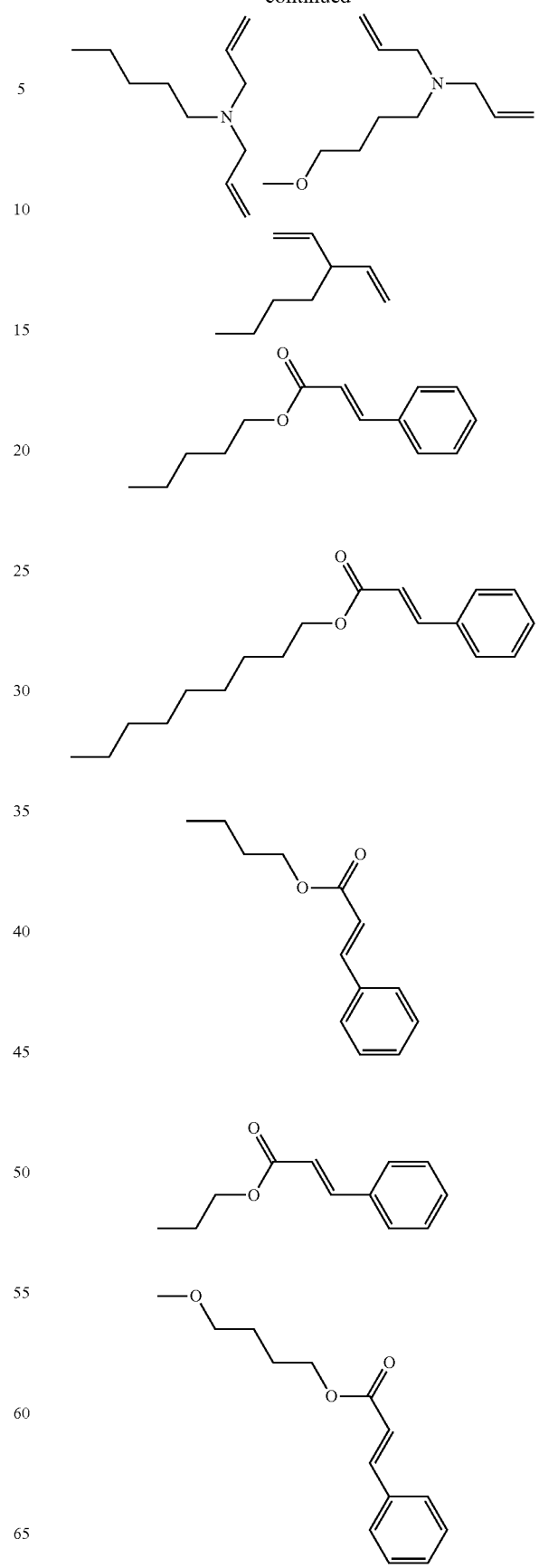

-continued

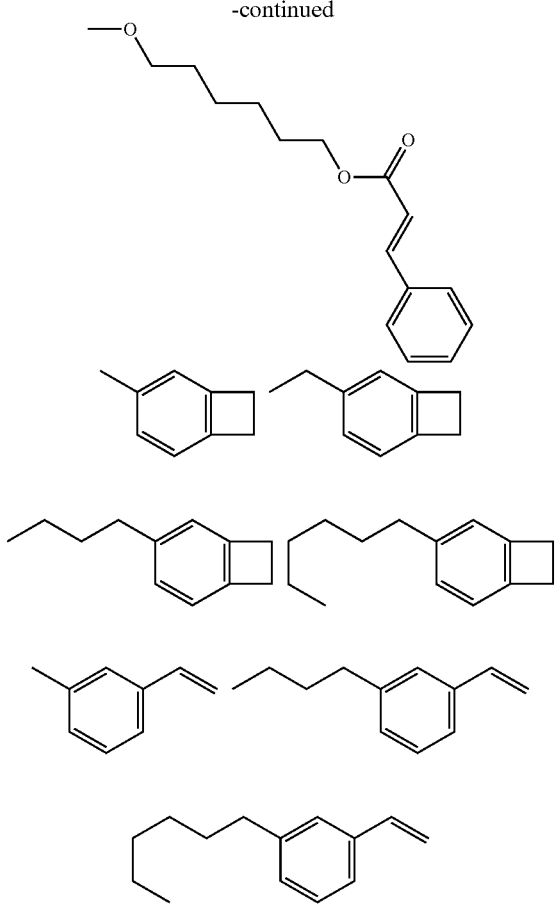

It is preferred that the amount of the crosslinkable groups possessed by the arylamine polymer compounds according to the invention should be large, from the standpoint of sufficiently insolubilizing the hole injection/transport layer through crosslinking to thereby facilitate the formation of another layer thereon by a wet film formation method. Meanwhile, however, it is preferred that the amount thereof should be small, from the standpoints of rendering the hole injection/transport layer less apt to crack and less apt to contain unreacted crosslinkable groups and thereby giving an organic electroluminescent element which is apt to have a prolonged life. Specifically, the number of the crosslinkable groups possessed by each arylamine polymer compound according to the invention is preferably 1 or larger, more preferably 2 or larger, and is preferably 200 or less, more preferably 100 or less. When the number of the crosslinkable groups possessed by each arylamine polymer compound according to the invention is expressed in terms of the number thereof per molecular weight of 1,000, a suitable range thereof is generally 3.0 or less, preferably 2.0 or less, more preferably 1.0 or less, and is generally 0.01 or larger, preferably 0.05 or larger, per molecular weight of 1,000.

Here, an explanation is given on the number of crosslinkable groups per molecular weight of 1,000, using an arylamine polymer compound according to the invention as an example. The number of crosslinkable groups per molecular weight of 1,000 is calculated from both the molar ratio of the feed monomers used for the synthesis of the conjugated polymer from which the end groups have been excluded and the structural formula of that polymer. Specifically, in the case of the following polymer 1, for example, the number of crosslinkable groups is calculated in the following manner.

[Chem. 10]

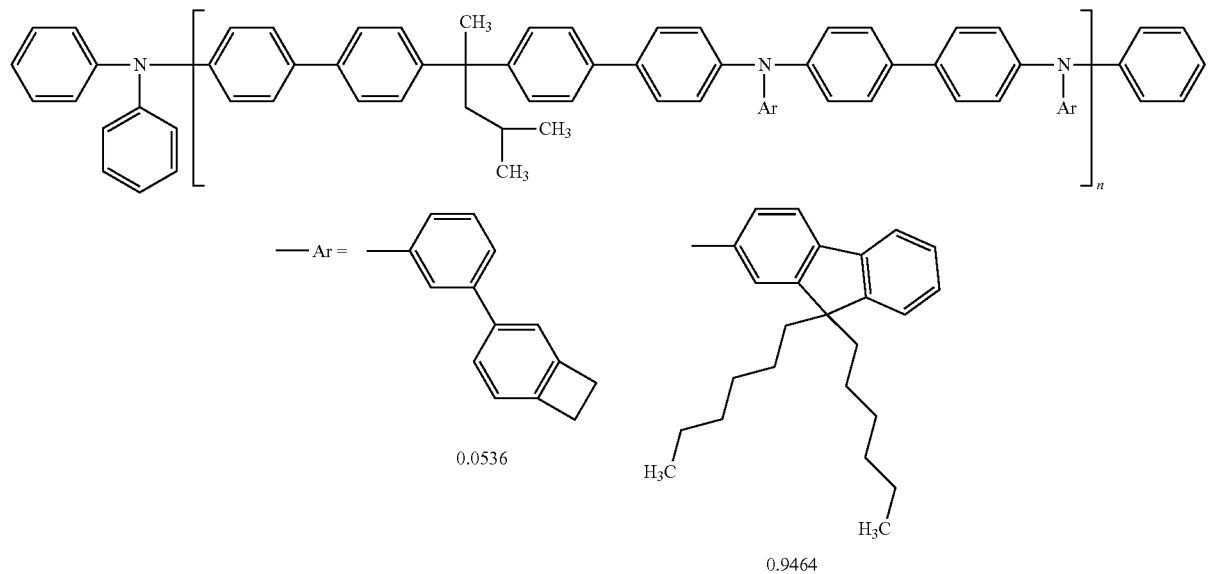

In this polymer 1, the molecular weight of the repeating units, i.e., the portion excluding the end groups, is 1,219.2 on average, and the number of crosslinkable groups therein per repeating unit is 0.1072 on average. The number of groups derived from crosslinkable groups, per molecular weight of 1,000, is calculated therefrom to be 0.088 by simple proportion.

It is preferred that the weight-average molecular weight (Mw) of each arylamine polymer compound according to the invention should be high, from the standpoints that this compound is high in glass transition temperature, melting point, and vaporizing temperature and that the hole injection/transport layer which contains this compound is apt to have excellent heat resistance. Meanwhile, however, it is preferred that the weight-average molecular weight thereof should be low, from the standpoint that this polymer has high solubility and excellent film-forming properties. Consequently, the weight-average molecular weight of each arylamine polymer compound according to the invention specifically is generally 3,000,000 or less, preferably 1,000,000 or less, more preferably 500,000 or less, especially preferably 200,000 or less, and is generally 5,000 or higher, preferably 10,000 or higher, more preferably 20,000 or higher.

The number-average molecular weight (Mn) of each arylamine polymer compound according to the invention is generally 2,500,000 or less, preferably 750,000 or less, more preferably 400,000 or less, and is generally 500 or higher, preferably 1,500 or higher, more preferably 3,000 or higher.

The weight-average molecular weight and number-average molecular weight thereof are determined through a measurement by SEC (size exclusion chromatography). In a measurement by SEC, the higher the molecular weight of components, the shorter the elution time thereof, i.e., the lower the molecular weight of components, the longer the elution time. The elution times of a sample are converted to molecular weights using a calibration curve obtained through calculation from the elution times of polystyrene (standard samples) having known molecular weights. Thus, the weight-average molecular weight and number-average molecular weight thereof can be calculated.

It is preferred that the dispersity ratio (Mw/Mn) of each arylamine polymer compound according to the invention should be small, from the standpoint that this compound is easy to purify and has high solubility and excellent charge-transporting properties. Specifically, the dispersity ratio thereof is preferably 3.5 or less, more preferably 2.5 or less, especially preferably 2.0 or less. Meanwhile, the smaller the dispersity ratio, the better the compound. Consequently, an ideal lower limit thereof is 1.

Preferred examples of the arylamine polymer compounds according to the invention are shown below, but the invention should not be construed as being limited to the following examples.

Examples in which the minimum number of atoms between nitrogen atoms is 4:

[Chem. 11]

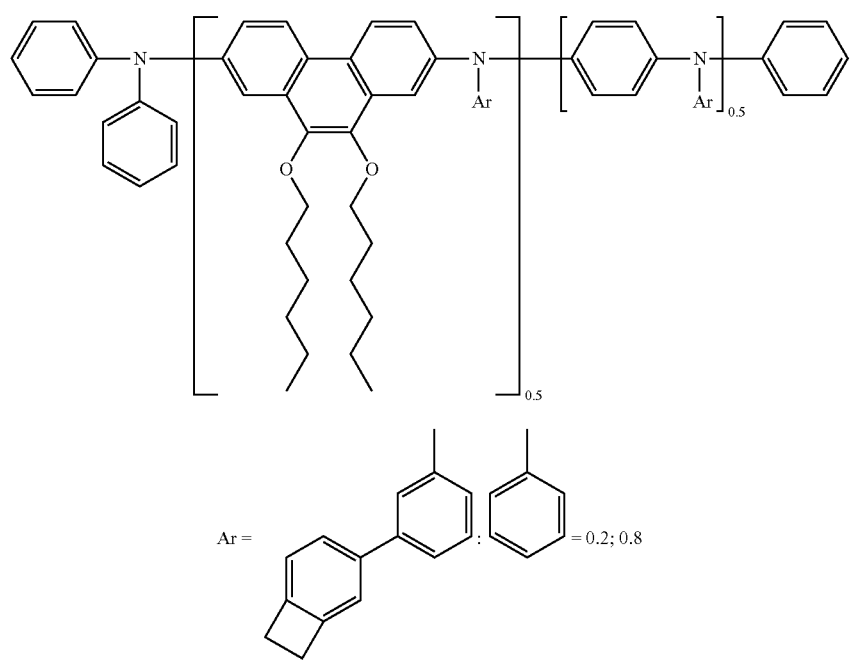

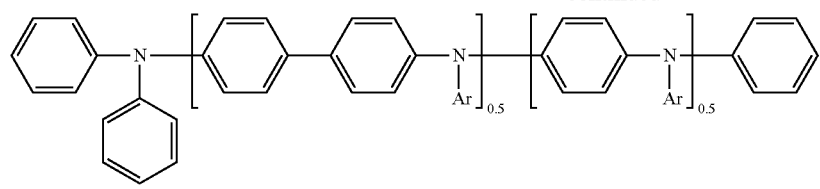
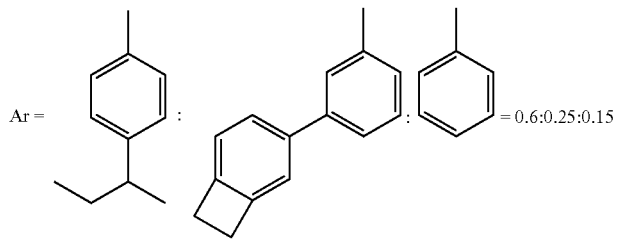
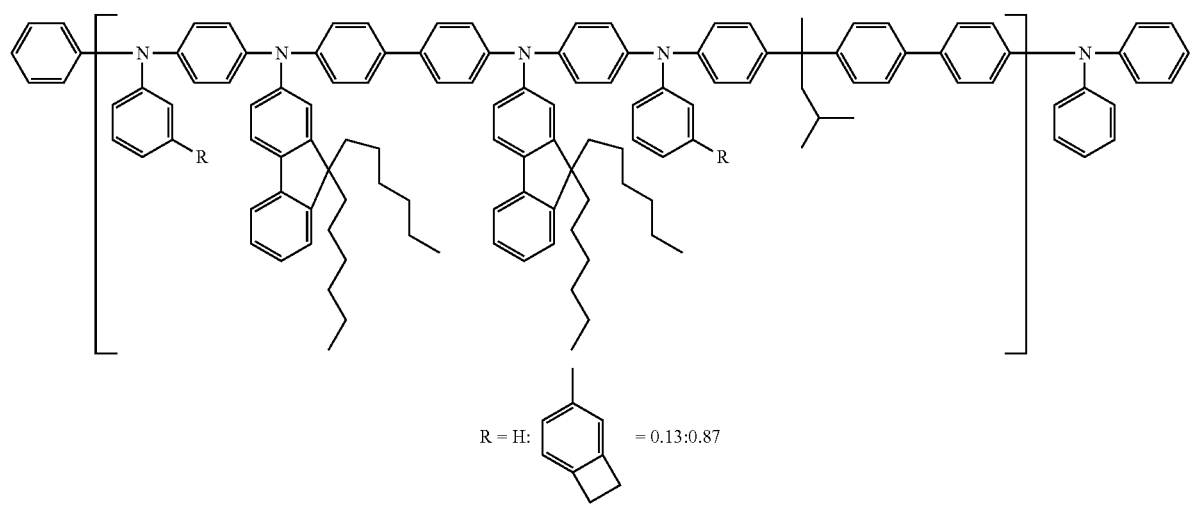
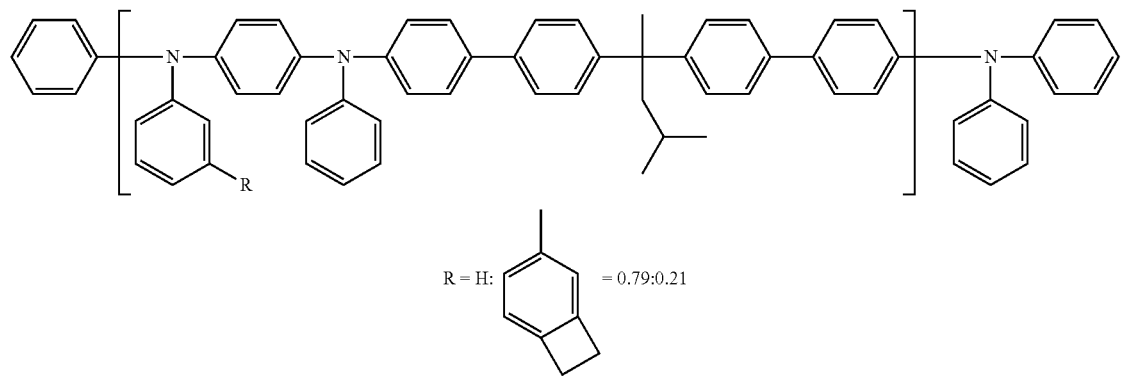

-continued
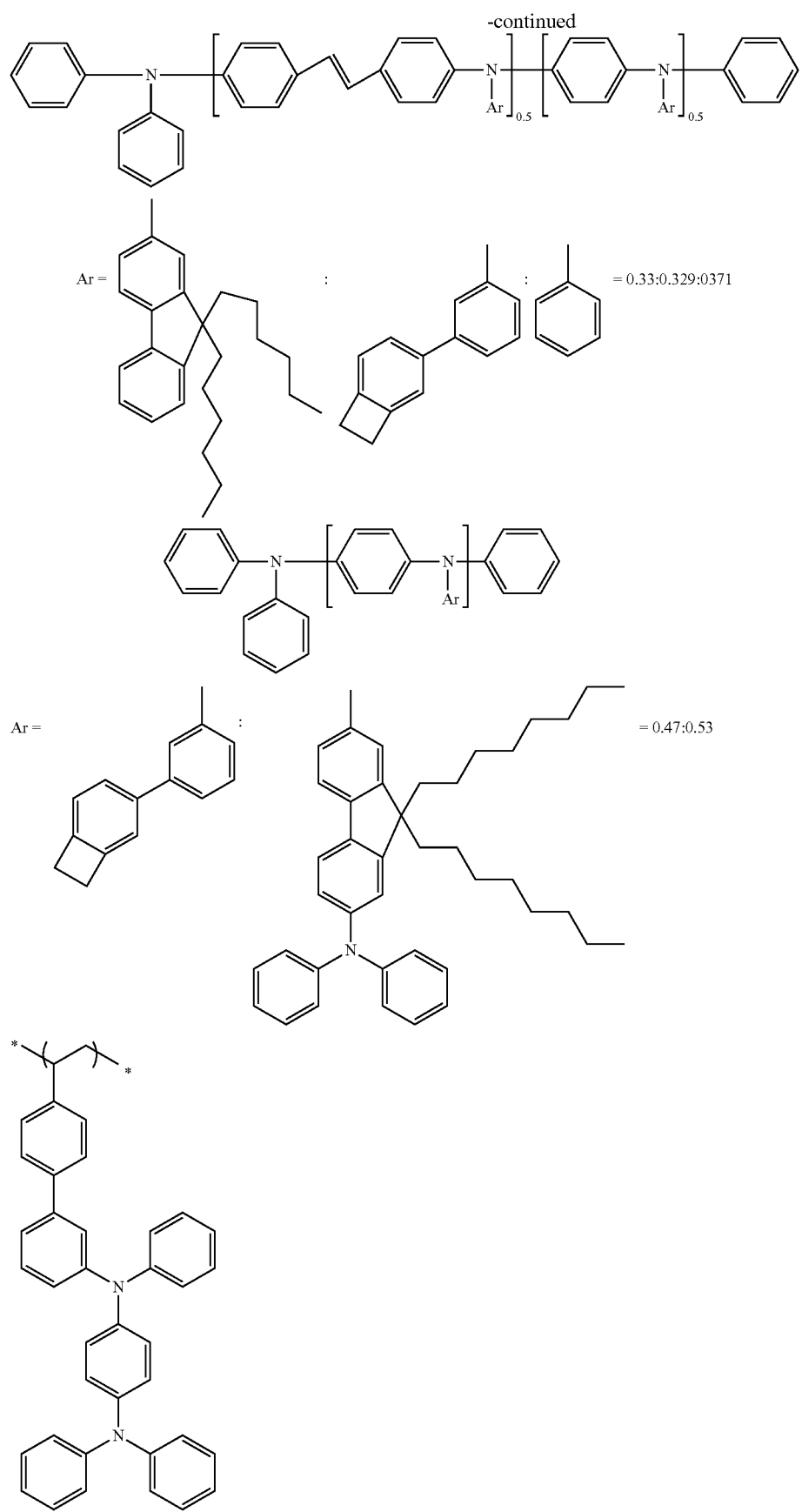

Examples in which the minimum number of atoms between nitrogen atoms is 7:
[Chem. 12]
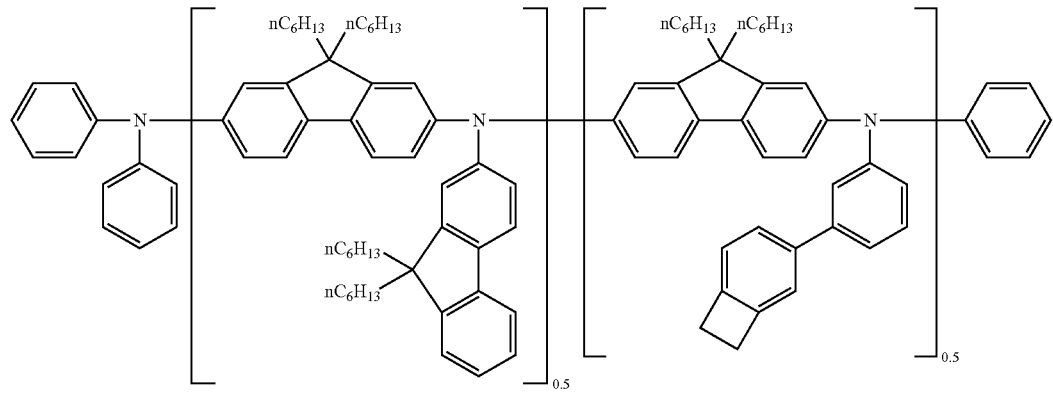
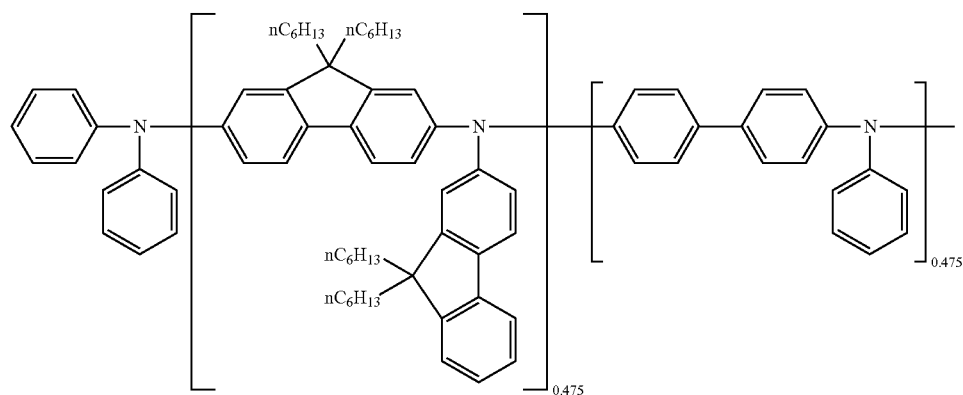
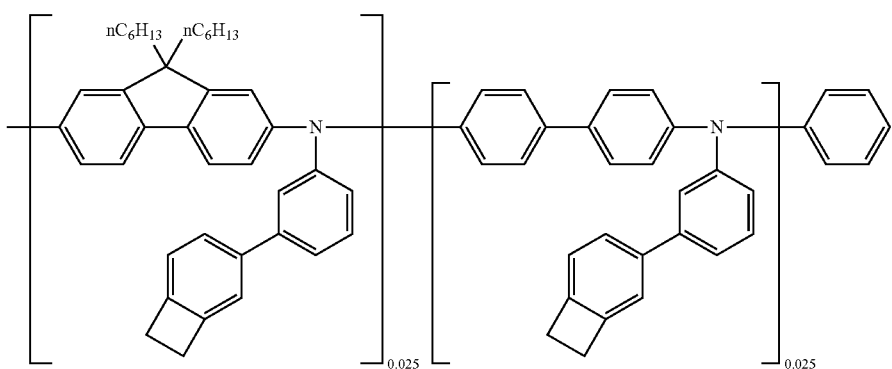
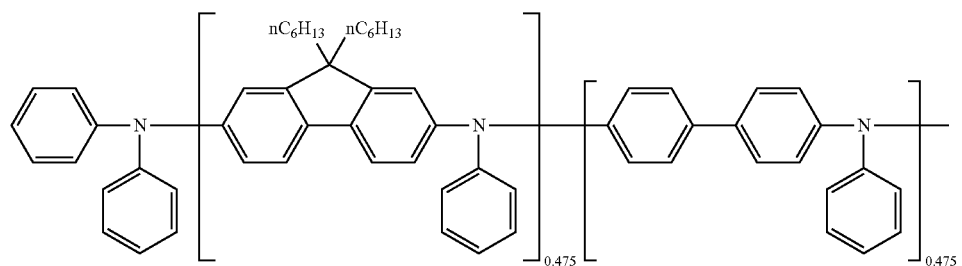

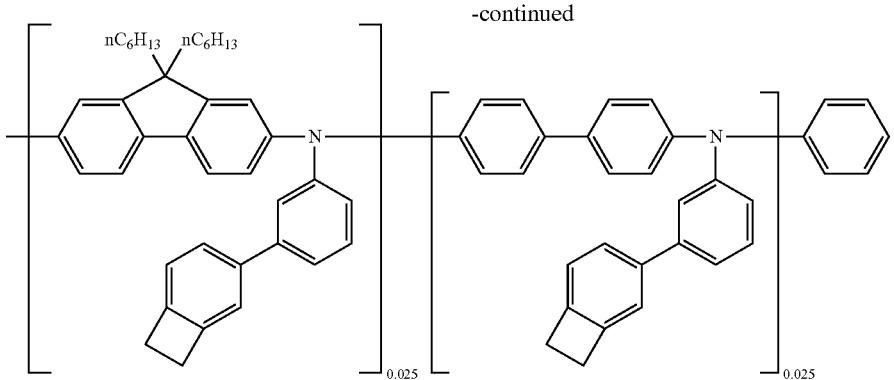
Examples in which the minimum number of atoms between nitrogen atoms is 8:
[Chem. 13]
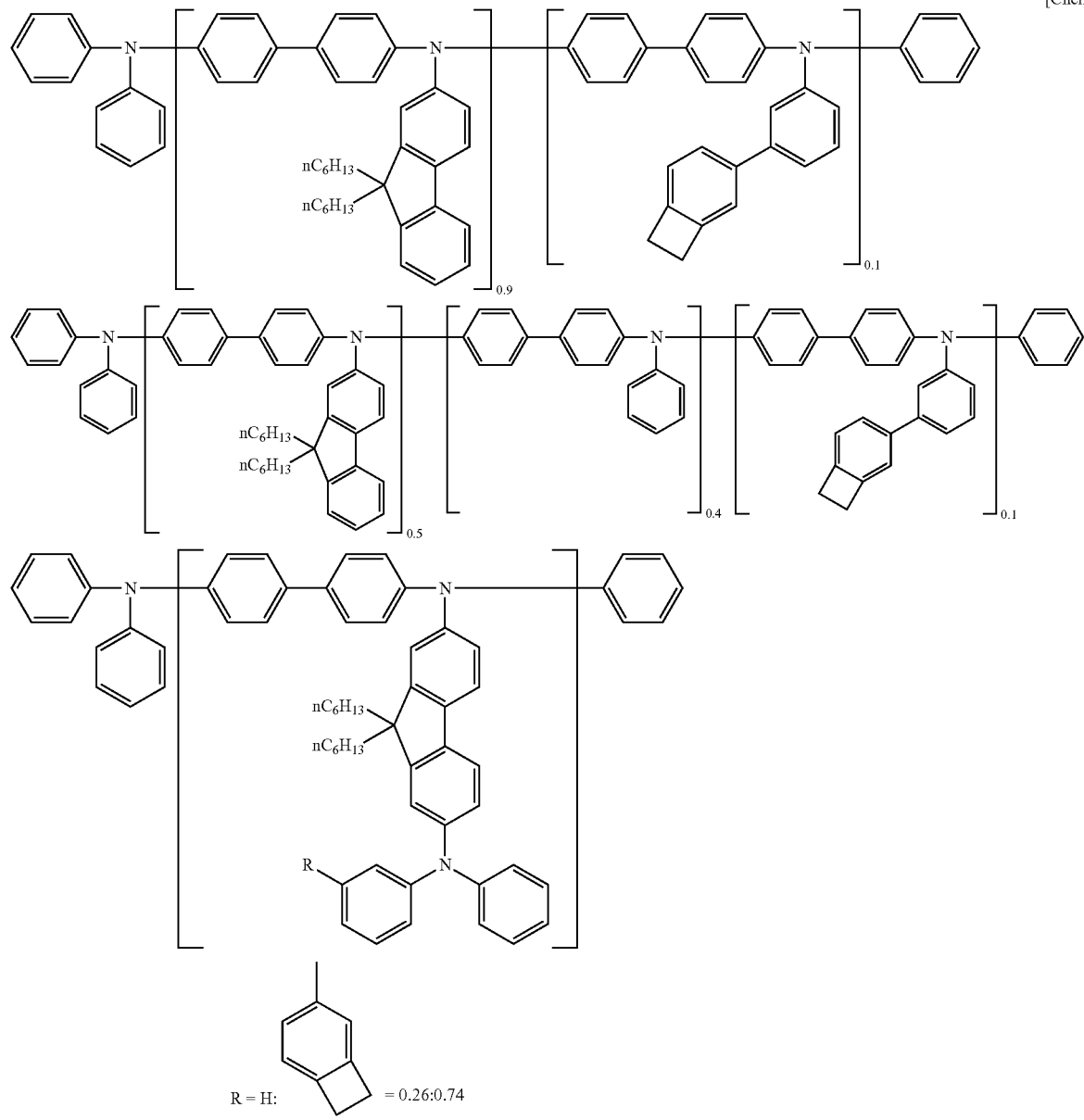

-continued
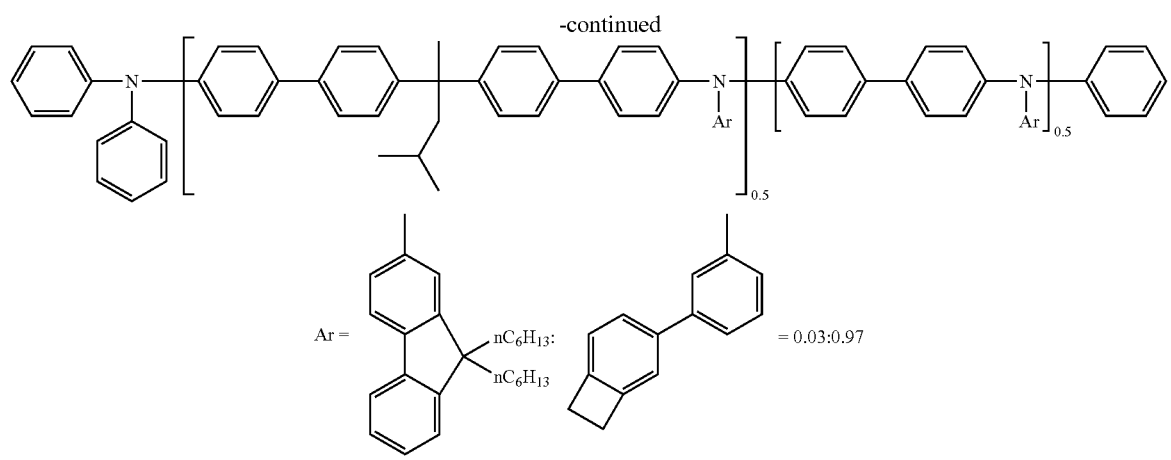
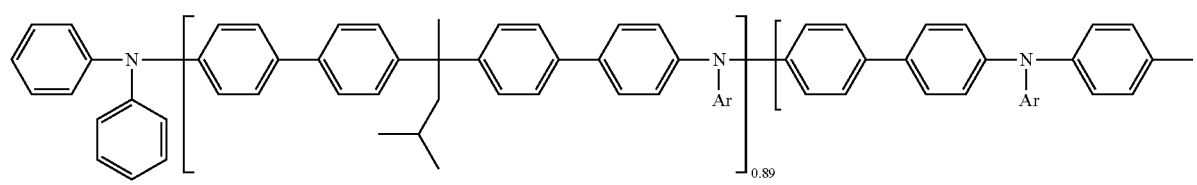
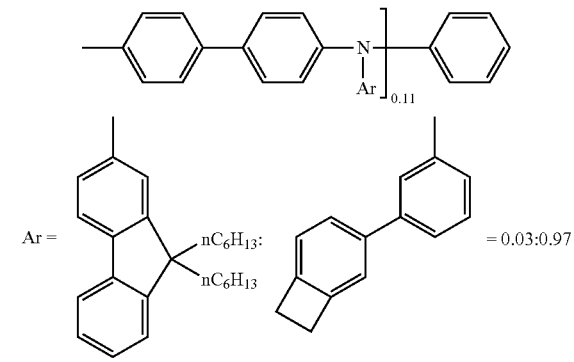
Example in which the minimum number of atoms between nitrogen atoms is 9:
[Chem. 14]
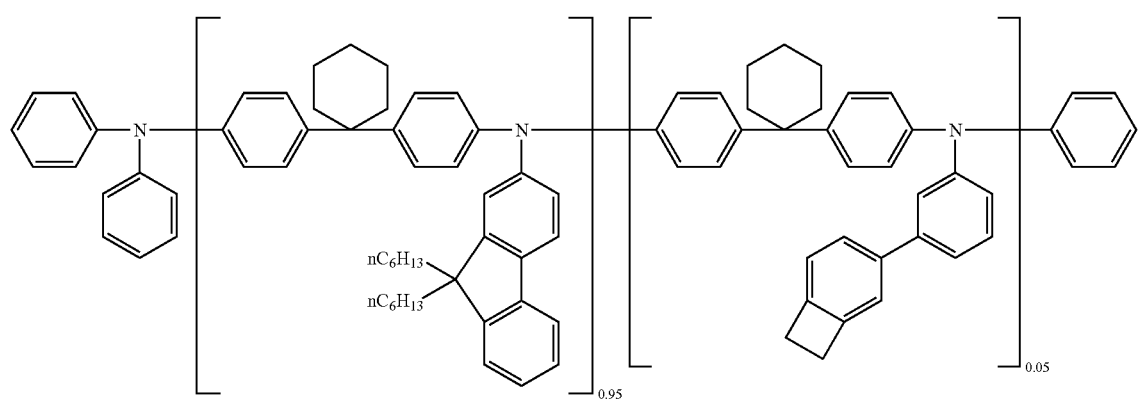

Examples in which the minimum number of atoms between nitrogen atoms is 10:
[Chem. 15]
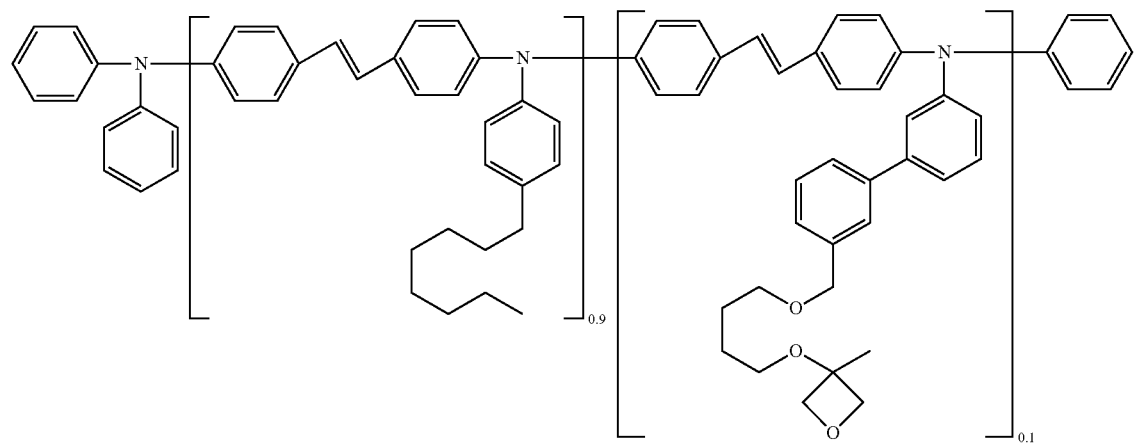
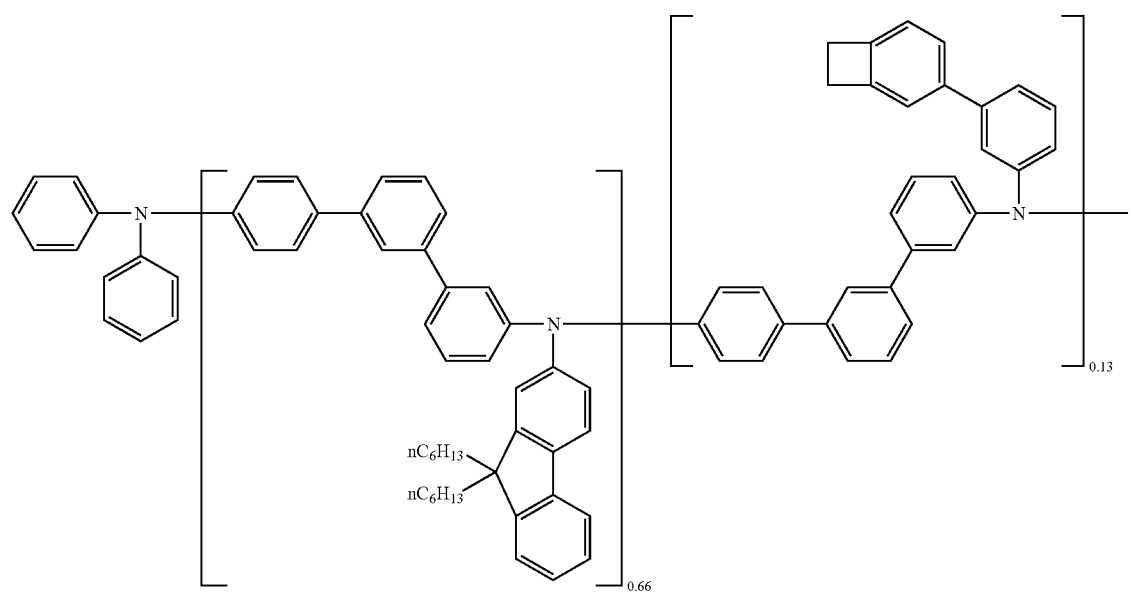
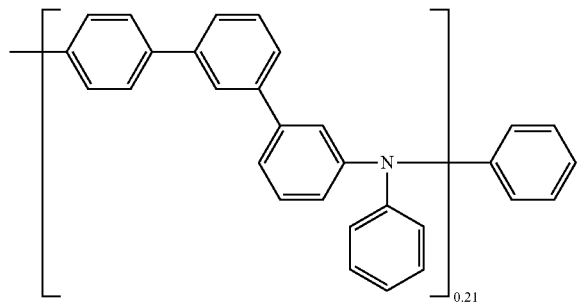

Example in which the minimum number of atoms between nitrogen atoms is 11:
[Chem. 16]
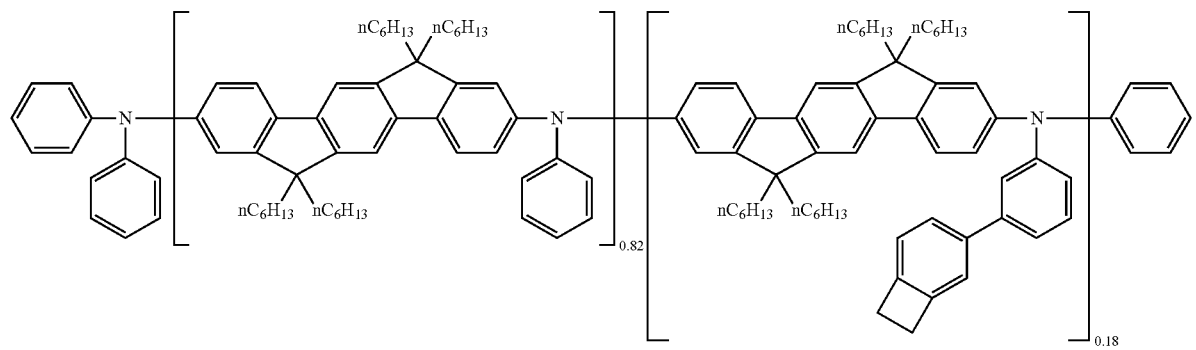
20
Examples in which the minimum number of atoms between nitrogen atoms is 12:
[Chem. 17]
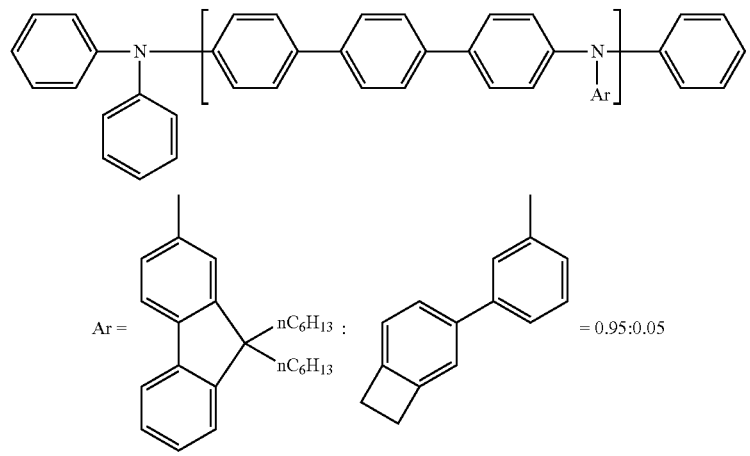
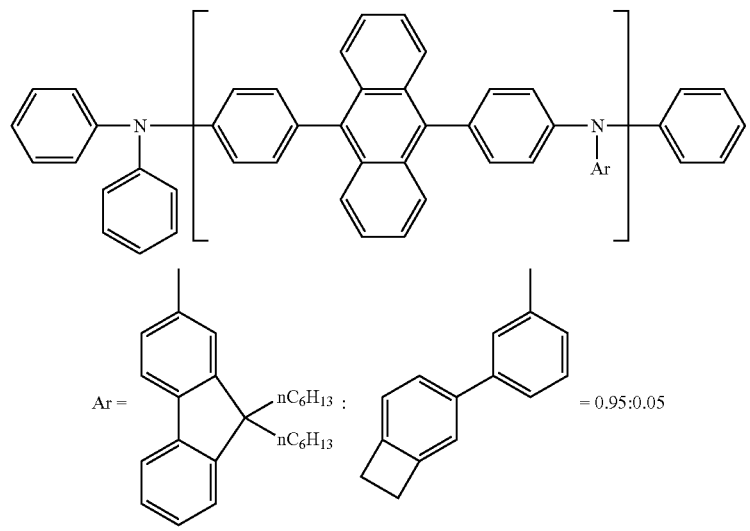

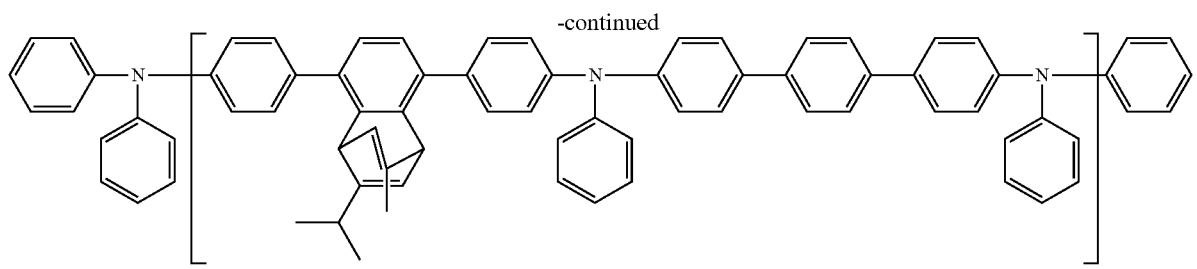
Example in which the minimum number of atoms between nitrogen atoms is 14:
[Chem. 18]
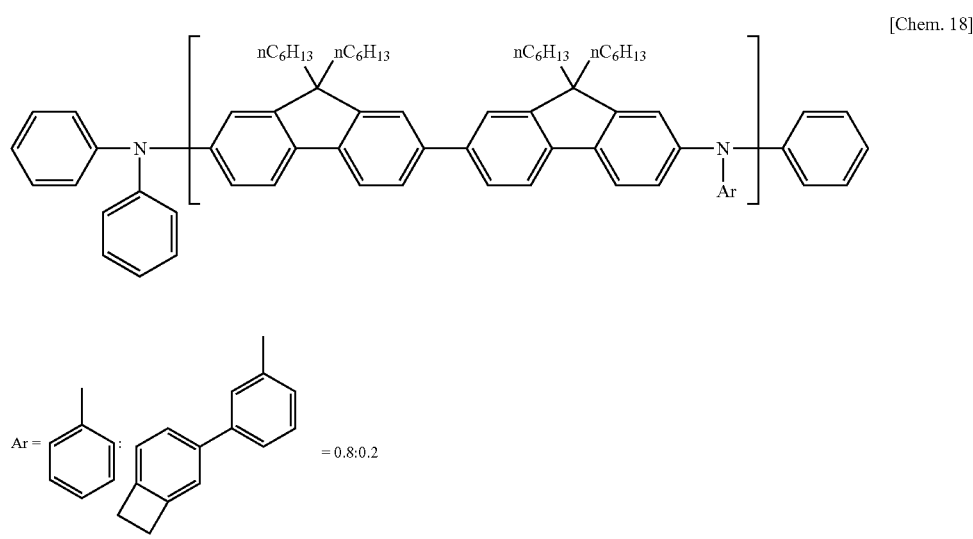
40
Example in which the minimum number of atoms between nitrogen atoms is 15:
[Chem. 19]
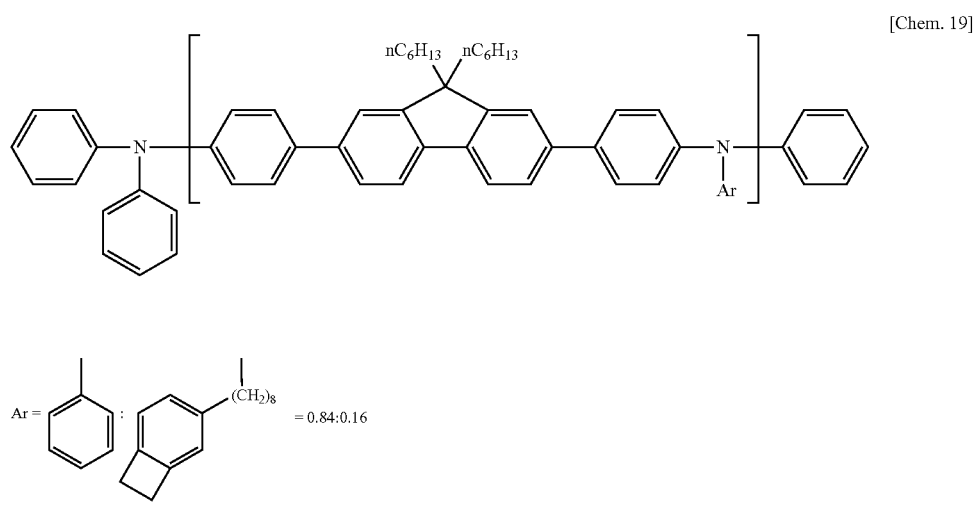

Example in which the minimum number of atoms between nitrogen atoms is 16:
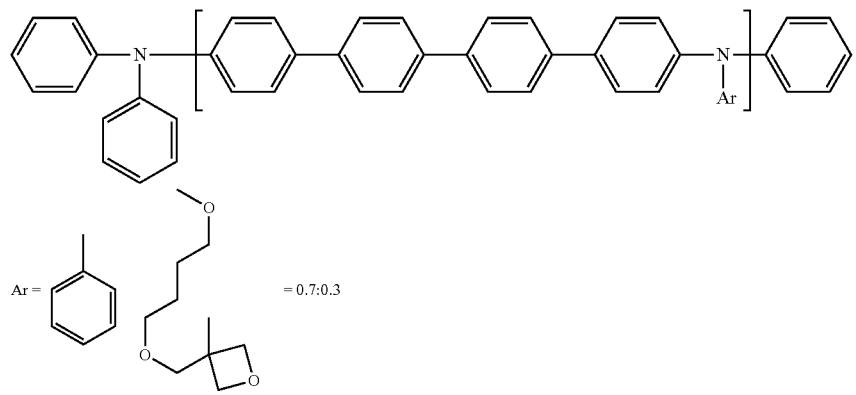
[Chem. 20]
Example in which the minimum number of atoms between nitrogen atoms is 17:
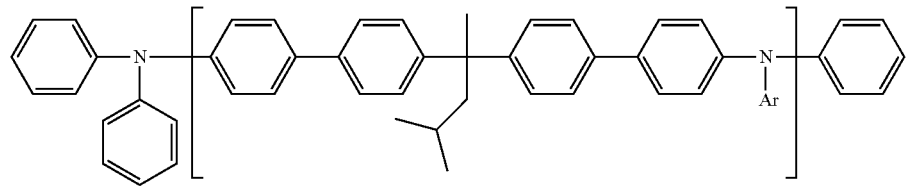
[Chem. 21]
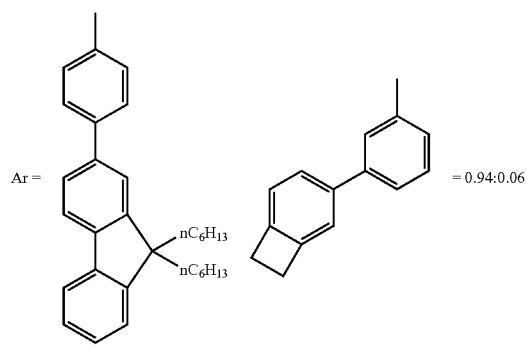
Example in which the minimum number of atoms between nitrogen atoms is 18:
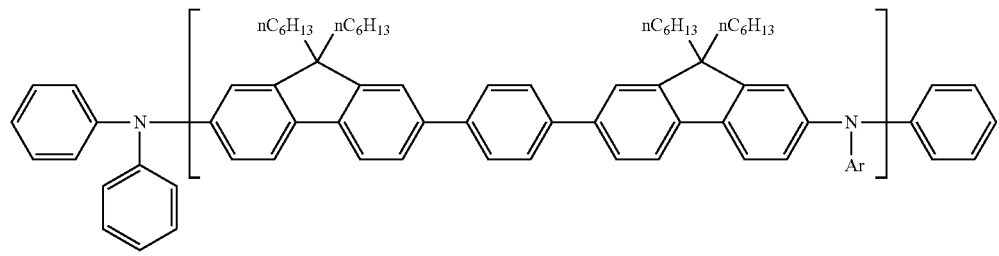
[Chem. 22]

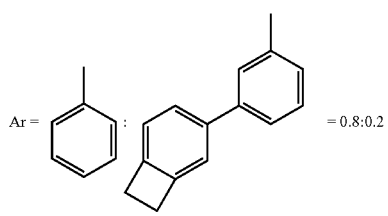

Example in which the minimum number of atoms between nitrogen atoms is 25:

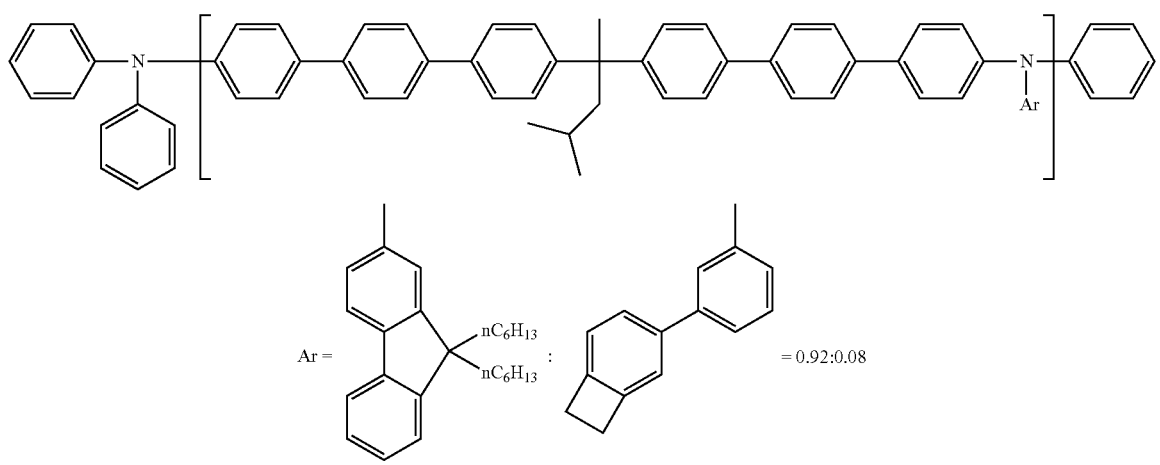

The compositions for forming the hole injection/transport layer A according to the invention may contain ingredients other than the arylamine polymer compounds according to the invention described above, so long as these ingredients are contained in such an amount that the excellent effects of the invention are not considerably lessened thereby. Examples of the other ingredients include an electron-accepting compound which is used in order to reduce the resistance of the hole injection/transport layer.

It is preferred that the electron-accepting compound should be a compound having oxidizing ability. Especially preferred is a compound which accepts one electron from the hole-transporting compound described above and which thereby forms an ion pair with the hole-injecting/transporting compound described above.

It is preferred that the molecular weight of the electron-accepting compound should be high, from the standpoint that positive charges and negative charges are sufficiently delocalized in this compound to attain an excellent electron-accepting ability. Meanwhile, it is preferred that the molecular weight thereof should be low, from the standpoint that this electron-accepting compound itself is less apt to prevent electron transport. Consequently, the molecular weight of the electron-accepting compound specifically is generally 100 or higher, preferably 300 or higher, more preferably 400 or higher, and is generally 5,000 or less, preferably 3,000 or less, more preferably 2,000 or less.

Specifically, the electron-accepting compound preferably is a compound having an electron affinity of 4 eV or higher. More preferred is a compound having an electron affinity of 5 eV or higher. Examples of the electron-accepting compound include: onium salts substituted with organic groups, such as 4-isopropyl-4'-methyldiphenyliodonium tetrakis(pentafluorophenyl)borate (International Publication WO 2005/089024); inorganic compounds having a high valence, such as iron(III) chloride (JP-A-11-251067) and ammonium peroxodisulfate; cyano compounds such as tetracyanoethylene; aromatic boron compounds such as tris(pentafluorophenyl)borane (JP-A-2003-31365); and fullerene derivatives and iodine.

Preferred of those compounds are onium salts substituted with organic groups, inorganic compounds having a high valence, and the like, from the standpoint that these compounds have a high oxidizing ability. Meanwhile, onium salts substituted with organic groups, cyano compounds, aromatic boron compounds, and the like are preferred from the standpoint that these compounds have high solubility in organic solvents and film formation therefrom by a wet film formation method is easy.

Examples of the onium salts substituted with organic groups, cyano compounds, or aromatic boron compounds, which are suitable for use as the electron-accepting compound, include the compounds shown in International Publication WO 2005/089024, and preferred examples thereof also are the same as in the literature. Examples of such compounds suitable for use as the electron-accepting compound include the compounds represented by the following structural formulae. However, the electron-accepting compound should not be construed as being limited to the following examples.

[Chem. 24]

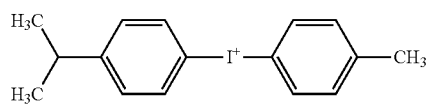

-continued

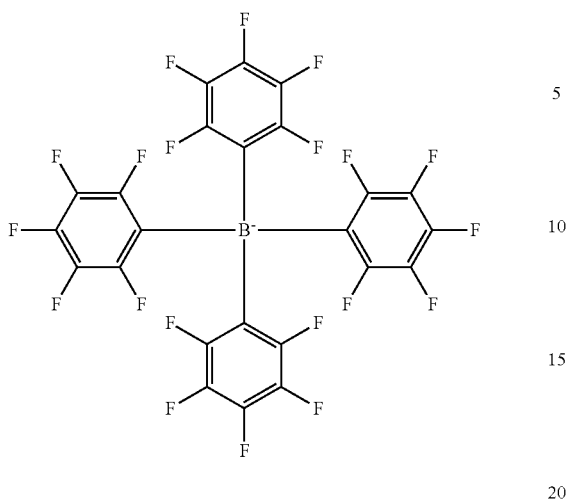

Specific examples of the electron-accepting compound in the invention are shown below, but the invention should not be construed as being limited to the following examples.

TABLE 1

$$(R^{11}-A^{1+}-R^{12})_{n_1} Z^{n_1-} \quad (I-1)$$

| No. | $A^1$ | $-R^{11}$ | $-R^{12}$ | $Z^{n_1-}$ |
|---|---|---|---|---|
| A-1 | I | —C₆H₄—CH₃ | —C₆H₄—CH(CH₃)₂ | [B(C₆F₅)₄]⁻ |
| A-2 | I | —C₆H₅ | —C₆H₅ | [B(C₆H₅)₄]⁻ |
| A-3 | I | —C₆H₄—CH₃ | —C₆H₄—CH(CH₃)₂ | [(C₆F₅)₃B—C₆F₄—B(C₆F₅)₃]²⁻ |
| A-4 | I | —C₆H₄—CH₃ | —C₆H₄—CH(CH₃)₂ | [Ga(C₆F₅)₄]⁻ |
| A-5 | I | —C₆H₅ | —C₆H₅ | PF₆⁻ |
| A-6 | I | —C₆H₅ | —C₆H₅ | SbF₆⁻ |

TABLE 1-continued $(R^{11}-A^{1+}-R^{12})_{n_1} Z^{n_1-}$ (I-1)

| No. | $A^1$ | $-R^{11}$ | $-R^{12}$ | $Z^{n_1-}$ |
|---|---|---|---|---|
| A-7 | I | 4-isopropylphenyl | 4-isopropylphenyl | $BF_4^-$ |
| A-8 | I | 4-methylphenyl | 1-naphthyl | $ClO_4^-$ |
| A-9 | I | phenyl | phenyl | $I^-$ |
| A-10 | I | phenyl | phenyl | $CF_3SO_3^-$ |
| A-11 | I | 4-ethylphenyl | 4-ethylphenyl | $CH_3CO_2^-$ |

TABLE 2

| No. | $A^1$ | $-R^{11}$ | $-R^{12}$ | $Z^{n_1-}$ |
|---|---|---|---|---|
| A-12 | I | 2-naphthyl | phenyl | $AsF_6^-$ |
| A-13 | I | 2-isopropyl-4-methoxyphenyl | 2-isopropyl-4-methoxyphenyl | $BF_4^-$ |
| A-14 | I | 4-tert-butylphenyl | 4-tert-butylphenyl | $[B(C_6H_4F)_4]^-$ |
| A-15 | I | 2-methylphenyl | 2-methylphenyl | $NO_3^-$ |

TABLE 2-continued

| No. | A¹ | —R¹¹ | —R¹² | $Z^{n1-}$ |
|---|---|---|---|---|
| A-16 | I | 3-pyridyl | phenyl | $CH_3O-SO_3^-$ |
| A-17 | I | 2,4,6-trimethylpyridin-3-yl (with H₃C at 2,4,6; attached at 3) | 2,4,6-trimethylpyridin-3-yl | $PF_6^-$ |
| A-18 | I | 2-thienyl | 2-thienyl | benzoate (PhCO₂⁻) |
| A-19 | I | 4-methoxyphenyl | 4-methoxyphenyl | $[B(C_6F_5)_4]^-$ |
| A-20 | I | 4-chlorophenyl | 4-chlorophenyl | $GaF_4^-$ |
| A-21 | I | phenyl | 4-fluorophenyl | $IO_3^-$ |

TABLE 3

| No. | A¹ | —R¹¹ | —R¹² | $Z^{n1-}$ |
|---|---|---|---|---|
| A-22 | I | phenyl | quinolin-2-yl | $Cl^-$ |
| A-23 | I | 3-methylphenyl | 4-nitrophenyl | $Br^-$ |
| A-24 | I | 2-naphthyl | 2-naphthyl | $PF_6^-$ |
| A-25 | I | 3-methoxyphenyl | phenyl | $CF_3CO_2^-$ |

TABLE 3-continued

| No. | A¹ | —R¹¹ | —R¹² | $Z^{n1-}$ |
|---|---|---|---|---|
| A-26 | I | 4-acetylphenyl | phenyl | $F^-$ |
| A-27 | I | 4-(2-phenylpropan-2-yl)phenyl | 4-(2-phenylpropan-2-yl)phenyl | $SO_4^{2-}$ |
| A-28 | I | pyridin-4-yl | pyridin-4-yl | $NO_3^-$ |
| A-29 | I | 2,3-dihydro-1H-indene-4-yl (tetrahydronaphthyl) | phenyl | $BF_4^-$ |
| A-30 | I | 4-bromo-5-methylthiophen-2-yl | 4-bromo-5-methylthiophen-2-yl | $ClO_4^-$ |
| A-31 | I | phenanthren-9-yl | 4-methylphenyl | $\left[\begin{array}{c}C_6F_5\\C_6F_5-Ga-C_6F_5\\C_6F_5\end{array}\right]^-$ |
| A-32 | I | 4-isopropylphenyl | 4-isopropylphenyl | $NO_3^-$ |
| A-33 | I | phenyl | pentafluorophenyl | $PF_6^-$ |

TABLE 4

| No. | A¹ | —R¹¹ | —R¹² | $Z^{n1-}$ |
|---|---|---|---|---|
| A-34 | I | 4-methylphenyl | 4-methylphenyl | $Cl^-$ |
| A-35 | I | 4-(trimethylsilyl)phenyl | 4-(trimethylsilyl)phenyl | $CF_3CF_2SO_3^-$ |

TABLE 4-continued

| No. | A¹ | —R¹¹ | —R¹² | $Z^{n1-}$ |
|---|---|---|---|---|
| A-36 | I | 4-biphenylyl | 4-biphenylyl | benzenesulfonate (PhSO₃⁻) |
| A-37 | I | —CH₃ | phenyl | [B(C₆H₅)₄]⁻ |
| A-38 | I | —CH₂—phenyl (benzyl) | phenyl | NO₃⁻ |
| A-39 | I | 4-methylphenyl (p-tolyl) | —CH=CH₂ | ClO₄⁻ |
| A-40 | I | 4-fluorophenyl | —CH₂—C≡CH | [Ga(C₆H₅)₄]⁻ |
| A-41 | I | —CH(CH₃)₂ (isopropyl) | —CH(CH₃)₂ (isopropyl) | PF₆⁻ |
| A-42 | I | —CF₂CF₃ | 2-naphthyl | benzenesulfonate (PhSO₃⁻) |
| A-43 | I | cyclohexyl | phenyl | I⁻ |
| A-44 | I | —CF₃ | 9-fluorenyl (—CH-fluorene) | BF₄⁻ |
| A-45 | I | phenyl | —CF₂CF₂CF₃ | CF₃SO₃⁻ |

TABLE 5

| No. | A¹ | —R¹¹ | —R¹² | $Z^{n1-}$ |
|---|---|---|---|---|
| A-46 | I | pentafluorophenyl | —CF$_3$ | GaF$_4^-$ |
| A-47 | I | phenyl | —CF$_2$CF$_2$CF$_2$CF$_2$CF$_2$CF$_3$ | [B(C$_6$F$_5$)$_4$]$^-$ |
| A-48 | I | benzyl (—CH$_2$—phenyl) | —CH$_3$ | Br$^-$ |
| A-49 | I | tert-butyl (C(CH$_3$)$_3$) | 4-methoxyphenyl | BrO$_4^-$ |
| A-50 | I | —CH$_2$CH$_3$ | 4-(acetylamino)phenyl | NO$_2^-$ |
| A-51 | I | 3-pyridyl | —Si(CH$_3$)$_3$ | CF$_3$SO$_3^-$ |
| A-52 | I | —CH$_2$—CH=CH$_2$ | phenyl | PO$_4^{3-}$ |
| A-53 | I | —CH$_2$—O—CH$_3$ | cyclohexyl | OH$^-$ |
| A-54 | I | phenyl | —O—C(=O)—CF$_3$ | CF$_3$CO$_2^-$ |
| A-55 | I | phenyl | —O—C(=O)—CH$_3$ | CH$_3$CO$_2^-$ |
| A-56 | I | phenyl | —OH | 4-methylbenzenesulfonate (p-CH$_3$-C$_6$H$_4$-SO$_3^-$) |
| A-57 | I | —OCH$_2$CH$_3$ | 4-methoxyphenyl | BF$_4^-$ |

TABLE 6
| No. | A$^1$ | —R$^{11}$ | —R$^{12}$ | Z$^{n1-}$ |
|---|---|---|---|---|
| A-58 | I | 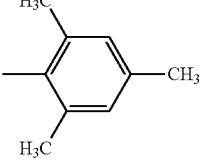 | 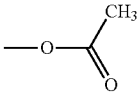 | PF$_6^-$ |
| A-59 | I | 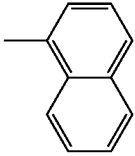 | —OH | OH$^-$ |
| A-60 | I | 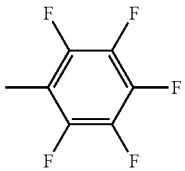 | 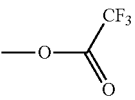 | CF$_3$CO$_2^-$ |
| A-61 | I | 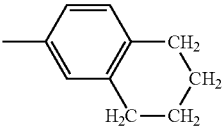 | 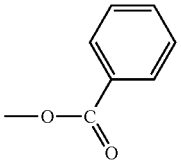 | NO$_3^-$ |
| A-62 | I | 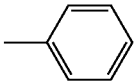 | 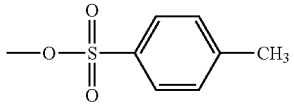 | 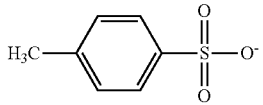 |
| A-63 | I | —CH$_2$CH$_3$ | 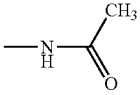 | SbF$_6^-$ |
| A-64 | I | 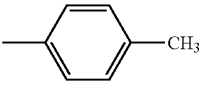 | —OCH$_3$ | 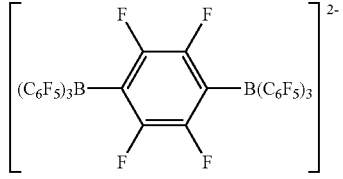 |
| A-65 | Br | 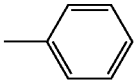 | 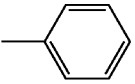 | BF$_4^-$ |
| A-66 | Br | 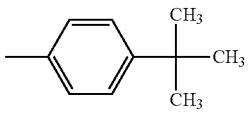 | 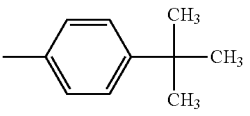 | PF$_6^-$ |
| A-67 | Br | 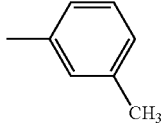 | 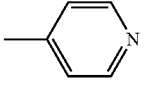 | Br$^-$ |

TABLE 6-continued

| No. | A¹ | —R¹¹ | —R¹² | $Z^{n1-}$ |
|---|---|---|---|---|
| A-68 | Br | 4-(phenylthio)phenyl | phenyl | $CF_3CF_2SO_3^-$ |

TABLE 7

| No. | A¹ | —R¹¹ | —R¹² | $Z^{n1-}$ |
|---|---|---|---|---|
| A-69 | Br | 4-isopropoxyphenyl | 4-isopropoxyphenyl | tetrakis(4-fluorophenyl)borate |
| A-70 | Br | 5-methyl-2-methoxy-α-methylbenzyl (isopropyl-methoxyphenyl) | cyclopentyl | $ClO_4^-$ |
| A-71 | Br | phenyl | $-CH_2CH=CHCH_3$ | $GaF_4^-$ |
| A-72 | Br | 3-pyridyl | $-CF_2CF_2CF_3$ | $SO_4^{2-}$ |
| A-73 | Br | phenyl | $-OC(O)CF_3$ | $CF_3CO_2^-$ |
| A-74 | Br | $-CH=CH_2$ | $-OC(CH_3)_3$ | benzoate |
| A-75 | Cl | phenyl | phenyl | $PF_6^-$ |
| A-76 | Cl | $-CH_2CH_3$ | pentafluorophenyl | $Cl^-$ |

TABLE 7-continued

| No. | $A^1$ | $-R^{11}$ | $-R^{12}$ | $Z^{n_1-}$ |
|---|---|---|---|---|
| A-77 | Cl | (4-methylphenyl) | (4-methylphenyl, CH₃) | $CF_3CO_2^-$ |

TABLE 8

$$(R^{11}-A^{1+}-R^{12})_{n_1}\ Z^{n_1-} \quad (I\text{-}1)$$

| No. | $R^{11}-A^{1+}-R^{12}$ | $Z^{n_1-}$ |
|---|---|---|
| A-79 | [diphenyleneiodonium]⁺ | $SO_4^{2-}$ |
| A-80 | [diphenyleneiodonium]⁺ | $[B(C_6F_5)_4]^-$ |
| A-81 | [dibenzofuran-Br]⁺ | $BF_4^-$ |
| A-82 | [3,7-dimethyldiphenyleneiodonium]⁺ | $PF_6^-$ |
| A-83 | [benziodoxol-3(1H)-one]⁺ | $CF_3CO_2^-$ |
| A-84 | [benziodazol-3(2H)-one]⁺ | 4-methylbenzenesulfonate |

TABLE 9

$$\left(\begin{array}{c} R^{21} \\ | \\ R^{22}-A^{2+}-R^{23} \end{array}\right)_{n_2}\ Z^{n_2-} \quad (I\text{-}2)$$

| No. | $A^2$ | $-R^{21}$ | $-R^{22}$ | $-R^{23}$ | $Z^{n_2-}$ |
|---|---|---|---|---|---|
| B-1 | S | phenyl | phenyl | phenyl | $[B(C_6F_5)_4]^-$ |
| B-2 | S | 4-tert-butylphenyl | 4-tert-butylphenyl | 4-tert-butylphenyl | $[B(C_6H_5)_4]^-$ |
| B-3 | S | 4-methylphenyl | phenyl | phenyl | $[1,4\text{-}(C_6F_5)_3B\text{-}C_6F_4\text{-}B(C_6F_5)_3]^{2-}$ |
| B-4 | S | phenyl | 4-phenoxyphenyl | phenyl | $CF_3SO_3^-$ |

TABLE 9-continued

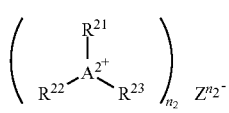
(I-2)

| No. | $A^2$ | $-R^{21}$ | $-R^{22}$ | $-R^{23}$ | $Z^{n_2-}$ |
|---|---|---|---|---|---|
| B-5 | S | phenyl | phenyl | naphthyl | $PF_6^-$ |
| B-6 | S | phenyl | 4-(methylthio)phenyl | $-CH_3$ | $CF_3SO_3^-$ |
| B-7 | S | 4-isopropylphenyl | phenyl | 4-methylphenyl | $BF_4^-$ |
| B-8 | S | phenyl | naphthyl | phenyl | $ClO_4^-$ |
| B-9 | S | phenyl | phenyl | 4-(phenylthio)phenyl | $PF_6^-$ |

TABLE 10

| No. | $A^2$ | $-R^{21}$ | $-R^{22}$ | $-R^{23}$ | $Z^{n_2-}$ |
|---|---|---|---|---|---|
| B-10 | S | phenyl | 4-tert-butylphenyl | phenyl | tetrakis(pentafluorophenyl)borate |
| B-11 | S | 4-ethylphenyl | 4-ethylphenyl | 4-ethylphenyl | $CH_3CO_2^-$ |
| B-12 | S | 4-bromophenyl | phenyl | phenyl | $AsF_6^-$ |
| B-13 | S | phenyl | phenyl | 2,4,6-trimethylphenyl | 4-methylbenzenesulfonate |

TABLE 10-continued
| No. | A² | —R²¹ | —R²² | —R²³ | Z^{n2-} |
|---|---|---|---|---|---|
| B-14 | S | 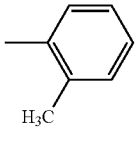 | 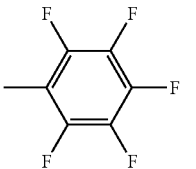 | 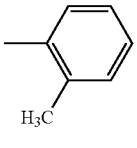 | NO₃⁻ |
| B-15 | S |  | —CH₂CH₂CH₂CH₃ |  | 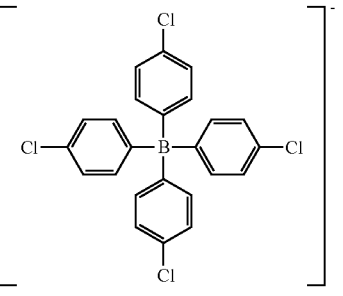 |
| B-16 | S | —CH₃ | —CH₃ | 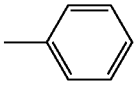 | PF₆⁻ |
| B-17 | S |  | 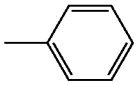 | 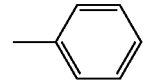 | Cl⁻ |
| B-18 | S | 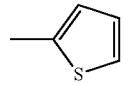 | 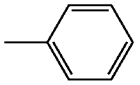 | 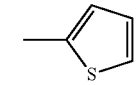 | 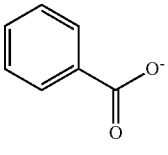 |
| B-19 | S | 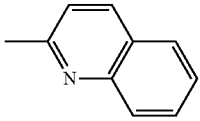 | 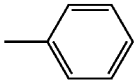 | 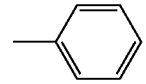 | GaF₄⁻ |
TABLE 11
| No. | A² | —R²¹ | —R²² | —R²³ | Z^{n2-} |
|---|---|---|---|---|---|
| B-20 | S | 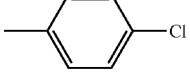 |  | 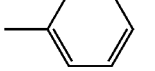 | NO₃⁻ |
| B-21 | S | 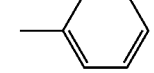 | —CH₂—CH=CH₂ | 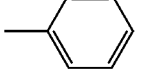 | CF₃CO₂⁻ |
| B-22 | S | 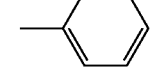 | 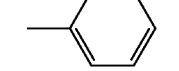 | —CH=CH₂ | Cl⁻ |
| B-23 | S | 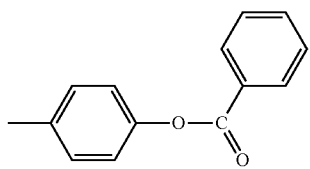 | | —CH₃ | SbF₆⁻ |

TABLE 11-continued

| No. | $A^2$ | —$R^{21}$ | —$R^{22}$ | —$R^{23}$ | $Z^{n2-}$ |
|---|---|---|---|---|---|
| B-24 | S | 2-naphthyl | 4-pyridyl | 4-acetylphenyl | $PF_6^-$ |
| B-25 | S | 3-methoxyphenyl | 3-methoxyphenyl | cyclohexyl | $SO_4^{2-}$ |
| B-26 | S | —$CH_2CH_3$ | 9H-fluoren-9-yl | —$CH_2CH_3$ | $NO_3^-$ |
| B-27 | S | 4-(2-phenylpropan-2-yl)phenyl | isobutyl | isobutyl | $PF_6^-$ |
| B-28 | S | phenanthren-9-yl | —$CH_2CH_2CH_2CH_3$ | —$CH_2CH_2CH_2CH_3$ | $BF_4^-$ |
| B-29 | S | —$CH_3$ | —$CH_3$ | —$CH_2CH_2NH_2$ | $I^-$ |
| B-30 | S | phenyl | phenyl | phenyl | $BF_4^-$ |
| B-31 | S | phenyl | —O—C(=O)—$CF_3$ | phenyl | $CF_3CO_2^-$ |

TABLE 12

| No. | $A^2$ | —$R^{21}$ | —$R^{22}$ | —$R^{23}$ | $Z^{n2-}$ |
|---|---|---|---|---|---|
| B-32 | Se | 4-isopropylphenyl | 4-methoxyphenyl | 4-methoxyphenyl | $ClO_4^-$ |
| B-33 | Se | phenyl | phenyl | phenyl | $PF_6^-$ |
| B-34 | Se | 4-methylphenyl | —$CH_3$ | —$CH_3$ | $I^-$ |

TABLE 12-continued

| No. | A² | —R²¹ | —R²² | —R²³ | Z^{n2-} |
|---|---|---|---|---|---|
| B-35 | Se | 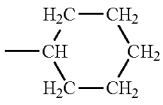 | 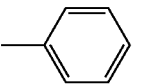 | 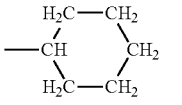 | CF₃CF₂SO₃⁻ |
| B-36 | Te | 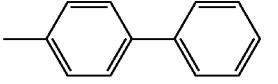 | 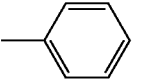 | 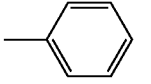 | PF₆⁻ |
| B-37 | Te | —CH₃ | 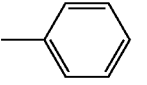 | —CH₃ | 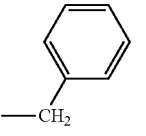 |
| B-38 | Te | 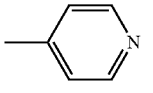 | 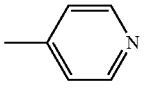 | 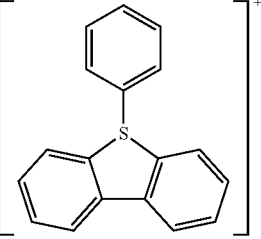 | NO₃⁻ |

TABLE 13

$$\left( \begin{array}{c} R^{21} \\ A^{2+} \\ R^{22} \quad R^{23} \end{array} \right)_{n_2} Z^{n_2-} \quad (I\text{-}2)$$

| No. | $\begin{array}{c}R^{21}\\A^{2+}\\R^{22}\quad R^{23}\end{array}$ | $Z^{n2-}$ |
|---|---|---|
| B-39 | 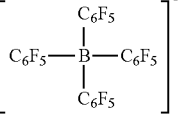 | 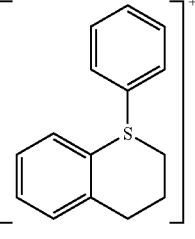 |
| B-40 | 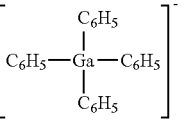 | 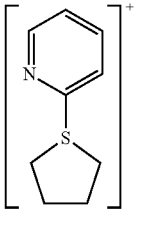 |
| B-41 | 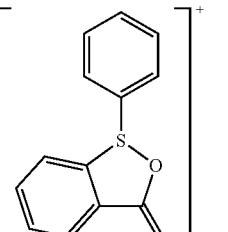 | PF₆⁻ |

TABLE 13-continued $$\left( \begin{array}{c} R^{21} \\ A^{2+} \\ R^{22} \quad R^{23} \end{array} \right)_{n_2} Z^{n_2-} \quad (I\text{-}2)$$

| No. | $\begin{array}{c}R^{21}\\A^{2+}\\R^{22}\quad R^{23}\end{array}$ | $Z^{n2-}$ |
|---|---|---|
| B-42 | 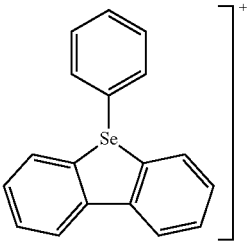 | BF₄⁻ |
| B-43 |  | NO₃⁻ |

TABLE 14

$$\left( \begin{array}{c} R^{31} \\ | \\ R^{32}—A^{3+}—R^{34} \\ | \\ R^{33} \end{array} \right)_{n_3} Z^{n_3-} \quad (\text{I-3})$$

| No. | A³ | —R³¹ | —R³² | —R³³ | —R³⁴ | $Z^{n_3-}$ |
|---|---|---|---|---|---|---|
| C-1 | P | phenyl | phenyl | phenyl | phenyl | [B(C₆F₅)₄]⁻ |
| C-2 | P | 4-isopropylphenyl | 4-isopropylphenyl | 4-isopropylphenyl | 4-isopropylphenyl | PF₆⁻ |
| C-3 | P | phenyl | phenyl | 2-naphthyl | 2-naphthyl | [B(C₆H₅)₄]⁻ |
| C-4 | P | phenyl | 4-(phenylthio)phenyl | phenyl | 4-(phenylthio)phenyl | CF₃SO₃⁻ |
| C-5 | P | —CH₃ | phenyl | phenyl | phenyl | BF₄⁻ |
| C-6 | P | phenyl | —CH₂—CH=CH₂ | phenyl | phenyl | ClO₄⁻ |
| C-7 | P | phenyl | phenyl | —CH₂—C≡CH | phenyl | PF₆⁻ |

TABLE 15

| No. | A³ | —R³¹ | —R³² | —R³³ | —R³⁴ | Z^{n3-} |
|---|---|---|---|---|---|---|
| C-8 | P | phenyl | naphthyl | phenyl | naphthyl | AsF₆⁻ |
| C-9 | P | phenyl | phenyl | 4-(phenylthio)phenyl | 4-(phenylthio)phenyl | 4-methylbenzenesulfonate |
| C-10 | P | naphthyl | phenyl | naphthyl | phenyl | tetrakis(pentafluorophenyl)borate |
| C-11 | P | phenyl | phenyl | ethoxycarbonylmethyl | phenyl | Cl⁻ |
| C-12 | P | phenyl | phenyl | phenyl | benzyl | AsF₆⁻ |

TABLE 16

| No. | A³ | —R³¹ | —R³² | —R³³ | —R³⁴ | Z^{n3−} |
|---|---|---|---|---|---|---|
| C-13 | P | –C₆H₅ | –CH₂CH₂–N(CH₃)CH₂–N(CH₃)₂ | –C₆H₅ | –C₆H₅ | Br⁻ |
| C-14 | P | 2-CH₃–C₆H₄– | C₆F₅– | 2-CH₃–C₆H₄– | 2,4,6-(CH₃)₃–C₆H₂– | NO₃⁻ |
| C-15 | P | –C₆H₅ | –C₆H₅ | –C₆H₅ | –CH=CH₂ | CF₃CF₂SO₃⁻ |
| C-16 | P | –(CH₂)₅CH₃ | –C₆H₅ | –C₆H₅ | –C₆H₅ | PF₆⁻ |
| C-17 | P | 4-Cl–C₆H₄– | –C₆H₅ | –C₆H₅ | 2-(HO)–C₆H₄–CH₂– | I⁻ |
| C-18 | P | –CH₃ | –C₆H₅ | –C₆H₅ | –CH₃ | I⁻ |
| C-19 | P | –C₆H₅ | –C₆H₅ | 9-fluorenyl | –C₆H₅ | [B(4-F–C₆H₄)₄]⁻ |

TABLE 17

| No. | A³ | —R³¹ | —R³² | —R³³ | —R³⁴ | Z^{n3−} |
|---|---|---|---|---|---|---|
| C-20 | P | –C(C₆H₅)₃ (trityl, with additional CH₃) | –C₆H₅ | –C₆H₅ | –C₆H₅ | NO₃⁻ |
| C-21 | P | –C₆H₅ | –C₆H₅ | –C₆H₅ | –C₆H₅ | [B(C₆H₅)₄]⁻ |

TABLE 17-continued

| No. | A³ | —R³¹ | —R³² | —R³³ | —R³⁴ | Z^{n3-} |
|---|---|---|---|---|---|---|
| C-22 | P | phenyl | phenyl | —CH₂CH₃ | —CH₂CH₃ | SO₄²⁻ |
| C-23 | P | phenyl | phenyl | phenyl | —N(CH₃)(phenyl) | PF₆⁻ |
| C-24 | P | phenyl | —O—CH₂—C(CH₃)₃ | phenyl | phenyl | ClO₄⁻ |
| C-25 | As | phenyl | phenyl | phenyl | phenyl | BF₄⁻ |
| C-26 | As | phenanthrenyl | phenyl | phenyl | phenyl | NO₃⁻ |

TABLE 18

| No. | A³ | —R³¹ | —R³² | —R³³ | —R³⁴ | Z^{n3-} |
|---|---|---|---|---|---|---|
| C-27 | As | —CH(CH₃)₂ | phenyl | —CH(CH₃)₂ | phenyl | PF₆⁻ |
| C-28 | As | 4-pyridyl | 4-pyridyl | phenyl | phenyl | BF₄⁻ |
| C-29 | Sb | —CH₃ | —CH₃ | phenyl | phenyl | I⁻ |
| C-30 | Sb | phenyl | phenyl | phenyl | phenyl | BF₄⁻ |

TABLE 19

$$\left( \begin{array}{c} R^{31} \\ | \\ R^{32}-A^{3+}-R^{34} \\ | \\ R^{33} \end{array} \right)_{n_3} Z^{n_3^-}$$ (I-3)

| No. | $\begin{array}{c} R^{31} \\ | \\ R^{32}-A^{3+}-R^{34} \\ | \\ R^{33} \end{array}$ | $Z^{n_3^-}$ |
|---|---|---|
| C-31 | [triphenyl-fluorenyl phosphonium cation] | $[C_6F_5-B(C_6F_5)_2-C_6F_5]^-$ |
| C-32 | [diphenyl-phosphacyclohexane cation] | $NO_3^-$ |
| C-33 | [phospha-spirobifluorene cation] | $[C_6H_5-B(C_6H_5)_2-C_6H_5]^-$ |
| C-34 | [diphenyl-arsa-fluorenyl cation] | $BF_4^-$ |

From the standpoints of electron-accepting properties, heat resistance, and solubility in solvents, preferred compounds among the examples shown above are compounds A-1 to A-48, A-54, A-55, A-60 to A-62, A-64 to A-75, A-79 to A-83, B-1 to B-20, B-24, B-25, B-27, B-30 to B-37, B-39 to B-43, C-1 to C-10, C-19 to C-21, C-25 to C-27, C-30, and C-31. More preferred are compounds A-1 to A-9, A-12 to A-15, A-17, A-19, A-24, A-29, A-31 to A-33, A-36, A-37, A-65, A-66, A-69, A-80 to A-82, B-1 to B-3, B-5, B-7 to B-10, B-16, B-30, B-33, B-39, C-1 to C-3, C-5, C-10, C-21, C-25, and C-31. Especially preferred are compounds A-1 to A-7 and A-80.

One electron-accepting compound may be used alone, or any desired two or more electron-accepting compounds may be used in combination in any desired proportion.

The hole injection/transport layer A according to the invention is formed by a wet film formation method. When the layers of the hole injection/transport layer A according to the invention are formed by a wet film formation method, the formation of the layers is usually accomplished by preparing compositions for hole injection/transport layer formation which are for forming the respective layers, applying the compositions to form films thereof, and drying the films. The composition of the invention for organic electroluminescent elements, which will be described later and is for forming a layer between an anode and a luminescent layer by a wet film formation method, is used in the same manner to conduct layer formation.

It is preferred that the compositions for forming the hole injection/transport layer A according to the invention, which are to be used in a wet film formation method, should contain one or more solvents, at least one of which is a liquid in which the non-solvent components contained in the compositions for forming the hole injection/transport layer A according to the invention described above can dissolve. It is preferred that the solvents should have a high boiling point, from the standpoint of facilitating the formation of a film having even quality. Meanwhile, it is preferred that the solvents should have a low boiling point, from the standpoint that the compositions can be dried at low temperatures and the drying is less apt to affect the other layers and the substrate. Specifically, the boiling point at 1 atm of each solvent is preferably 110° C. or higher, more preferably 140° C. or higher, especially preferably 200° C. or higher, and is preferably 400° C. or lower, more preferably 300° C. or lower.

As the solvents to be contained in the compositions for forming the hole injection/transport layer A according to the invention, any desired solvents which satisfy the required properties may be used without particular limitations. Use can be made of ester solvents, aromatic hydrocarbon solvents, halogen-containing solvents, amide solvents, and the like.

Examples of the ester solvents include aliphatic esters such as ethyl acetate, n-butyl acetate, ethyl lactate, and n-butyl lactate and aromatic esters such as phenyl acetate, phenyl propionate, methyl benzoate, ethyl benzoate, propyl benzoate, and n-butyl benzoate.

Examples of the aromatic hydrocarbon solvents include toluene, xylene, mesitylene, cyclohexylbenzene, 3-isopropylbiphenyl, 1,2,3,4-tetramethylbenzene, 1,4-diisopropylbenzene, and methylnaphthalene.

Examples of the halogen-containing solvents include 1,2-dichloroethane, chlorobenzene, and o-dichlorobenzene.

Examples of the amide solvents include N,N-dimethylformamide and N,N-dimethylacetamide.

Besides these, dimethyl sulfoxide and the like can also be used.

One of these solvents may be used alone, or any desired two or more thereof may be used in combination in any desired proportion.

The amount of the solvent contained in each of the compositions for forming the hole injection/transport layer A according to the invention is generally 10% by weight or larger, preferably 50% by weight or larger, more preferably 60% by weight or larger, especially preferably 80% by weight or larger, and is generally 99.99% by weight or less.

It is preferred that the amount of the hole-injecting/transporting compound(s) contained in each of the compositions for forming the hole injection/transport layer A according to the invention should be large, from the standpoint that this composition has an increased viscosity. Meanwhile, from the standpoint of solubility, it is preferred that the amount thereof should be small. Consequently, the amount of the hole-injecting/transporting compound(s) contained in each composition for forming the hole injection/transport layer A specifically is generally 0.01% by weight or larger, preferably 0.5% by weight or larger, more preferably 1% by weight or larger, and is preferably 50% by weight or less, more preferably 40% by weight or less, especially preferably 20% by weight or less.

It is preferred that the hole-injecting/transporting compound(s) contained in each of the compositions for forming the hole injection/transport layer A according to the invention should include one or more arylamine polymer compounds according to the invention in an amount of 25% by weight or larger. The amount thereof is more preferably 50% by weight or larger, especially preferably 75% by weight or larger, and the upper limit thereof is 100% by weight.

In the case where the composition for forming the layer La according to the invention contains an electron-accepting compound, it is preferred that the content thereof should be high, from the standpoint of ease of attaining a low operating voltage. Meanwhile, from the standpoint of film-forming properties, it is preferred that the content thereof should be low. Furthermore, the content thereof preferably is low also from the standpoint of lowering the possibility that the electron-accepting compound might diffuse into an adjoining layer, e.g., the luminescent layer, to affect the luminescent efficiency or life. Consequently, the amount of the electron-accepting compound contained in the composition for forming the layer La according to the invention, in terms of the proportion thereof to the hole-injecting/transporting compound or to the arylamine polymer compound according to the invention, specifically is preferably 0.1% by weight or larger, more preferably 1% by weight or larger, and is preferably less than 50% by weight, more preferably 40% by weight or less, especially preferably 20% by weight or less.

Next, the composition for organic electroluminescent element of the invention is explained. The composition of the invention for organic electroluminescent elements is a composition for organic electroluminescent element which is for forming, by a wet film formation method, a layer to be interposed between the anode and luminescent layer of an organic electroluminescent element. This composition contains three or more kinds of arylamine polymer compounds according to the invention described above. Two or more of the three or more kinds of arylamine polymer compounds differ in N from each other.

It is preferred that the three or more kinds of arylamine polymer compounds contained in the composition of the invention for organic electroluminescent elements should have the same relationships as the arylamine polymer compounds according to the invention described above, because the organic electroluminescent element having a layer formed by a wet film formation method using this composition has a lowered operating voltage. The reason for this is as follows. When three or more kinds of arylamine polymer compounds which differ from each other in the spread of electron clouds are present in the layer, holes can be moved successively from a polymer compound in which the spread of electron clouds is narrow to a polymer compound in which the spread of electron clouds is wide (electrons can be moved successively from a polymer compound in which the spread of electron clouds is wide to a polymer compound in which the spread of electron clouds is narrow) within the layer. Consequently, the holes are efficiently transported by means of the polymer compound in which N is large (the spread of electron clouds is wide), without remaining in the polymer compound in which N is small (the spread of electron clouds is narrow). As a result, a sufficient voltage-lowering effect is obtained. It is therefore thought to be preferred that the three or more kinds of arylamine polymer compounds contained in the composition of the invention for organic electroluminescent elements should have the relationships described above.

Since it is preferred that the composition of the invention for organic electroluminescent elements should contain three or more kinds of arylamine polymer compounds which differ from each other in the spread of electron clouds, it is preferred that the composition should contain three or more kinds of arylamine polymer compounds which differ in N from each other. Furthermore, when the minimum value and maximum value of N for the arylamine polymer compounds contained in the composition are expressed by $N_{min}$ and $N_{max}$, respectively, the $N_{max}$ is preferably larger than 2.0 times the $N_{min}$ ($N_{max} > 2.0 N_{mm}$). The $N_{max}$ is more preferably larger than 2.1 times the $N_{min}$. Meanwhile, it is preferred that the $N_{max}$ should be smaller than 4.3 times. This is because in this configuration, both a polymer compound into which holes are apt to be efficiently injected and a polymer compound through which holes are apt to be efficiently transported are contained in the composition and, hence, transfer of holes occurs efficiently between the polymer compounds present in the layer formed using the composition.

From the standpoint of efficiently moving holes successively, it is preferred that the composition should contain an arylamine polymer compound in which the value of N is smaller than $N_{max}$ but larger than $N_{min}$. Specifically, it is preferred that the composition should contain an arylamine polymer compound in which the value of N is ($N_{max}$−4) or less but ($N_{min}$+4) or larger, i.e., an arylamine polymer compound which satisfies ($N_{max}$−4)≥N≥($N_{min}$+4).

It is preferred that the composition (examples and the content of each component, optional ingredients, etc.) of the composition of the invention for organic electroluminescent elements, methods for forming a layer using the composition, etc. should be the same as in the case of the compositions described above for forming the hole injection/transport layer A according to the invention.

As application techniques in wet film formation which are applicable in the invention to the compositions for forming the hole injection/transport layer A according to the invention and to the composition of the invention for organic electroluminescent elements, use can be made, for example, of spin coating, dip coating, die coating, bar coating, blade coating, roll coating, spray coating, capillary coating, ink jet printing, nozzle printing, screen printing, gravure printing, flexographic printing, and the like. Preferred of such application techniques are spin coating, spray coating, ink-jet printing, and nozzle printing, because these techniques are apt to be suited for the liquid nature of the compositions for forming the hole injection/transport layer A according to the invention and of the composition of the invention for organic electroluminescent elements.

The temperature to be used for film formation is preferably 10° C. or higher but is preferably 50° C. or lower, from the standpoint, for example, that film defects due to crystals generated in the compositions are less apt to result. The relative humidity to be used for film formation is not particularly limited unless the effects of the invention are considerably lessened thereby. However, the relative humidity is generally 0.01 ppm or higher but is generally 80% or less.

The coating films are usually dried with heating or by vacuum drying, etc. Examples of means for heating include clean ovens, hot plates, infrared rays, halogen lamp heaters, and irradiation with microwaves. Preferred of these are clean ovens and hot plates, because it is easy to evenly heat the whole films. Specifically, for example, the coating films can be heated by placing a multilayer structure including the coating films on a hot plate or by heating the multilayer structure in an oven. It is preferred that the heating temperature to be used for the drying should be a temperature not lower than the boiling point of the solvent(s) used for forming the hole injection/transport layer, unless the effects of the invention are considerably lessened thereby. In the case where a mixed solvent composed of two or more solvents was used, it is preferred to heat the coating films at a temperature not lower than the boiling point of at least one of the solvents. When an increase in the boiling point of the solvent(s) is taken into account, it is preferred to use a heating temperature of 120-410° C. The period of heating during the drying is not limited so long as the coating films are heated at a temperature not lower than the boiling point of the solvent(s) used for forming the hole injection/transport layer and as the coating films are dried by the heating. However, a short heating period is preferred from the standpoint that components of the layers other than the hole injection/transport layer are less apt to diffuse. Meanwhile, a prolonged heating period is preferred from the standpoint that the hole injection/transport layer is apt to be obtained as a homogeneous film. Specifically, it is usually preferred that the heating period should be 10 seconds to 180 minutes. The drying by heating may be conducted in two or more portions.

It is preferred that the thickness of each of the layers possessed by the hole injection/transport layer A according to the invention which can be thus obtained or the thickness of the layer thus formed using the composition of the invention for organic electroluminescent elements should be large, from the standpoint that a short-circuit or leakage is less apt to occur. Meanwhile, it is preferred that the thickness thereof should be small from the standpoint that a low operating voltage is apt to be attained. Consequently, the thickness of each of those layers specifically is preferably 1 nm or larger, more preferably 3 nm or larger, and is preferably 300 nm or less, more preferably 200 nm or less. With respect to the thickness of the hole injection/transport layer A according to the invention, which is the total thickness of those layers, it is preferred that the thickness thereof should be large, from the standpoint that a short-circuit or leakage is less apt to occur. Meanwhile, it is preferred that the thickness of the layer A should be small, from the standpoint that a decrease in luminescent efficiency due to light absorption by the hole injection/transport layer is less apt to occur. Consequently, the thickness of the hole injection/transport layer A specifically is preferably 5 nm or larger, more preferably 10 nm or larger, and is preferably 500 nm or less, more preferably 400 nm or less.

The explanation given above on film formation methods applies also to the composition of the invention for organic electroluminescent elements.

A layer configuration of the organic electroluminescent element of the invention, a process for producing the configuration, etc. are explained below by reference to FIG. 1. FIG. 1 is a diagrammatic cross-sectional view which illustrates one example of the structure of the organic electroluminescent element according to the invention. The layer configuration of the organic electroluminescent element of the invention, process for producing the configuration, etc. are not limited to the example. In FIG. 1, numeral 1 denotes a substrate, 2 an anode, 10 a hole injection/transport layer, 5 a luminescent layer, 6 a hole blocking layer, 7 an electron transport layer, 8 an electron injection layer, and 9 a cathode, and the hole injection/transport layer 10 has a multilayer structure composed of a hole injection/transport layer 3 and a hole injection/transport layer 4. Incidentally, the hole injection/transport layer 10 corresponds to the hole injection/transport layer A described above, and is formed from the compositions described above for forming the hole injection/transport layer A according to the invention or from the composition of the invention described above for organic electroluminescent elements. The hole injection/transport layer 3 corresponds to the layer La and layer La' described above, and the hole injection/transport layer 4 corresponds to the layer Lc and layer Lc' described above. Incidentally, the substrate 1, hole blocking layer 6, electron transport layer 7, and electron injection layer 8 are not layers essential to the organic electroluminescent element of the invention.

The substrate 1 serves as the support of the organic electroluminescent element, and a plate of quartz or glass, a metal plate, a metal foil, a plastic film or sheet, or the like is usually used. Preferred of these are glass plates and plates of transparent synthetic resins such as polyesters, polymethacrylates, polycarbonates, and polysulfones. It is preferred that the substrate should be made of a material having high gas-barrier properties, from the standpoint of rendering the organic electroluminescent element less apt to deteriorate due to the surrounding atmosphere. Because of this, when a material having low gas-barrier properties, such as a substrate made of, in particular, a synthetic resin, is used, it is preferred to reduce the gas-barrier properties by disposing, for example, a dense silicon oxide film on at least one surface of the substrate.

The anode 2 is an electrode which has the function of injecting holes into the layer located on the luminescent-layer side. The anode 2 is usually constituted of: a metal such as aluminum, gold, silver, nickel, palladium, or platinum; a metal oxide such as an oxide of indium and/or tin; a metal halide such as copper iodide; carbon black or an electroconductive polymer such as poly(3-methylthiophene), polypyrrole, or polyaniline; or the like. Usually, the anode 2 is frequently formed by a dry process such as, for example, sputtering or vacuum deposition. In the case where the anode 2 is formed using fine particles of a metal such as silver, fine particles of copper iodide or the like, carbon black, fine particles of an electroconductive metal oxide, fine particles of an electroconductive polymer, or the like, use can be made of a method in which such fine particles are dispersed in an appropriate binder resin solution and this dispersion is applied to a substrate 1 to form an anode 2. In the case of an electroconductive polymer, it is possible to form an anode 2 by directly forming a thin film on a substrate 1 through electrolytic polymerization or by applying the electroconductive polymer to a substrate 1 (*Appl. Phys. Lett.*, Vol. 60, p. 2711, 1992).

Although the anode 2 usually is of a single-layer structure, the anode 2 may be suitably made to have a multilayer structure. In the case where the anode has a multilayer structure, a different electroconductive material may be superposed on the first anode layer.

The thickness of the anode 2 may be determined according to the required transparency, the material of the anode, etc. When especially high transparency is required, a thickness which results in a visible-light transmittance of 60% or higher is preferred, and a thickness which results in a visible-light transmittance of 80% or higher is more preferred. The thickness of the anode 2 is generally 5 nm or larger, preferably 10 nm or larger, and is generally 1,000 nm or less, preferably 500 nm or less. On the other hand, when transparency is not required, the anode 2 may be made to have any desired thickness in accordance with the required strength, etc. In this case, the anode 2 may have the same thickness as the substrate 1.

It is preferred that the surface of the anode 2 should be subjected to a treatment with both ultraviolet rays and ozone or with an oxygen plasma, argon plasma, or the like before the formation of the hole injection/transport layer 10, thereby removing impurities present on the anode 2 and regulating the ionization potential thereof to improve the hole-injecting properties beforehand.

The hole injection/transport layer 10 has a multilayer structure composed of hole injection/transport layers 3 and 4. The hole injection/transport layer 10 is a layer which transports holes from the anode 2 to the luminescent layer 5, and is usually formed on the anode. The hole injection/transport layer 10 corresponds to the hole injection/transport layer A according to the invention described above. The hole injection/transport layers 3 and 4 are layers which inject and transport holes from the anode 2 to the luminescent layer 5; the hole injection/transport layer 3 corresponds to the layer La and layer La' described above, and the hole injection/transport layer 4 corresponds to the layer Lc and layer Lc' described above. Furthermore, the hole injection/transport layer 3 corresponds to a so-called hole injection layer, while the hole injection/transport layer 4 corresponds to a so-called hole transport layer.

The luminescent layer 5 is a layer having the following function. Upon application of an electric field between the pair of electrodes, holes are injected from the anode and electrons are injected from the cathode. The holes recombine with the electrons, and the luminescent layer 5 is excited thereby and luminesces. The luminescent layer 5 is a layer formed between the anode 2 and the cathode 9, and the luminescent layer 5 is usually formed on the hole injection/transport layer 10. The luminescent layer usually contains a luminescent material.

The luminescent material is not particularly limited, so long as the material emits light having desired wavelengths and does not lessen the effects of the invention. Known luminescent materials can be applied. The luminescent material may be either a fluorescent material or a phosphorescent material. Fluorescent materials in theory have a smaller excited-singlet-state energy gap than phosphorescent materials having the same luminescence wavelengths, and have an extremely short exciton life on the order of nanosecond. Consequently, the load to be imposed on the luminescent material is small, and the element is apt to have a prolonged working life. It is therefore preferred to use a fluorescent material when element life is especially important. In contrast, phosphorescent materials in theory are more effective in heightening the luminescent efficiency of the organic electroluminescent element than fluorescent materials. It is therefore preferred to use a phosphorescent material in applications where luminescent efficiency is especially important. One luminescent material may be used alone, or any desired two or more luminescent materials may be used in combination in any desired proportion. Specifically, for example, use may be made of a method in which a fluorescent material is used for blue and a phosphorescent material is used for green and red. In the case where the luminescent layer 5 is to be formed by a wet film formation method, it is preferred to, for example, improve beforehand the solubility in solvents by introducing an oleophilic substituent, e.g., an alkyl group, that lowers the symmetry and stiffness of the molecule of the luminescent material.

Examples of the fluorescent material include the following materials.

Examples of fluorescent materials which give blue luminescence (blue fluorescent materials) include naphthalene, perylene, pyrene, anthracene, coumarin, chrysene, p-bis(2-phenylethenyl)benzene, arylamines, and derivatives of these. Preferred of these are anthracene, chrysene, pyrene, arylamines, derivatives thereof, and the like.

Examples of fluorescent materials which give green luminescence (green fluorescent materials) include quinacridone derivatives, coumarin derivatives, aluminum complexes such as $Al(C_9H_6NO)_3$, and derivatives of these.

Examples of fluorescent materials which give yellow luminescence (yellow fluorescent materials) include rubrene, perimidone derivatives, and derivatives of these. Examples of fluorescent materials which give red luminescence (red fluorescent materials) include DCM (4-(dicyanomethylene)-2-methyl-6-(p-dimethylaminostyryl)-4H-pyran) compounds, benzopyran derivatives, rhodamine derivatives, benzothioxanthene derivatives, azabenzothioxanthene, and derivatives of these.

It is preferred that the arylamine derivatives which give blue fluorescence should be compounds represented by the following formula (VII), from the standpoints of the luminescent efficiency and working life of the element, etc.

[Chem. 25]

(VII)

(In the formula, $Ar^{41}$ represents a fused aromatic ring group which has 10-40 nuclear carbon atoms and may have been substituted, and $Ar^{42}$ and $Ar^{43}$ each independently represent a monovalent aromatic ring group which has 6-40 carbon atoms and may have been substituted. Symbol p represents an integer of 1-4.)

Examples of the $Ar^{41}$ include groups of naphthalene, phenanthrene, fluoranthene, anthracene, pyrene, perylene, coronene, chrysene, picene, diphenylanthracene, fluorene, triphenylene, rubicene, benzanthracene, phenylanthracene, bisanthracene, dianthracenylbenzene, dibenzanthracene, or the like which have a free valence of p. Examples of the $Ar^{42}$ and $Ar^{43}$ include phenyl. Symbol p represents an integer of 1-4.

Examples of arylamine derivatives which are preferred as fluorescent materials are shown below, but the fluorescent material according to the invention should not be construed as being limited to the following examples. In the following formulae, "Me" represents methyl and "Et" represents ethyl.

[Chem. 26]

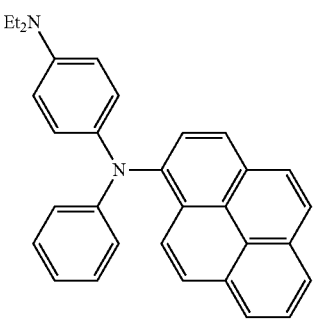

97
-continued
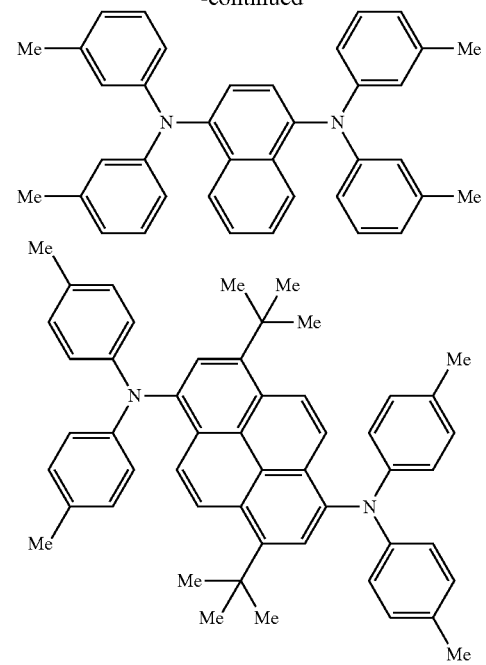
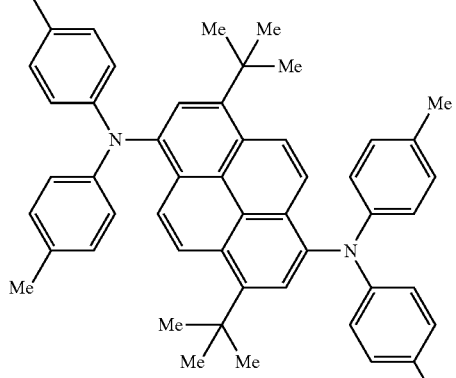
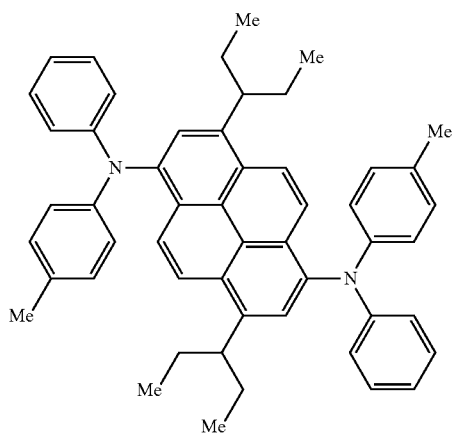
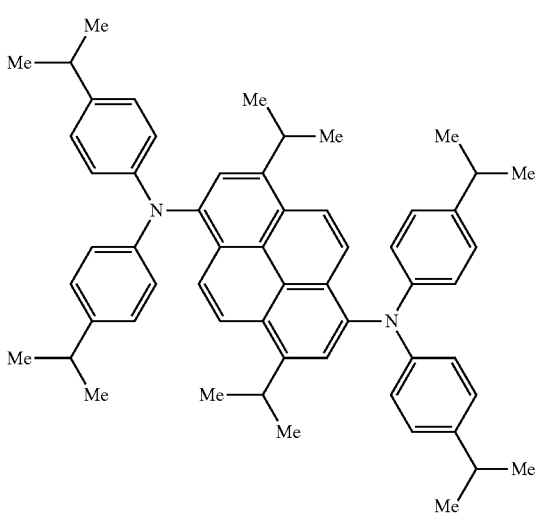
98
-continued
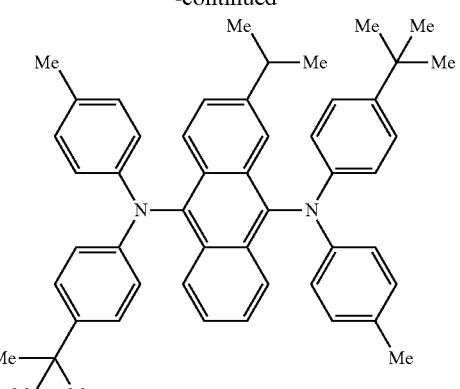
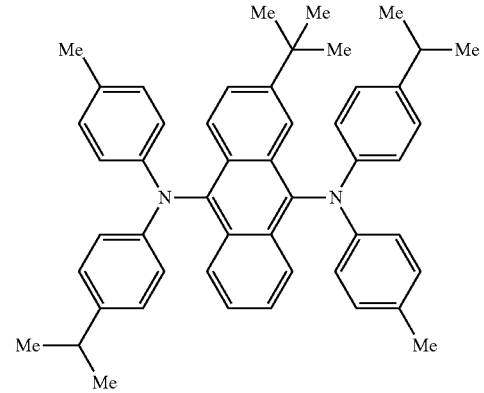
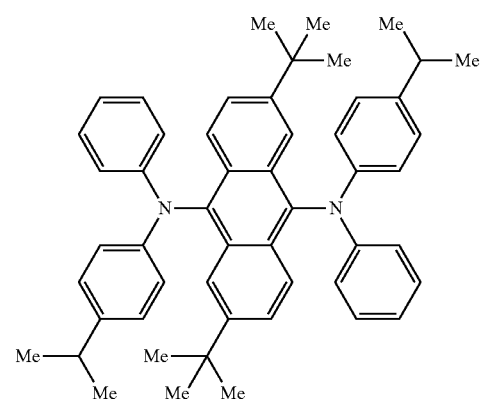
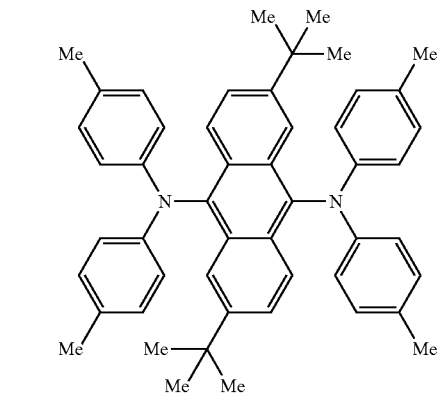

99
-continued
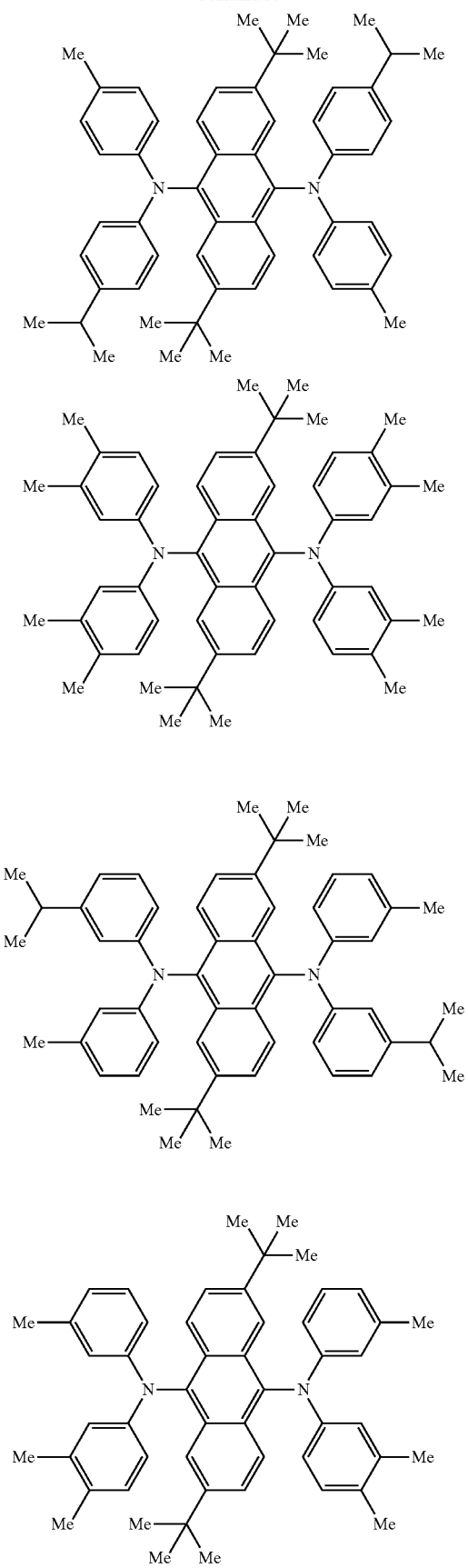
100
-continued
[Chem. 27]
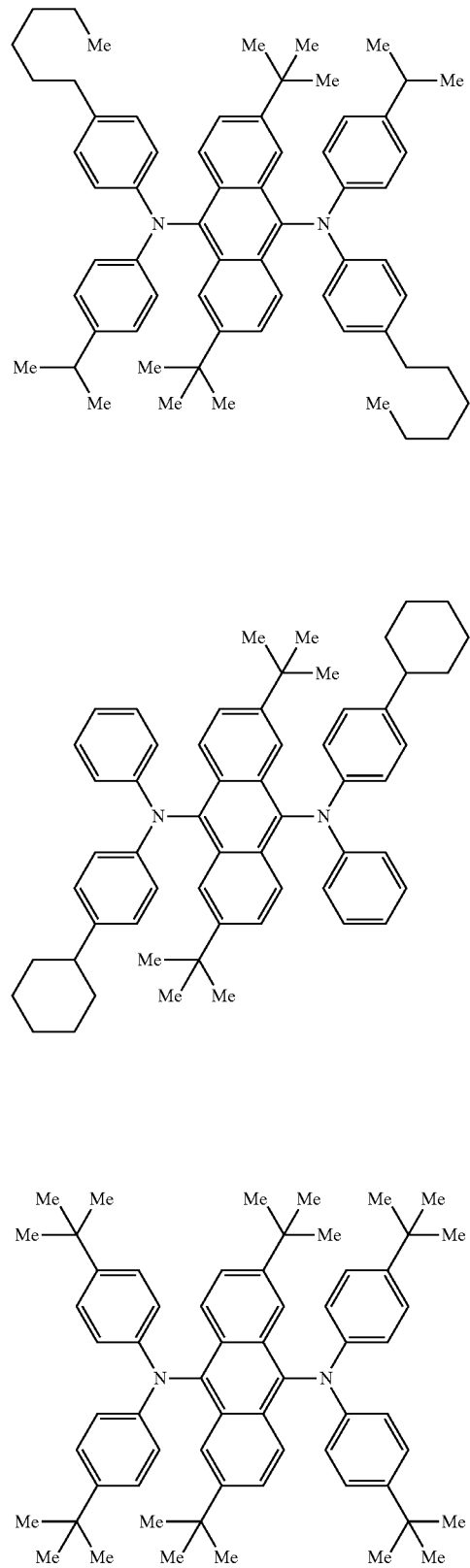

| 101 | 102 |
|---|---|
| -continued | -continued |
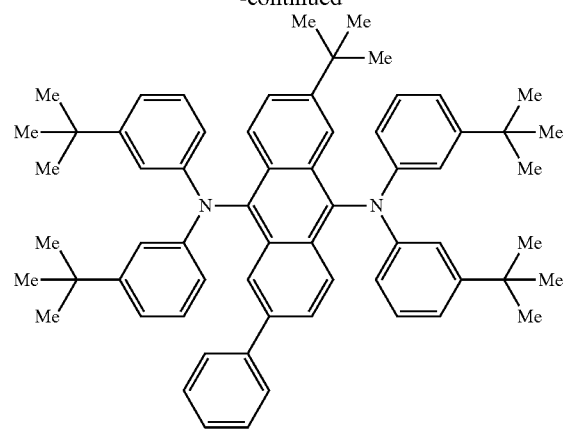
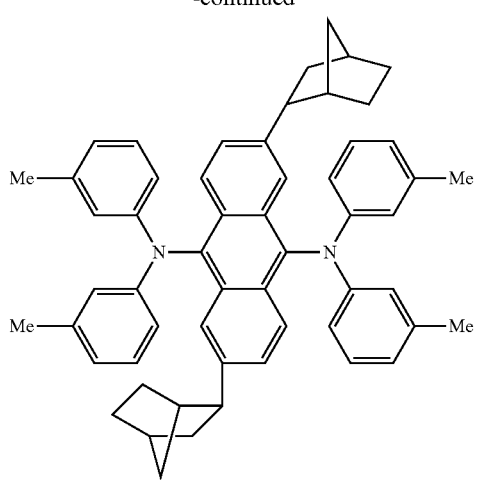
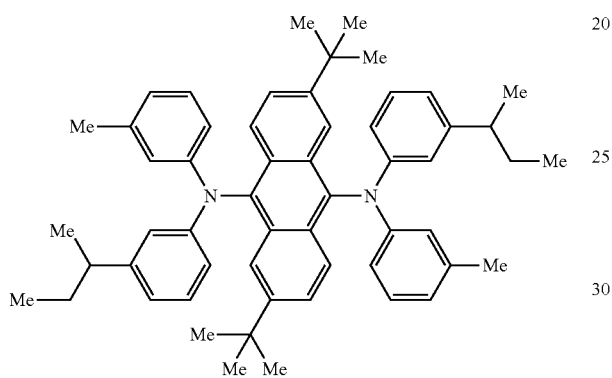
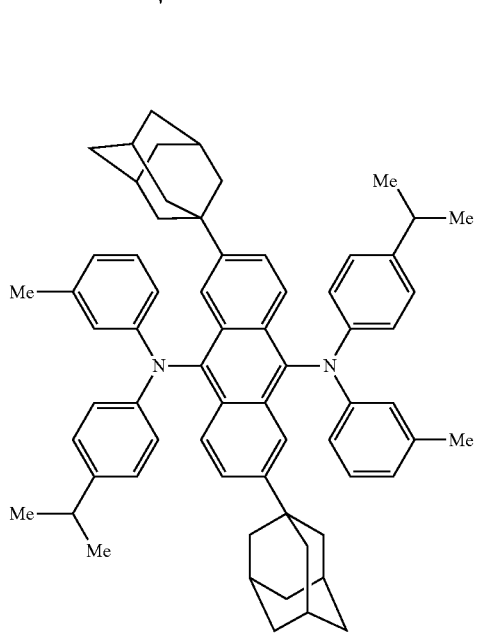
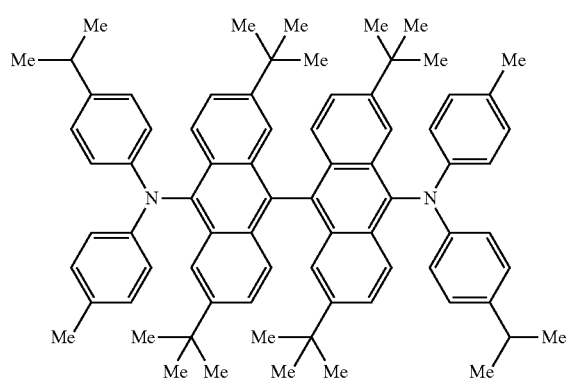
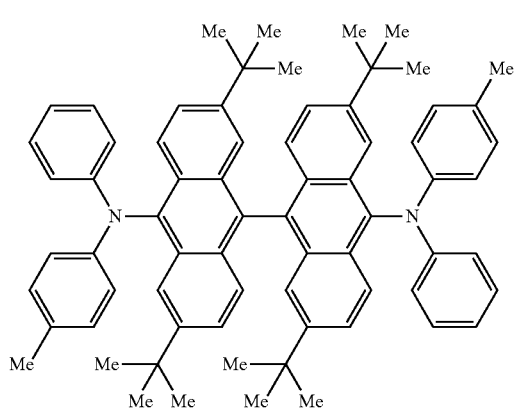
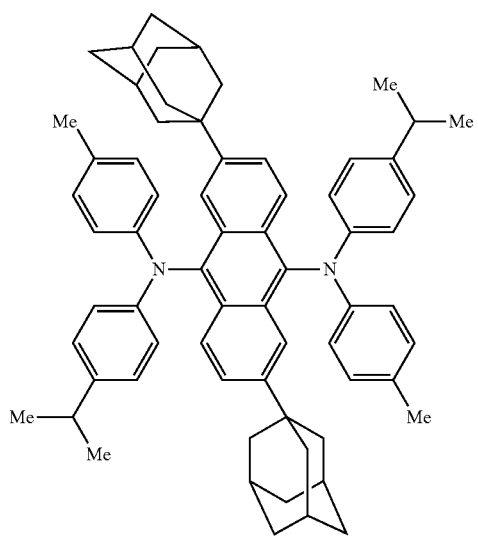

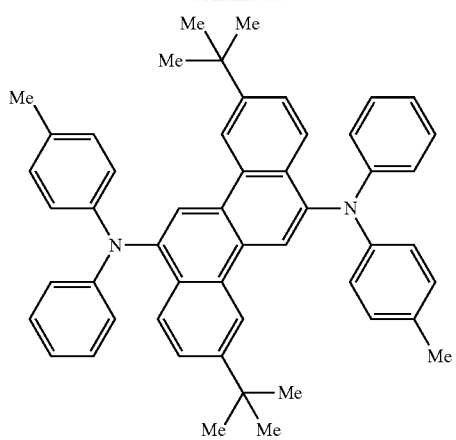
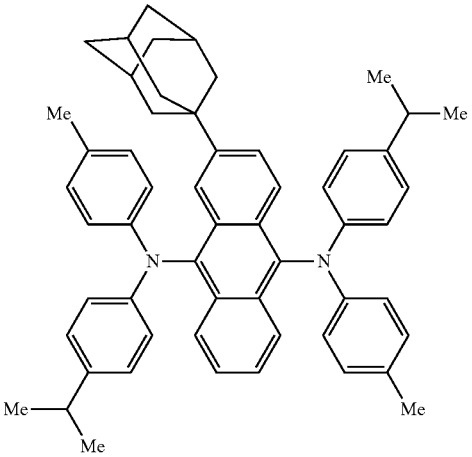
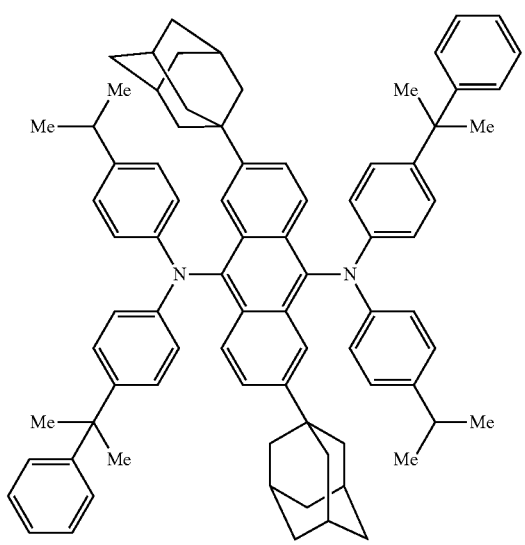
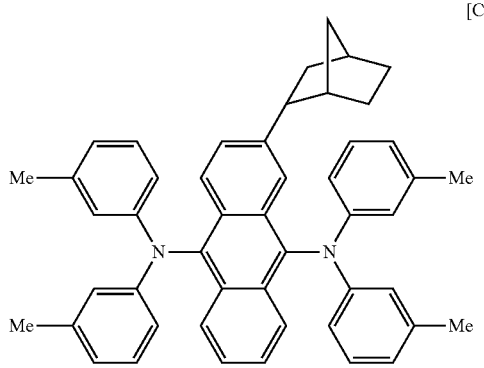
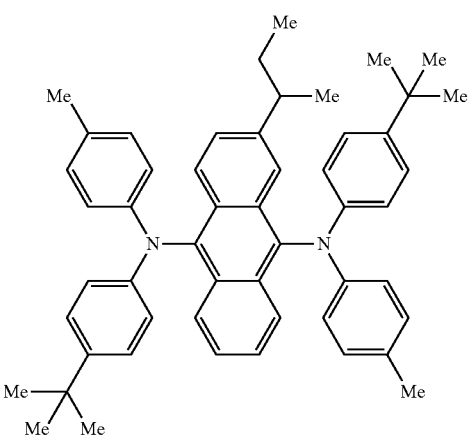
[Chem. 28]

105
-continued
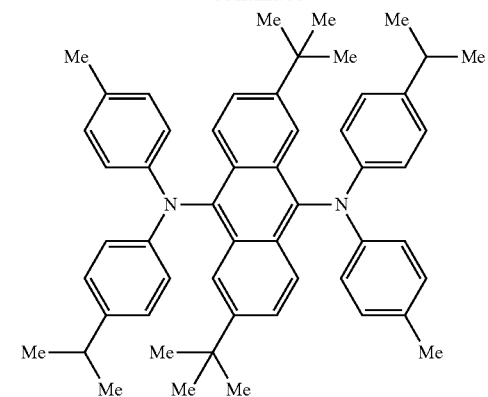
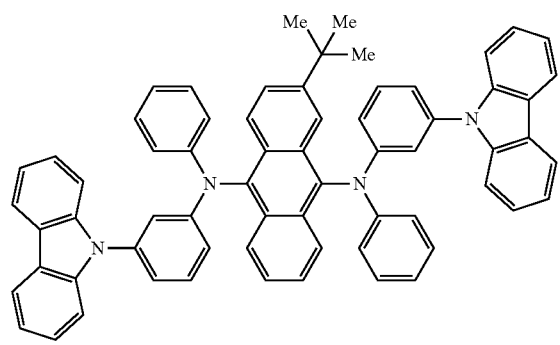
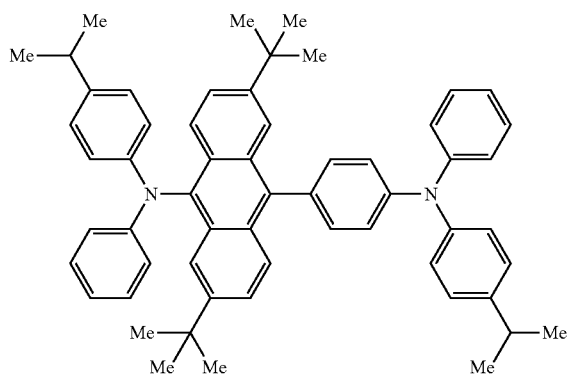
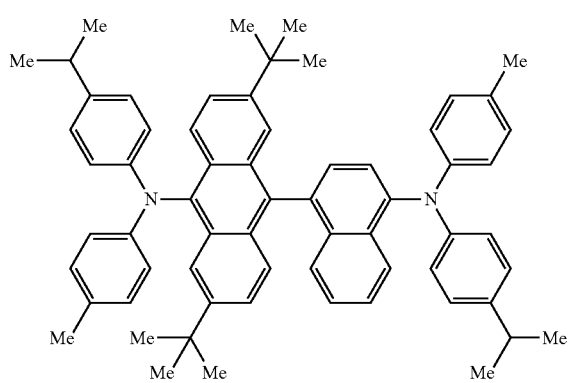
106
-continued
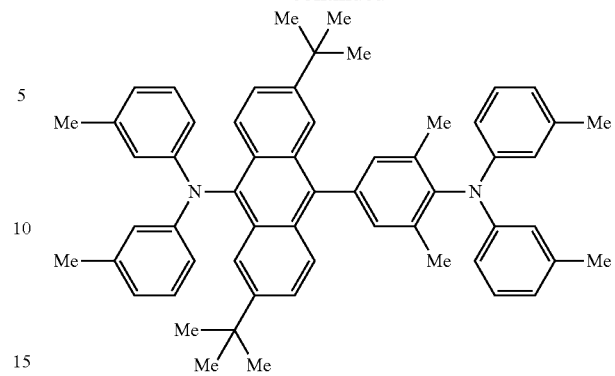
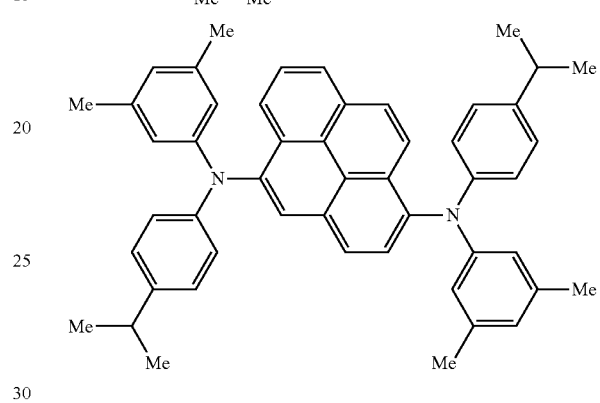
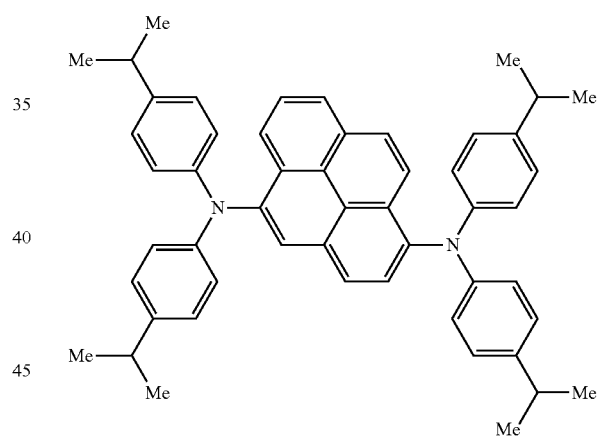
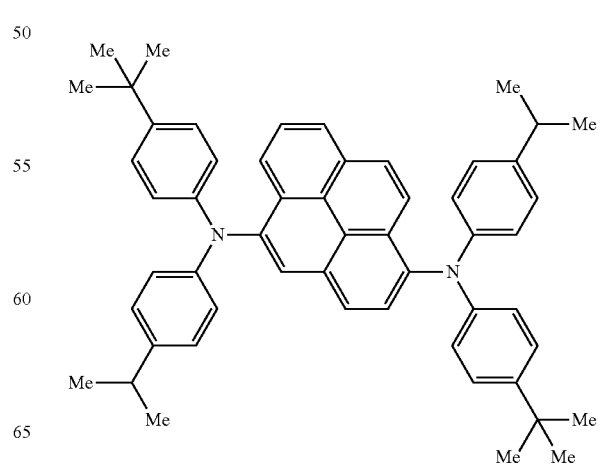

107
-continued
[Chem. 29]
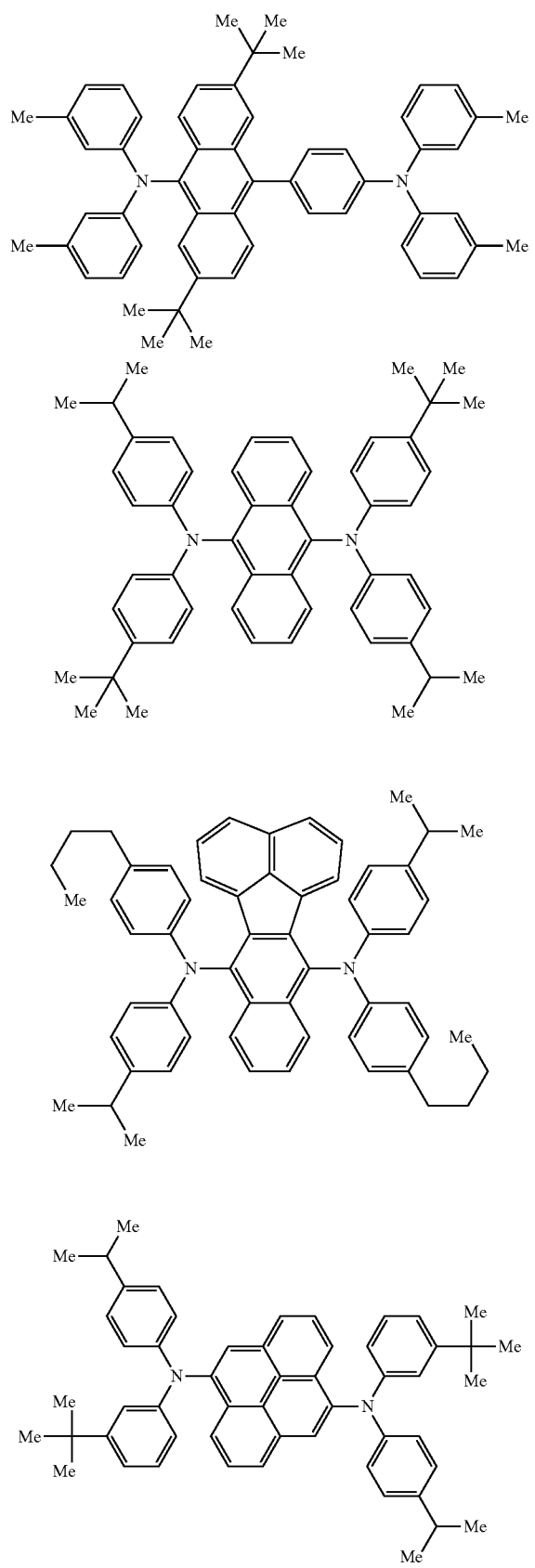
108
-continued
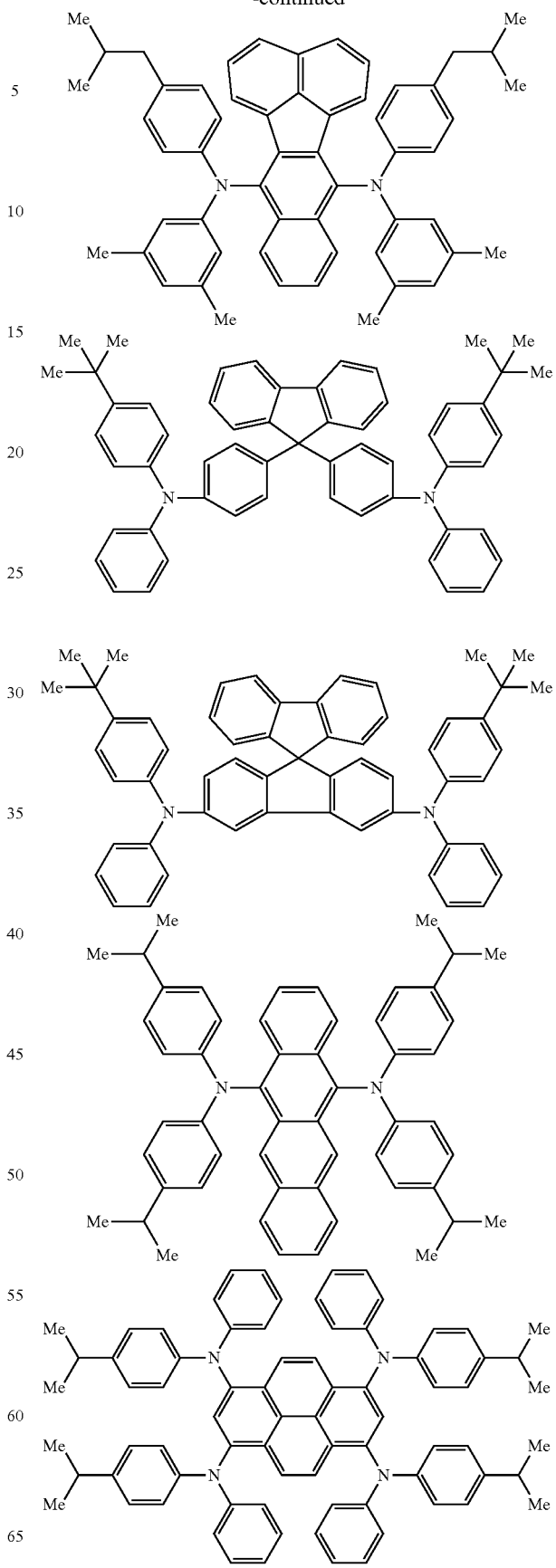

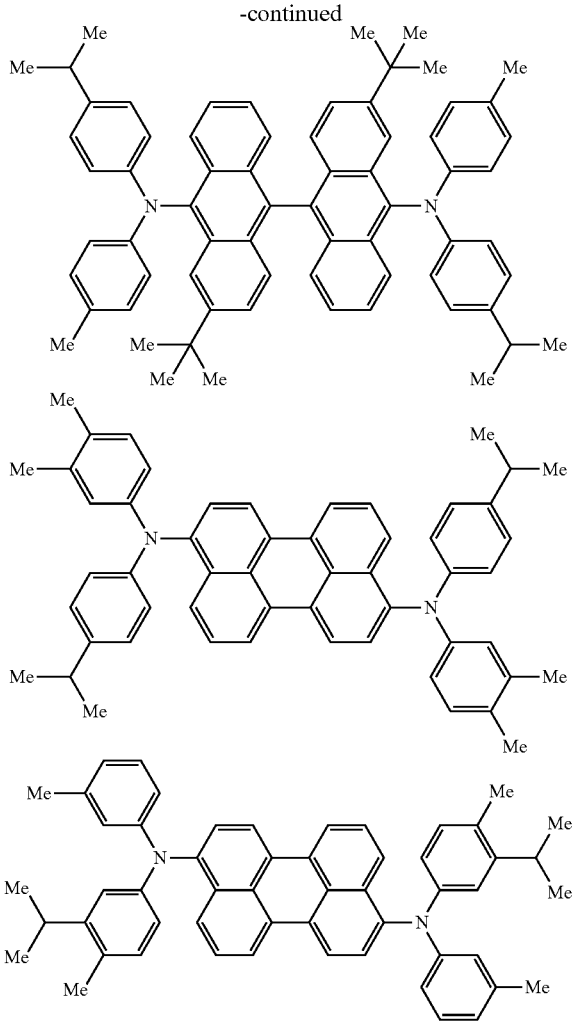

On the other hand, examples of the phosphorescent material include organometallic complexes which contain a metal selected from Groups 7 to 11 of the long-form periodic table (hereinafter, the term "periodic table" means the long-form periodic table unless otherwise indicated). Preferred examples of the metal selected from Groups 7 to 11 of the periodic table include ruthenium, rhodium, palladium, silver, rhenium, osmium, iridium, platinum, and gold. Of these, iridium and platinum are preferred because it is easy to regulate the color of the luminescence.

The ligands of the organometallic complexes preferably are ligands each configured of a (hetero)aryl group and, linked thereto, pyridine, pyrazole, phenanthroline, or the like, such as a (hetero)arylpyridine ligand and a (hetero)arylpyrazole ligand. Especially preferred are a phenylpyridine ligand and a phenylpyrazole ligand. The term (hetero)aryl herein represents an aryl group or a heteroaryl group.

Specific examples of preferred phosphorescent materials include phenylpyridine complexes such as tris(2-phenylpyridine)iridium, tris(2-phenylpyridine)ruthenium, tris(2-phenylpyridine)palladium, bis(2-phenylpyridine)platinum, tris(2-phenylpyridine)osmium, and tris(2-phenylpyridine)rhenium and porphyrin complexes such as octaethylplatinum porphyrin, octaphenylplatinum porphyrin, octaethylpalladium porphyrin, and octaphenylpalladium porphyrin.

Especially preferred examples of phosphorescent organometallic complexes as phosphorescent materials include compounds represented by the following formula (VIII) or (IX).

$$ML_{(q-j)}L'_j \quad (VIII)$$

(In formula (VIII), M represents a metal, and q represents the valence of the M. L and L' each represent a bidentate. Symbol j represents an integer of 0-2.)

[Chem. 30]

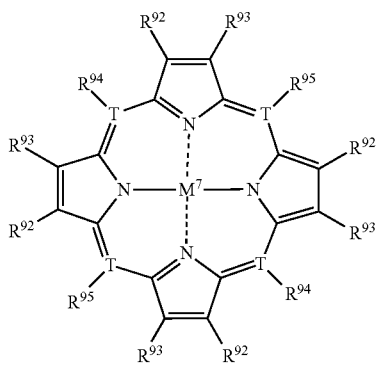

(IX)

(In formula (IX), $M^7$ represents a metal, and T represents a carbon atom or a nitrogen atom. $R^{92}$ to $R^{95}$ each independently represent any desired substituent. However, when T is a nitrogen atom, $R^{94}$ and $R^{95}$ are absent.)

First, the compounds represented by formula (VIII) are explained.

In formula (VIII), M represents any desired metal and q represents the valence of the M. Preferred examples of the M include the metals enumerated above as examples of the metal selected from Groups 7 to 11 of the periodic table. L and L' each represent a bidentate. Symbol j represents an integer of 0-2.

The bidentate L in formula (VIII) represents a ligand having a partial structure of the following formula (X).

[Chem. 31]

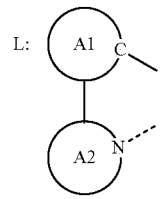

(X)

(In formula (X), ring A1 represents an aromatic ring group which may have a substituent, and ring A2 represents a nitrogen-containing heteroaromatic ring group which may have a substituent.)

Examples of the aromatic hydrocarbon ring group represented by ring A1 include a 5- or 6-membered monocycle having a free valence of 2 or a fused ring which is composed of two to five 5- or 6-membered rings fused together and which has a free valence of 2. Specific examples thereof include a benzene ring, naphthalene ring, anthracene ring, phenanthrene ring, perylene ring, tetracene ring, pyrene ring, benzpyrene ring, chrysene ring, triphenylene ring, acenaphthene ring, fluoranthene ring, and fluorene ring which each have a free valence of 2.

Examples of the heteroaromatic ring group represented by ring A1 include a 5- or 6-membered monocycle having a free valence of 1 or 2 or a fused ring which is composed of two to four 5- or 6-membered rings fused together and which has a free valence of 1 or 2. Specific examples thereof include a furan ring, benzofuran ring, thiophene ring, benzothiophene ring, pyrrole ring, pyrazole ring, imidazole ring, oxadiazole ring, indole ring, carbazole ring, pyrroloimidazole ring, pyrrolopyrazole ring, pyrrolopyrrole ring, thienopyrrole ring, thienothiophene ring, furopyrrole ring, furofuran ring, thienofuran ring, benzisooxazole ring, benzisothiazole ring, benzimidazole ring, pyridine ring, pyrazine ring, pyridazine ring, pyrimidine ring, triazine ring, quinoline ring, isoquinoline ring, cinnoline ring, quinoxaline ring, phenanthridine ring, benzimidazole ring, perimidine ring, quinazoline ring, quinazolinone ring, and azulene ring which each have a free valence of 1.

Examples of the nitrogen-containing heteroaromatic ring group represented by ring A2 include a 5- or 6-membered monocycle having a free valence of 1 or 2 or a fused ring which is composed of two to four 5- or 6-membered rings fused together and which has a free valence of 1 or 2. Specific examples thereof include a pyrrole ring, pyrazole ring, imidazole ring, oxadiazole ring, indole ring, carbazole ring, pyrroloimidazole ring, pyrrolopyrazole ring, pyrrolopyrrole ring, thienopyrrole ring, furopyrrole ring, thienofuran ring, benzisooxazole ring, benzisothiazole ring, benzimidazole ring, pyridine ring, pyrazine ring, pyridazine ring, pyrimidine ring, triazine ring, quinoline ring, isoquinoline ring, quinoxaline ring, phenanthridine ring, benzimidazole ring, perimidine ring, quinazoline ring, and quinazolinone ring which each have a free valence of 1 or 2.

Examples of the substituent which may be possessed by each of ring A1 and ring A2 include halogen atoms, alkyl groups, alkenyl groups, alkoxycarbonyl groups, alkoxy groups, aryloxy groups, dialkylamino groups, diarylamino groups, carbazolyl, acyl groups, haloalkyl groups, cyano, and aromatic hydrocarbon ring groups.

In formula (VIII), the bidentate L' represents a ligand having any of the partial structures of the following formulae. In the following formulae, "Ph" represents phenyl.

L':

[Chem. 32]

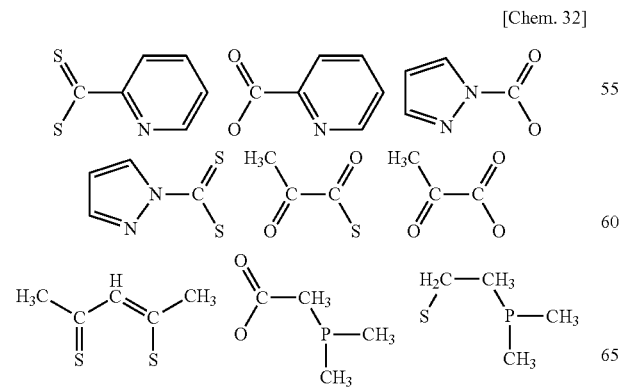

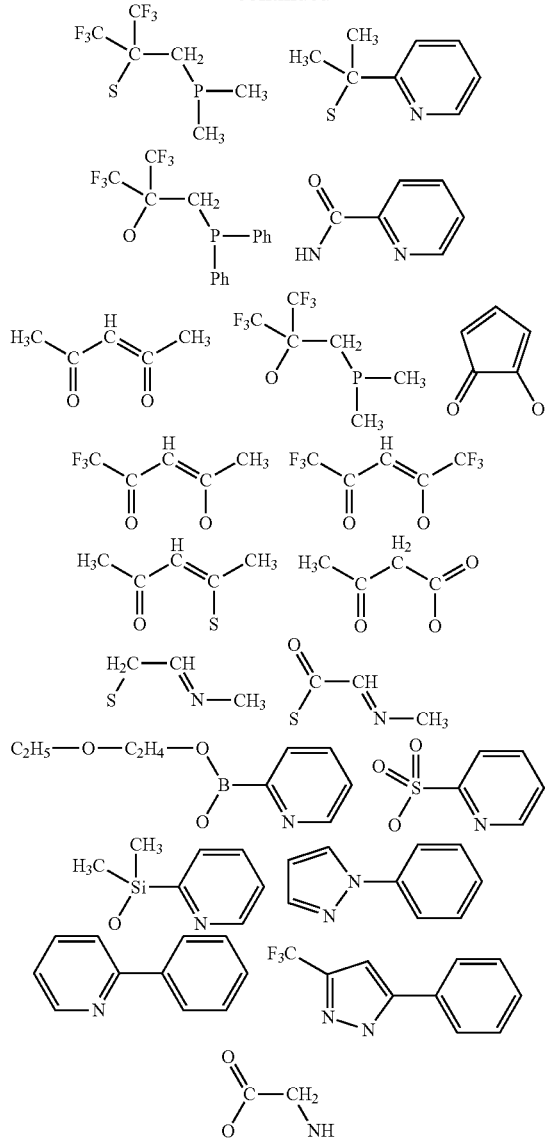

More preferred examples of L' among these are the following ligands, from the standpoint of the stability of the complex.

[Chem. 33]

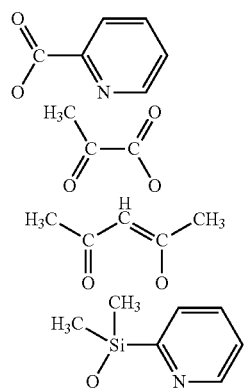

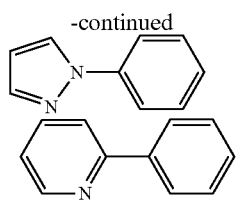

Especially preferred examples of the compounds represented by formula (VIII) include compounds represented by the following formulae (VIIIa) to (VIIIc).

[Chem. 34]

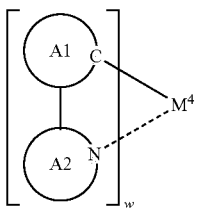

(VIIIa)

(In formula (VIIIa), $M^4$ represents the same metal as M; w represents the valence of the $M^4$; ring A1 represents an aromatic ring group which may have a substituent; and ring A2 represents a nitrogen-containing heteroaromatic ring group which may have a substituent.)

[Chem. 35]

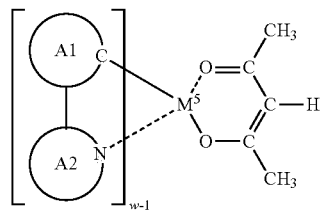

(VIIIb)

(In formula (VIIIb), $M^5$ represents the same metal as M; w represents the valence of the $M^5$; ring A1 represents an aromatic ring group which may have a substituent; and ring A2 represents a nitrogen-containing heteroaromatic ring group which may have a substituent.)

[Chem. 36]

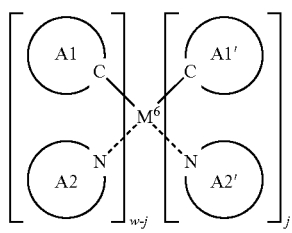

(VIIIc)

(In formula (VIIIc), $M^6$ represents the same metal as M; w represents the valence of the $M^6$; j represents an integer of 0-2; ring A1 and ring A1' each independently represent an aromatic ring group which may have a substituent; and ring A2 and ring A2' each independently represent a nitrogen-containing heteroaromatic ring group which may have a substituent.)

In formulae (VIIIa) to (VIIIc), preferred examples of the aromatic ring groups represented by ring A1 and ring A1' include phenyl, biphenyl, naphthyl, anthryl, thienyl, furyl, benzothienyl, benzofuryl, pyridyl, quinolyl, isoquinolyl, and carbazolyl.

In formulae (VIIIa) to (VIIIc), preferred examples of the nitrogen-containing heteroaromatic ring groups represented by ring A2 and ring A2' include pyridyl, pyrimidyl, pyrazyl, triazyl, benzothiazole, benzoxazole, benzimidazole, quinolyl, isoquinolyl, quinoxalyl, and phenanthridyl.

In formulae (VIIIa) to (VIIIc), examples of the substituents which may be possessed by the aromatic ring groups represented by ring A1 and ring A1' and by the nitrogen-containing heteroaromatic ring groups represented by ring A2 and ring A2' include halogen atoms, alkyl groups, alkenyl groups, alkoxycarbonyl groups, alkoxy groups, aryloxy groups, dialkylamino groups, diarylamino groups, carbazolyl, acyl groups, haloalkyl groups, cyano, and (hetero)aryl groups. Preferred of these are halogen atoms, alkyl groups, alkoxy groups, diarylamino groups, carbazolyl, haloalkyl groups, cyano, and (hetero)aryl groups. These substituents may be linked to each other to form a ring. An example is the case in which a substituent possessed by ring A1 is bonded to a substituent possessed by ring A2 or a substituent possessed by ring A1' is bonded to a substituent possessed by ring A2', thereby forming one fused ring. Examples of such a fused ring include a 7,8-benzoquinoline group.

Preferred examples of $M^4$ to $M^6$ in formulae (VIIIa) to (VIIIc) include ruthenium, rhodium, palladium, silver, rhenium, osmium, iridium, platinum, and gold.

Specific examples of the organometallic complexes represented by formulae (VIII) and (VIIIa) to (VIIIc) are shown below. However, the organometallic complexes should not be construed as being limited to the following compounds.

[Chem.37]

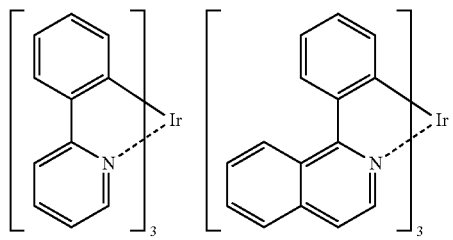

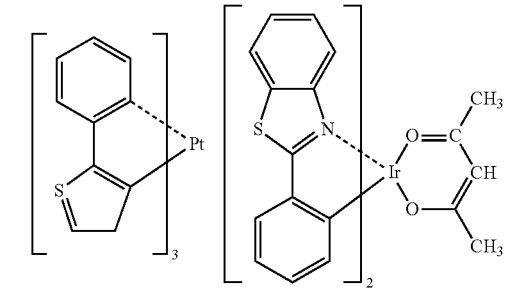

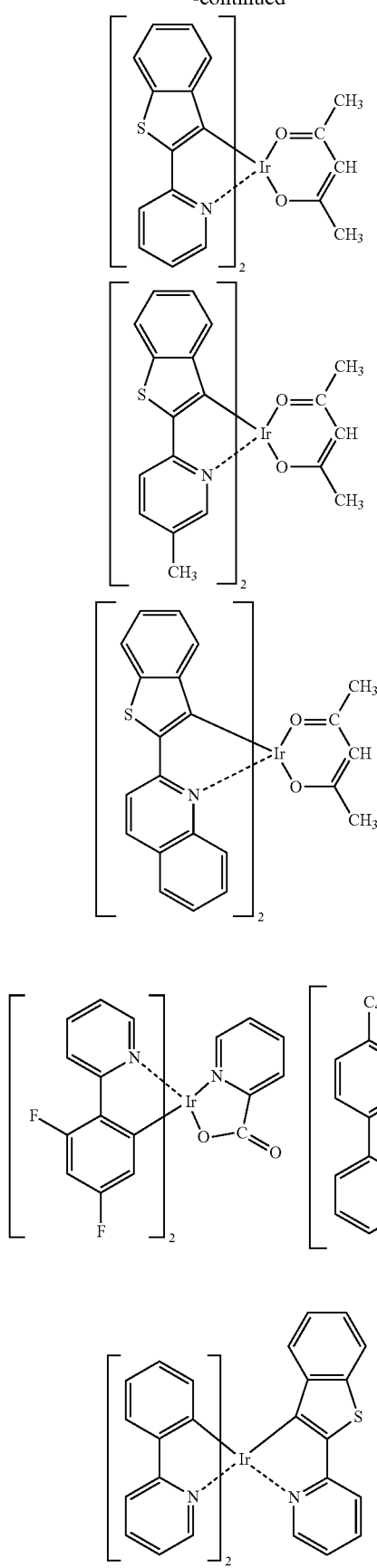
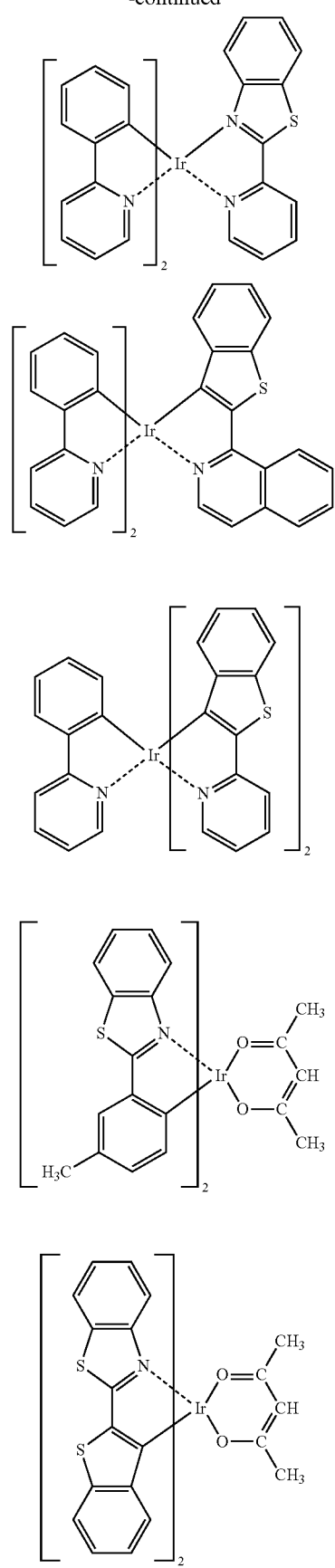

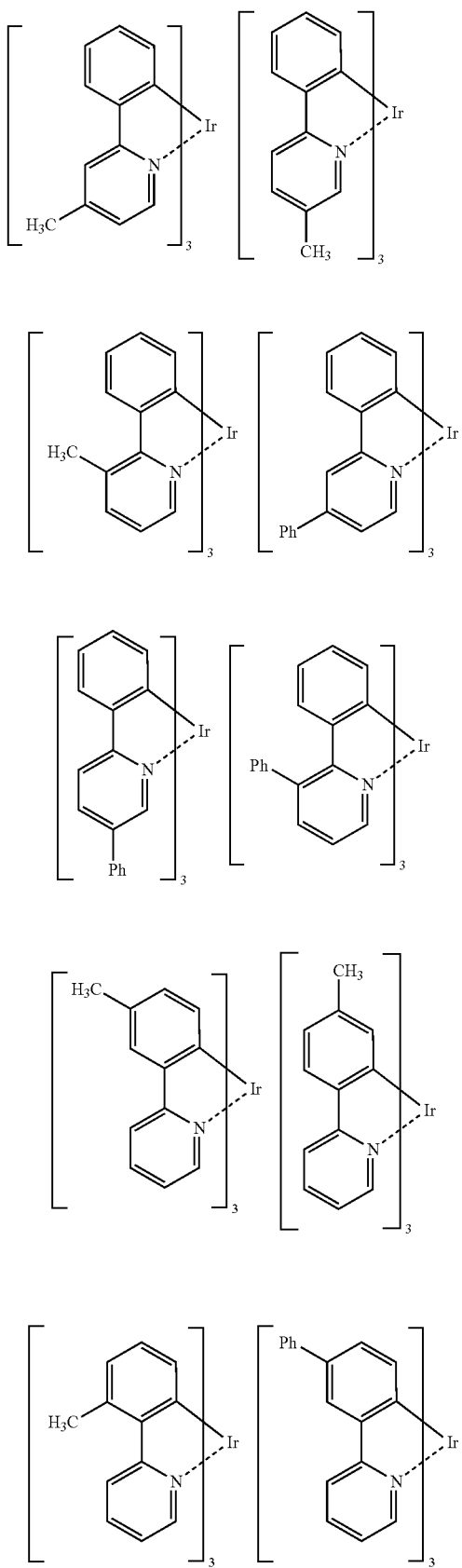

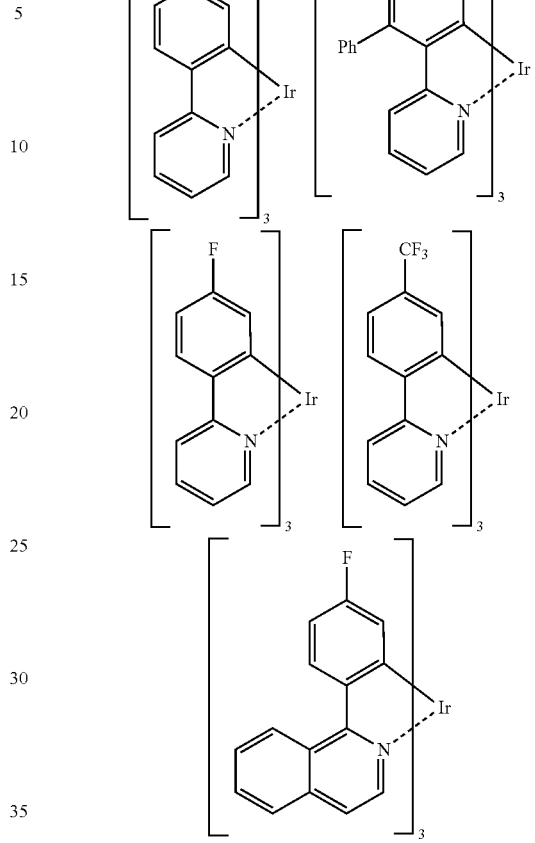

Especially preferred of the organometallic complexes represented by formula (VIII) are compounds which have, as the ligand L and/or L', a 2-arylpyridine-based ligand, i.e., a 2-arylpyridine, a 2-arylpyridine having any desired substituent, or a 2-arylpyridine to which any desired group has been fused. The compounds described in International Publication WO 2005/019373 can also be used as a luminescent material.

Next, the compounds represented by formula (IX) are explained.

In formula (IX), $M^7$ represents a metal. Examples of the $M^7$ include the metals enumerated above as examples of the metal selected from Groups 7 to 11 of the periodic table. Preferred examples, among these, include ruthenium, rhodium, palladium, silver, rhenium, osmium, iridium, platinum, and gold. Especially preferred examples thereof include divalent metals such as platinum and palladium.

In formula (IX), $R^{92}$ to $R^{95}$ each independently represent any desired substituent.

$R^{92}$ to $R^{95}$ each independently represent a hydrogen atom, a halogen atom, an alkyl, aralkyl, alkenyl, cyano, amino, acyl, alkoxycarbonyl, carboxyl, alkoxy, alkylamino, aralkylamino, haloalkyl, hydroxy, or aryloxy group, or an aromatic ring group. $R^{92}$ and $R^{93}$ may further have a substituent. When $R^{92}$ and $R^{93}$ further have a substituent, there are no particular limitations on the kind thereof and the substituent may be any desired group. Two or more of the $R^{92}$ and $R^{93}$ groups may be linked to each other to form a ring.

In formula (IX), T represents a carbon atom or a nitrogen atom. When T is a carbon atom, $R^{94}$ and $R^{95}$ each independently represent a substituent which is the same as any of the substituents enumerated above as examples of $R^{92}$ and $R^{93}$. When T is a nitrogen atom, $R^{94}$ and $R^{95}$ are absent.

Specific examples (T-1 and T-10 to T-15) of the organometallic complexes represented by formula (IX) are shown below. However, the organometallic complexes should not be construed as being limited to the following examples. In the following chemical formulae, "Me" represents methyl and Et represents ethyl.

[Chem. 39]

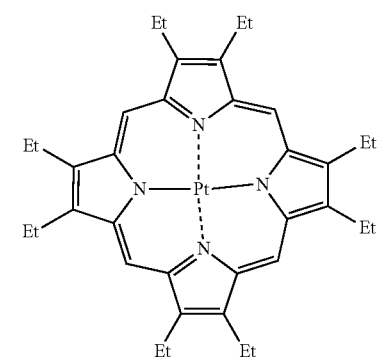
(T-1)

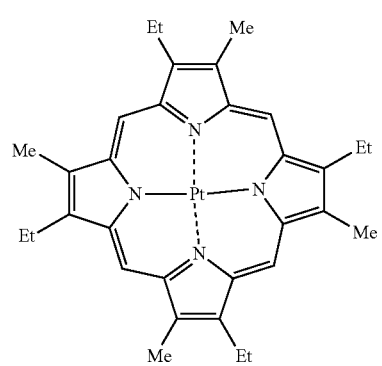
(T-10)

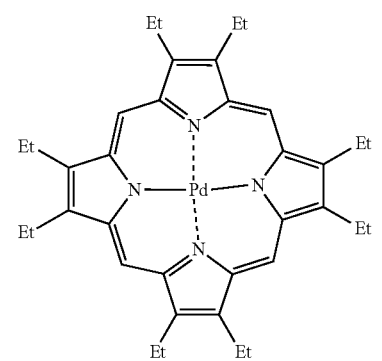
(T-11)

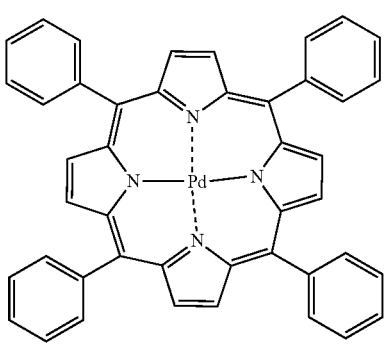
(T-12)

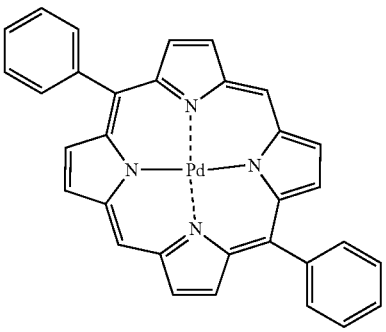
(T-13)

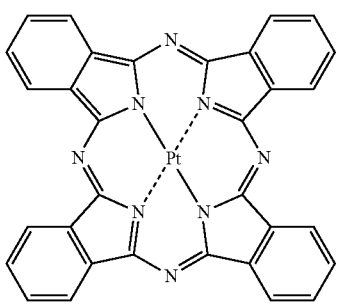
(T-14)

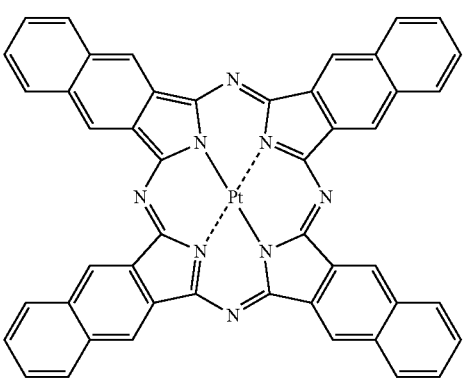
(T-15)

The luminescent material may have any desired molecular weight unless the effects of the invention are considerably lessened thereby. However, it is preferred that the molecular weight thereof should be high, from the standpoints that this luminescent material has high heat resistance, is less apt to generate a gas, and gives a film of good quality and that the organic electroluminescent element is less apt to suffer a change in morphology due to migration or the like. Meanwhile, it is preferred that the molecular weight thereof should be low, from the standpoint that this luminescent material is easy to purify and easy to dissolve in solvents. Consequently, the molecular weight of the luminescent material is preferably 10,000 or less, more preferably 5,000 or less, especially preferably 4,000 or less, most preferably 3,000 or less, and is preferably 100 or higher, more preferably 200 or higher, especially preferably 300 or higher, most preferably 400 or higher.

It is preferred that in the luminescent layer, the luminescent material should receive charges or energy from a host material having charge-transporting properties and luminesce. The host material having charge-transporting properties (charge-transporting compound) is not particularly limited so long as this material has the property of transporting charges (holes or electrons) and does not lessen the effects of the invention, and known luminescent materials can be applied. One charge-transporting compound may be used alone, or any desired two or more charge-transporting compounds may be used in combination in any desired proportion.

As the charge-transporting compound, use can be made, for example, of compounds which have conventionally been used in the luminescent layers of organic electroluminescent elements. Especially preferred are the compounds which are in use as host materials in luminescent layers.

Examples of the charge-transporting compound include compounds such as aromatic amine compounds, phthalocyanine compounds, porphyrin compounds, thiophene compounds (oligothiophene compounds, polythiophene compounds, and benzylphenyl compounds), compounds including tertiary amines linked by a fluorene group, hydrazone compounds, silazane compounds, silanamine compounds, phosphamine compounds, quinacridone compounds, and triphenylene compounds. Examples thereof further include electron-transporting compounds such as anthracene compounds, pyrene compounds, carbazole compounds, pyridine compounds, phenanthroline compounds, oxadiazole compounds, silole compounds, quinoline compounds, triazine compounds, and imidazole compounds.

Furthermore, the following compounds can be advantageously used: aromatic diamines which include two or more tertiary amines and in which two or more fused aromatic rings have been bonded as substituents to the nitrogen atoms, which are represented, for example, by 4,4'-bis[N-(1-naphthyl)-N-phenylamino]biphenyl (JP-A-5-234681); aromatic amine compounds having a starburst structure, such as 4,4',4"-tris(1-naphthylphenylamino)triphenylamine (*J. Lumin.*, Vol. 72-74, p. 985, 1997); aromatic amine compounds including the tetramer of triphenylamine (*Chem. Commun.*, p. 2175, 1996); fluorene compounds such as 2,2',7,7'-tetrakis(diphenylamino)-9,9'-spirobifluorene (*Synth. Metals*, Vol. 91, p. 209, 1997); and carbazole compounds such as 4,4'-N,N'-dicarbazolebiphenyl (CBP). Besides these, examples of the charge-transporting compound include oxadiazole compounds such as 2-(4-biphenylyl)-5-(p-tert-butylphenyl)-1,3,4-oxadiazole (tBu-PBD) and 2,5-bis(1-naphthyl)-1,3,4-oxadiazole (BND), silole compounds such as 2,5-bis(6'-(2',2"-bipyridyl))-1,1-dimethyl-3,4-diphenylsilole (PyPySPyPy), and phenanthroline compounds such as bathophenanthroline (BPhen) and 2,9-dimethyl-4,7-diphenyl-1,10-phenanthroline (BCP, bathocuproine).

Preferred specific examples of the charge-transporting compound are shown below. However, the invention should not be construed as being limited to the following examples.

[Chem.40]

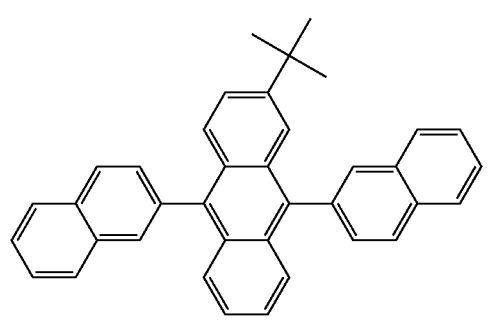

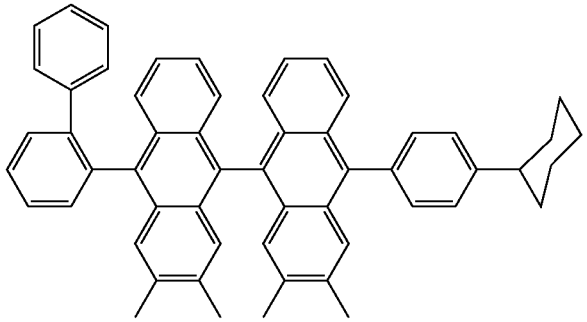

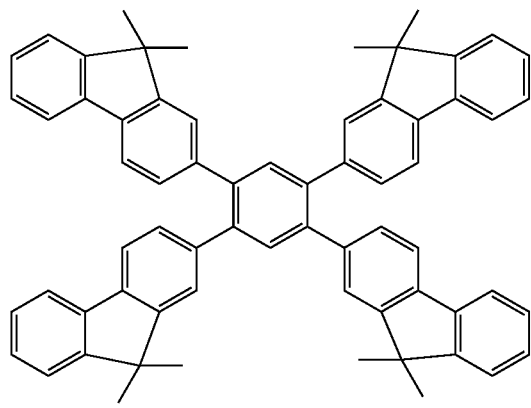

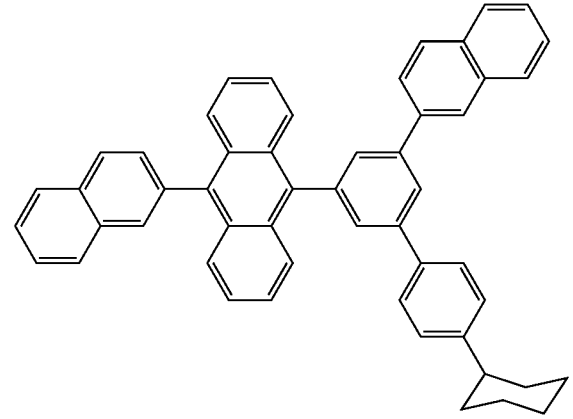

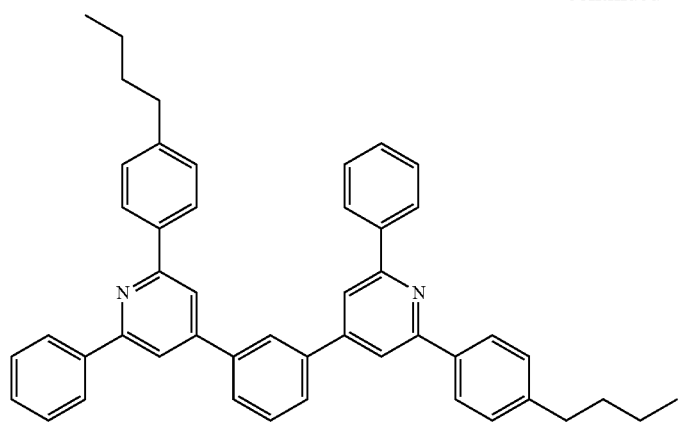
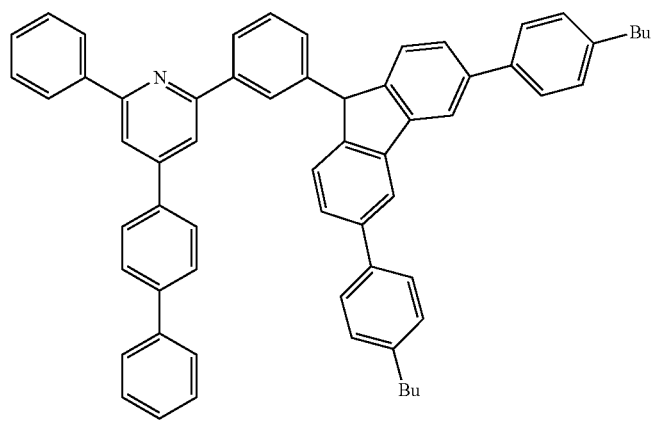
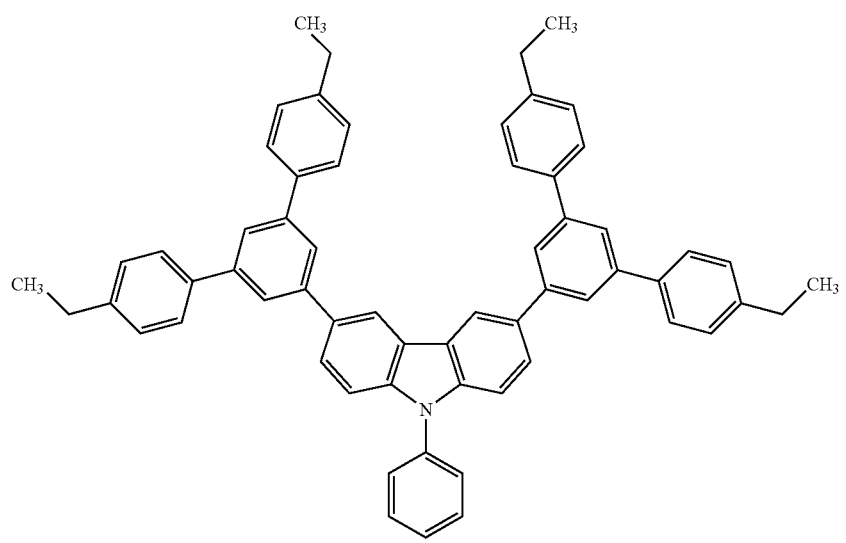

-continued

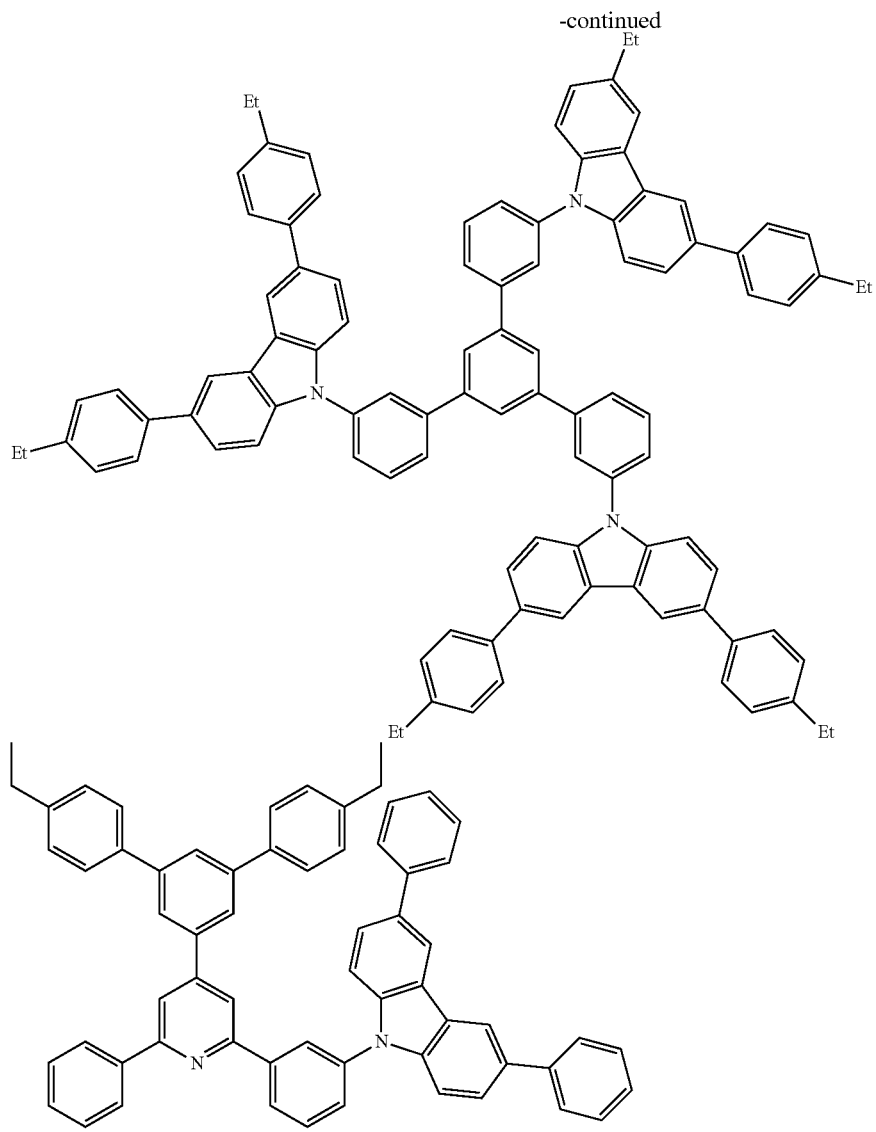

The charge-transporting compound may have any desired molecular weight unless the effects of the invention are considerably lessened thereby. However, it is preferred that the molecular weight thereof should be high, from the standpoints that this charge-transporting compound is high in glass transition temperature, melting point, decomposition temperature, etc., has excellent heat resistance, and gives a film of good quality, that the organic electroluminescent element is less apt to suffer a change in morphology due to migration or the like, and that impurity generation or the like due to pyrolysis is less apt to occur. Meanwhile, it is preferred that the molecular weight of the charge-transporting compound should be low, from the standpoint that this compound is easy to purify and easy to dissolve in solvents and has excellent film-forming properties. Consequently, the molecular weight of the charge-transporting compound is preferably 10,000 or less, more preferably 5,000 or less, especially preferably 4,000 or less, most preferably 3,000 or less, and is preferably 100 or higher, more preferably 200 or higher, especially preferably 300 or higher, most preferably 400 or higher.

Methods for forming the luminescent layer 5 are not particularly limited unless the effects of the invention are lessened, and either a wet film formation method or a vacuum deposition method may be used. However, a wet film formation method is preferred because of the excellent film-forming properties, and spin coating and ink-jet printing are more preferred.

In the case where the luminescent layer 5 is formed by a wet film formation method, the layer may be formed usually in the same manner as in the case of forming the hole injection/transport layer A by a wet film formation method, except that a composition for luminescent-layer formation prepared by mixing materials for forming the luminescent layer 5 with a solvent in which the materials are soluble (solvent for luminescent-layer formation) is used in place of the composition for forming each of the layers of the hole injection/transport layer A. Conditions for film formation, such as temperature and relative humidity during film formation, drying methods and conditions, etc. are the same as in the formation of the hole injection/transport layer A by a wet film formation method. In the case where the luminescent layer is to be formed by a wet film formation method, it is preferred to use materials having a low molecular weight in the composition for luminescent-layer formation.

The solvent to be used for forming the luminescent layer by a wet film formation method is not particularly limited so long as the solvent is a liquid in which the luminescent material, charge-transporting compound, etc. dissolve satisfactorily. With respect to solubility in the solvent, it is preferred that the luminescent material and the charge-transporting compound each dissolve in the solvent in an amount of 0.01% by weight or more at 25° C. and 1 atm. The solubility thereof in the solvent is more preferably 0.05% by weight or more, especially preferably 0.1% by weight or more. The boiling point of the solvent at 1 atm is preferably 80° C. or higher, more preferably 100° C. or higher, especially preferably 120° C. or higher, and is preferably 270° C. or lower, more preferably 250° C. or lower, especially preferably 230° C. or lower, because the solvent having such a boiling point vaporizes at an appropriate rate from the liquid film formed by application and, hence, it is easy to obtain an even film.

Examples of the solvent include the solvents enumerated above with regard to the formation of the hole injection/transport layer A, i.e., ether solvents, ester solvents, aromatic hydrocarbon solvents, halogenated solvents, and amide solvents, and further include alkane solvents, aliphatic alcohol solvents, alicyclic alcohol solvents, aliphatic ketone solvents, and alicyclic ketone solvents. Especially preferred of these are alkane solvents and aromatic hydrocarbon solvents. One of these solvents may be used alone, or any desired two or more thereof may be used in combination in any desired proportion.

The amount of the solvent to be used is not limited unless the effects of the invention are considerably lessened. However, it is preferred that the total solvent content in the composition for luminescent-layer formation should be high, from the standpoint that this composition has low viscosity and hence satisfactory applicability. Meanwhile, it is preferred that the total solvent content should be low, from the standpoint that it is easy to form a thick film. Specifically, the total solvent content therein is preferably 10% by weight or higher, more preferably 50% by weight or higher, especially preferably 80% by weight or higher, and is preferably 99.95% by weight or less, more preferably 99.90% by weight or less, especially preferably 99.80% by weight or less.

The composition for luminescent-layer formation may contain ingredients other than the luminescent material, charge-transporting compound, and solvent described above, unless the effects of the invention are considerably lessened thereby. Examples of the other ingredients include binder resins and applicability improvers, such as leveling agents and antifoamers.

It is preferred that the concentration on solid basis of the luminescent material, hole-transporting compound, electron-transporting compound, etc. in the composition for luminescent-layer formation should be low, from the standpoint that it is easy to obtain an even film thickness. Meanwhile, it is preferred that the concentration thereof should be high, from the standpoint of forming a film having few defects. Consequently, the concentration thereof is preferably 0.01-70% by weight.

In the case where the luminescent layer 5 is formed by a vacuum deposition method, the luminescent layer 5 can be formed usually in the following manner. One or more constituent materials for the luminescent layer 5 (e.g., the luminescent material and charge-transporting compound described above) are placed in one or more crucibles disposed in a vacuum vessel (when two or more materials are used, the materials are usually placed in respective crucibles), and the vacuum vessel is evacuated to about $10^{-4}$ Pa with a vacuum pump. Thereafter, the crucible is heated (when two or more materials are used, each crucible is usually heated) to vaporize the material within the crucible while regulating the vaporization amount thereof (when two or more materials are used, the materials are usually vaporized while independently regulating the vaporization amounts of the respective materials) to form a luminescent layer 5 on the hole injection/transport layer 4 which has been placed so as to face the crucible(s). Incidentally, in the case where two or more materials are used, it is possible to use a method in which a mixture of these materials is placed in a crucible and is heated and vaporized to form a luminescent layer 5.

The degree of vacuum during the deposition is not limited unless the effects of the invention are considerably lessened thereby. The degree of vacuum during the deposition is generally $0.1 \times 10^{-6}$ Torr ($0.13 \times 10^{-4}$ Pa) to $9.0 \times 10^{-6}$ Torr ($12.0 \times 10^{-4}$ Pa). The rate of deposition is not limited unless the effects of the invention are considerably lessened thereby. However, the rate of deposition is generally 0.1-5.0 Å/sec. The film deposition temperature during the deposition is not limited unless the effects of the invention are considerably lessened thereby. However, the deposition is conducted at a deposition temperature of preferably 10-50° C.

The luminescent layer 5 may have any desired thickness unless the effects of the invention are considerably lessened thereby. However, a large thickness is preferred from the standpoint of forming a film having few defects. Meanwhile, a small thickness is preferred from the standpoint that it is easy to attain a low operating voltage. Consequently, the thickness thereof is preferably 3 nm or larger, more preferably 5 nm or larger, and is usually preferably 200 nm or less, more preferably 100 nm or less.

The hole blocking layer 6 is a layer which, between the electrodes placed in an electric field, not only serves to prevent the holes that have moved from the anode from reaching the cathode but also has the function of efficiently transporting, toward the luminescent layer, the electrons which have been injected from the cathode. Although the hole blocking layer 6 is not an essential layer in the organic electroluminescent element of the invention, it is preferred to use this layer from the standpoint that this layer makes it easy to improve the luminescent efficiency by preventing holes from moving beyond the luminescent layer. When a hole blocking layer 6 is used, the hole blocking layer 6 is usually formed between the luminescent layer 5 and the cathode 9. In the case where there is the electron transport layer 7 which will be described later, the hole blocking layer 6 is formed between the luminescent layer 5 and the electron transport layer 7. In the case where there is the electron injection layer 8 which will be described later, the hole blocking layer 6 is formed between the luminescent layer 5 and the electron injection layer 8.

Examples of the properties required of the material which constitutes the hole blocking layer 6 include: to have a high electron mobility and a low hole mobility; to have a large energy gap (difference between HOMO and LUMO); and to have a high excited triplet energy level (T1). Examples of materials for the hole blocking layer which satisfy such requirements include metal complexes such as mixed-ligand complexes, e.g., bis(2-methyl-8-quinolinolato)(phenolato) aluminum and bis(2-methyl-8-quinolinolato)(triphenylsilanolato)aluminum, and dinuclear metal complexes, e.g., bis (2-methyl-8-quinolato)aluminum-µ-oxobis(2-methyl-8-quinolilato)aluminum, styryl compounds such as distyrylbiphenyl derivatives (JP-A-11-242996), triazole derivatives such as 3-(4-biphenylyl)-4-phenyl-5-(4-tert-butylphenyl)-1,2,4-triazole (JP-A-7-41759), and phenanthroline derivatives such as bathocuproine (JP-A-10-79297). Furthermore, the compound having at least one pyridine ring substituted at the 2-, 4-, and 6-positions which is described in International Publication WO 2005/022962 is also preferred as a material for the hole blocking layer 6. One material for the hole blocking layer 6 may be used alone, or any desired two or more materials therefor may be used in combination in any desired proportion.

Methods for forming the hole blocking layer 6 are not particularly limited, and either a vacuum deposition method or a wet film formation method may be used. The thickness of the hole blocking layer 6 is generally 0.3 nm or larger, preferably 0.5 nm or larger, and is generally 100 nm or less, preferably 50 nm or less.

The electron transport layer 7 is a layer which, between the electrodes placed in an electric field, has the function of efficiently transporting, toward the luminescent layer 5, the electrons that have been injected from the cathode 9. Although the electron transport layer 7 is not an essential layer in the organic electroluminescent element of the invention, it is preferred to use this layer from the standpoint of improving the luminescent efficiency of the element. When an electron transport layer 7 is used, the electron transport layer 7 is usually formed between the luminescent layer 5 and the cathode 9. In the case where there is the hole blocking layer 6 described above, the electron transport layer 7 is formed between the hole blocking layer 6 and the cathode 9. In the case where there is the electron injection layer 8 which will be described later, the electron transport layer 7 is formed between the luminescent layer 5 and the hole injection layer 8.

It is usually preferred that the electron-transporting compound to be used in the electron transport layer 7 should be a compound which is high in the efficiency of electron injection thereinto from the cathode 9 or electron injection layer 8 and which can efficiently transport the injected electrons. Examples of the electron-transporting compound include metal complexes such as an aluminum complex of 8-hydroxyquinoline (JP-A-59-194393), metal complexes of 10-hydroxybenzo[h]quinoline, oxadiazole derivatives, distyrylbiphenyl derivatives, silole derivatives, 3-hydroxyflavone metal complexes, 5-hydroxyflavone metal complexes, benzoxazole metal complexes, benzthiazole metal complexes, trisbenzimidazolylbenzene (U.S. Pat. No. 5,645,948), quinoxaline compounds (JP-A-6-207169), phenanthroline derivatives (JP-A-5-331459), 2-t-butyl-9,10-N,N'-dicyanoanthraquinonediimine, n-type hydrogenated amorphous silicon carbide, n-type zinc sulfide, and n-type zinc selenide. One electron-transporting compound may be used alone, or any desired two or more electron-transporting compounds may be used in combination in any desired proportion.

Methods for forming the electron transport layer 7 are not particularly limited, and either a vacuum deposition method or a wet film formation method may be used. The thickness of the electron transport layer 9 is generally 1 nm or larger, preferably 5 nm or larger, and is generally 300 nm or less, preferably 100 nm or less.

The electron injection layer 8 is a layer which has the function of efficiently injecting, into the luminescent layer 5, the electrons that have been injected from the cathode 9. Although the electron injection layer 8 is not an essential layer in the organic electroluminescent element of the invention, it is preferred to use this layer from the standpoint that electron injection into the luminescent layer can be efficiently conducted therewith. When an electron injection layer 8 is used, the electron injection layer 8 is usually formed between the luminescent layer 5 and the cathode 9. In the case where there is the electron transport layer 7 described above, the electron injection layer 8 is formed between the electron transport layer 7 and the cathode 9.

It is preferred that the material to be used for forming the electron injection layer 8 should be a metal having a low work function. Specifically, use is made, for example, of an alkali metal such as sodium or cesium or an alkaline earth metal such as barium or calcium. It is usually preferred that the thickness of the electron injection layer 8 in this case should be 0.1-5 nm.

Furthermore, a material obtained by doping an organic electron transport compound represented by a nitrogen-containing heterocyclic compound, such as bathophenanthroline, or by a metal complex, such as an aluminum complex of 8-hydroxyquinoline, with an alkali metal such as sodium, potassium, cesium, lithium, or rubidium (described in JP-A-10-270171, JP-A-2002-100478, JP-A-2002-100482, etc.) is preferred because use of this material is apt to give an electron injection layer which has improved electron-injecting/transporting properties and excellent film quality. The thickness of the electron injection layer 10 in this case is preferably 5 nm or larger, more preferably 10 nm or larger, and is preferably 200 nm or less, more preferably 100 nm or less. One material for forming the electron injection layer 8 may be used alone, or any desired two or more materials therefor may be used in combination in any desired proportion.

Methods for forming the electron injection layer 8 are not particularly limited, and either a vacuum deposition method or a wet film formation method may be used. The cathode 9 is a layer which has the function of injecting electrons into the layer that adjoins the cathode 9 on the side thereof facing the luminescent layer 5.

The cathode 9 is the electrode formed on the opposite side of the hole injection/transport layer 10, luminescent layer 5, etc. to the anode 2. In the case where there is the electron transport layer 7 described above, the cathode 9 is formed on the opposite side of the electron transport layer 7 to the anode 2. In the case where there is the electron injection layer 8 described above, the cathode 9 is formed on the opposite side of the electron injection layer 8 to the anode 2.

As the material of the cathode 9, it is possible to use the materials usable for the anode 2. However, it is preferred to use a metal having a low work function, from the standpoint of efficiently injecting electrons. For example, use is made of a metal such as tin, magnesium, indium, calcium, aluminum, or silver, an alloy of these, or the like. Specific examples thereof include alloy electrodes having a low work function, such as magnesium-silver alloys, magnesium-indium alloys, and aluminum-lithium alloys. One material for the cathode 9 may be used alone, or any desired two or more materials therefor may be used in combination in any desired proportion. The thickness of the cathode 9 is usually preferably in the same range as the thickness of the anode 2.

From the standpoint of the stability of the element, it is preferred that a layer of a metal which has a high work function and is stable to the air should be superposed on the cathode 9 constituted of a metal having a low work function, thereby protecting the cathode 9. Examples of the metal to be superposed include metals such as aluminum, silver, copper, nickel, chromium, gold, and platinum.

The organic electroluminescent element of the invention may further have other layers unless the effects of the invention are considerably lessened thereby. Namely, the element may have any of the optional layers described above, between the anode 2 and the cathode 9. The optional layers described above may have been omitted. It is also possible to modify the layer configuration explained above so that the constituent elements other than the substrate are superposed in the reverse order. Specifically, for example, in the case of the layer configuration shown in FIG. 1, the constituent elements other than the substrate may be disposed on the substrate in the order of: the cathode 9, electron injection layer 8, electron transport layer 7, hole blocking layer 6, luminescent layer 5, hole injection/transport layer 10 (hole injection/transport layers 3 and 4), and anode 2.

Furthermore, the constituent elements other than the substrate may be superposed between two substrates, at least one of which has transparency. Thus, an organic electroluminescent element of the invention can be configured.

The organic electroluminescent element of the invention can be configured so as to have a structure constituted of a stack of stages (luminescent units) each composed of the constituent elements of an organic electroluminescent element other than the substrate (i.e., a structure composed of a plurality of stacked luminescent units). In this case, when a carrier generation layer (CGL) made of, for example, vanadium pentoxide ($V_2O_5$) is disposed in place of the interfacial layers located between the stages (i.e., between the luminescent units) (when the anode is ITO and the cathode is aluminum, the interfacial layers are these two layers), then the barrier between the stages is reduced. This configuration is preferred from the standpoints of luminescent efficiency and operating voltage.

The organic electroluminescent element of the invention may be used as a single organic electroluminescent element, or may be applied to a configuration in which a plurality of organic electroluminescent elements have been disposed in an array arrangement. The organic electroluminescent element may also be applied to a configuration in which anodes and cathodes have been disposed in an X-Y matrix arrangement. Furthermore, each of the layers which constitute the organic electroluminescent element may contain materials or ingredients other than the materials or ingredients described above, unless the effects of the invention are considerably lessened thereby.

The organic electroluminescent element of the invention can be used in organic electroluminescent devices and the like. Examples of the organic electroluminescent devices include organic electroluminescent display devices and organic EL illuminators. Namely, example of the organic electroluminescent device of the invention are a display device and an illuminator which employ the organic electroluminescent element of the invention described above. The organic electroluminescent element of the invention can be used in an organic electroluminescent device by a method such as that described in *Yūki EL Disupurei* (Ohmsha, Ltd., published on Aug. 20, 2004, written by TOKITO Shizuo, ADACHI Chihaya, and MURATA Hideyuki).

From the standpoint of facilitating a reduction in operating voltage, it is preferred that the organic electroluminescent device of the invention should have two or more organic electroluminescent elements which differ from each other in the color of luminescence, and that at least one of the organic electroluminescent elements should be the organic electroluminescent element of the invention or be an organic electroluminescent element having a layer formed by a wet film formation method using the composition of the invention for organic electroluminescent elements. It is more preferred that all of the organic electroluminescent elements each should be the organic electroluminescent element of the invention or be an organic electroluminescent element having a layer formed by a wet film formation method using the composition of the invention for organic electroluminescent elements. Furthermore, from the standpoints of production cost, etc., it is preferred in the organic electroluminescent device of the invention that any two or more of the hole injection/transport layers possessed by the two or more organic electroluminescent elements should have the same composition. In other words, it is preferred that two or more of the hole injection/transport layers respectively possessed by the two or more organic electroluminescent elements should have the same composition.

EXAMPLES

The invention will be explained below in more detail by reference to Examples, but the invention should not be construed as being limited to the following Examples unless the invention departs from the spirit thereof.

Example 1

An organic electroluminescent element was produced in the following manner.

A coated substrate obtained by depositing a transparent conductive film of indium-tin oxide (ITO) on a glass substrate 1 by sputtering was subjected to patterning into stripes having a width of 2 mm using ordinary photolithography and etching with hydrochloric acid to form an anode 2. The patterned ITO substrate was cleaned by subjecting the substrate to ultrasonic cleaning with an aqueous surfactant solution, rinsing with ultrapure water, ultrasonic cleaning with ultrapure water, and rinsing with ultrapure water in this order, subsequently dried by bringing the cleaned substrate into contact with compressed air, and then subjected to ultraviolet/ozone cleaning.

Next, a coating fluid for hole injection/transport layer 3 formation was prepared, the coating fluid containing the arylamine polymer represented by the following structural formula (HIT-1), 4-isopropyl-4'-methyldiphenyliodonium tetrakis(pentafluorophenyl)borate, which is represented by structural formula (A1), and ethyl benzoate. This coating fluid was applied on the anode 2 by spin coating under the following conditions to form a hole injection/transport layer 3 having a thickness of 30 nm.

[Chem. 41]

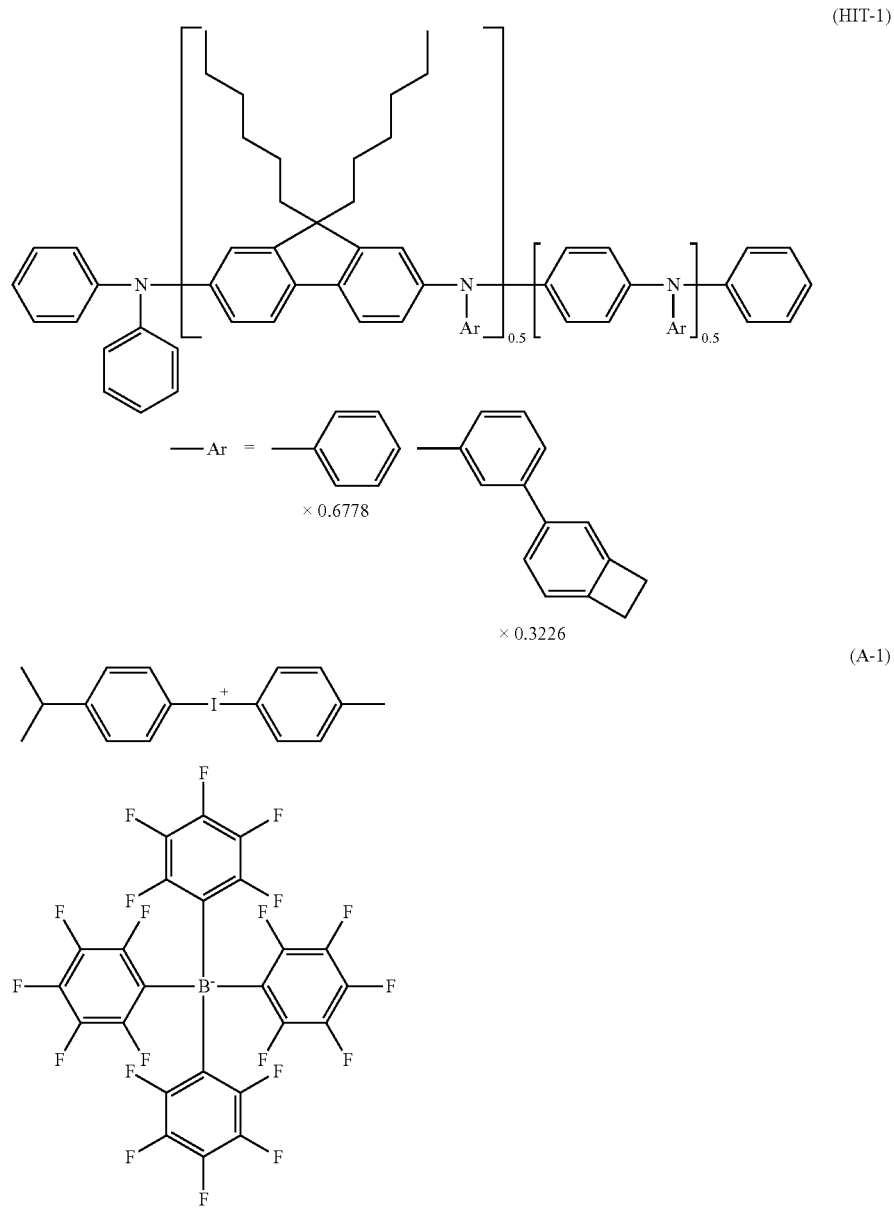

<Coating Fluid for Forming Hole Injection/Transport Layer 3>

| | |
|---|---|
| Solvent | ethyl benzoate |
| Coating fluid concentrations | HIT-1: 2.0 wt % |
| | A1: 0.4 wt % |

<Conditions for Forming Hole Injection/Transport Layer 3>

| | |
|---|---|
| Spinner rotation period | 30 sec |
| Spin coating atmosphere | in the air |
| Heating conditions | in the air; 230° C.; 1 hr |

Subsequently, a coating fluid for hole injection/transport layer 4 formation which contained the compounds represented by the following structural formulae (HIT-2) and (HIT-3) was prepared, and this coating fluid was applied on the hole injection/transport layer 3 by spin coating and heated under the following conditions to thereby polymerize the compounds. Thus, a hole injection/transport layer 4 having a thickness of 15 nm was formed.

[Chem. 42]

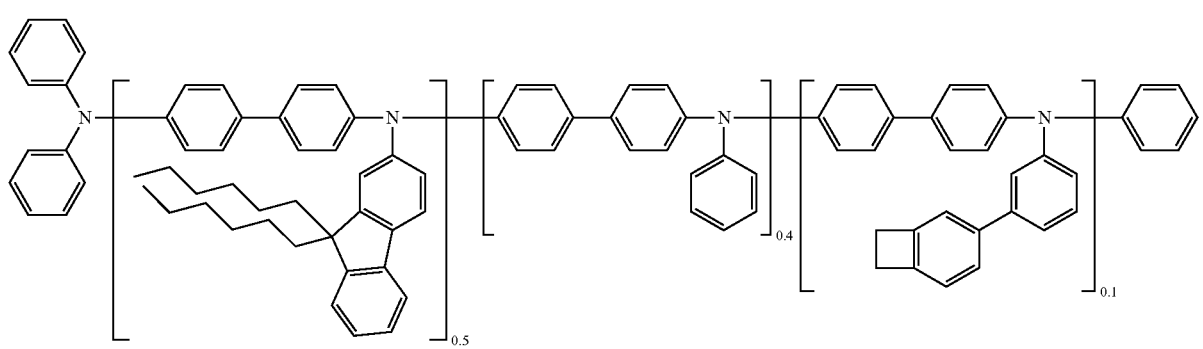

(HIT-2)

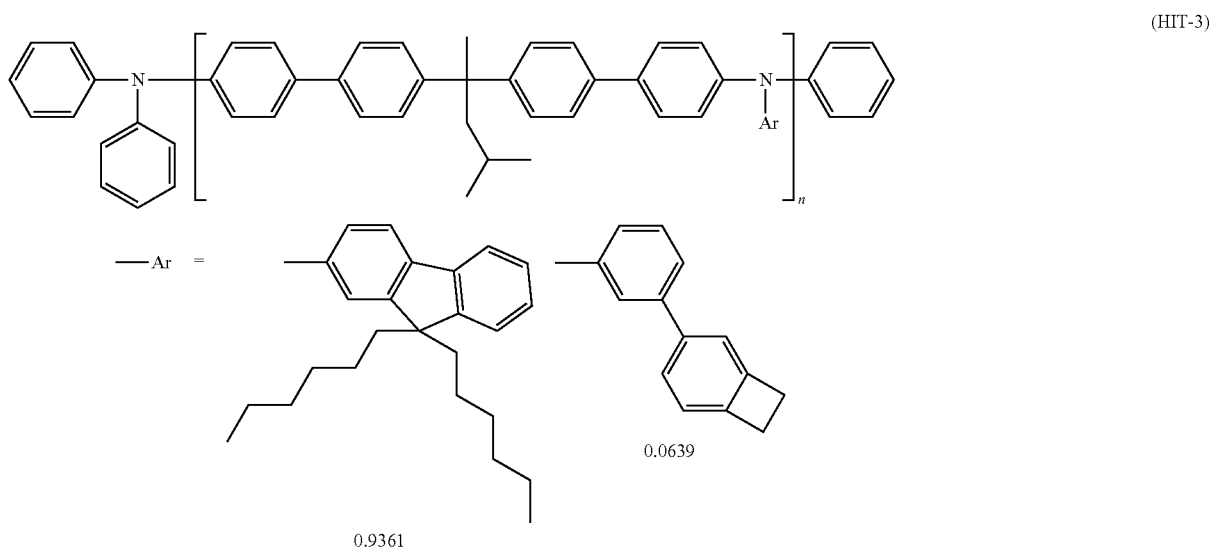

(HIT-3)

<Coating Fluid for Forming Hole Injection/Transport Layer 4>

| Solvent | cyclohexylbenzene |
| --- | --- |
| Coating fluid concentrations | HIT-2: 0.1 wt % |
|  | HIT-3: 0.9 wt % |

<Conditions for Forming Hole Injection/Transport Layer 4>

| Spinner rotation period | 120 sec |
| --- | --- |
| Spin coating atmosphere | in nitrogen |
| Heating conditions | 230° C.; 1 hr; in nitrogen |

Next, a coating fluid for luminescent layer 5 formation which contained the compounds represented by the following structural formulae (BH-1) and (BD-1) was prepared, and this coating fluid was applied by spin coating and heated under the following conditions. Thus, a luminescent layer 5 having a thickness of 45 nm was formed on the hole injection/transport layer 4.

[Chem. 43]

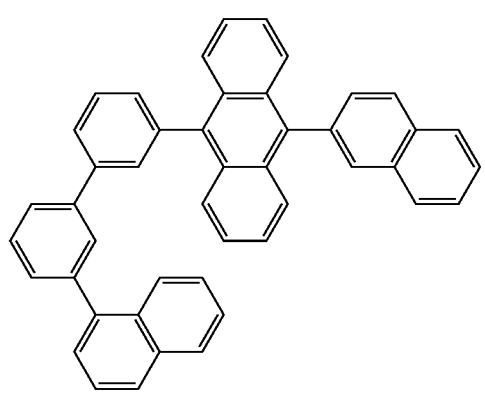

(BH-1)

-continued (BD-1)

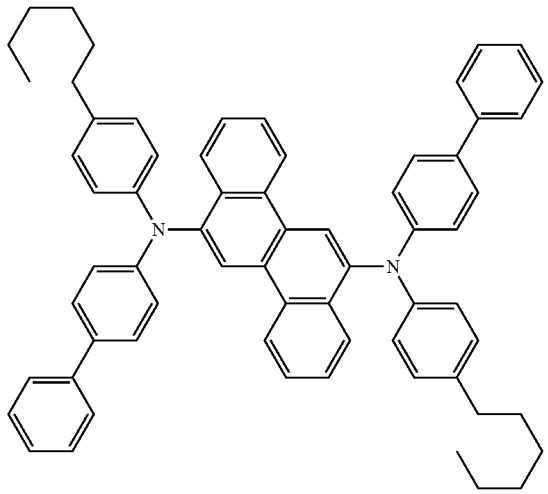

<Coating Fluid for Forming Luminescent Layer 5>

| Solvent | cyclohexylbenzene |
|---|---|
| Coating fluid concentrations | BH-1: 3.5 wt % |
| | BD-1: 0.35 wt % |

<Conditions for Forming Luminescent Layer 5>

| Spinner rotation period | 120 sec |
|---|---|
| Heating conditions | 130° C.; 10 min |

The substrate on which the layers including this luminescent layer 5 had been formed was transferred to a vacuum deposition apparatus, which was evacuated until the degree of vacuum within the apparatus became at least $2.0 \times 10^{-4}$ Pa. Thereafter, the compound represented by the following structural formula (HB-1) was deposited on the luminescent layer 5 by vacuum deposition at a deposition rate of 0.8-1.2 Å/sec to obtain a hole blocking layer 6 having a thickness of 10 nm.

[Chem. 44]

(HB-1)

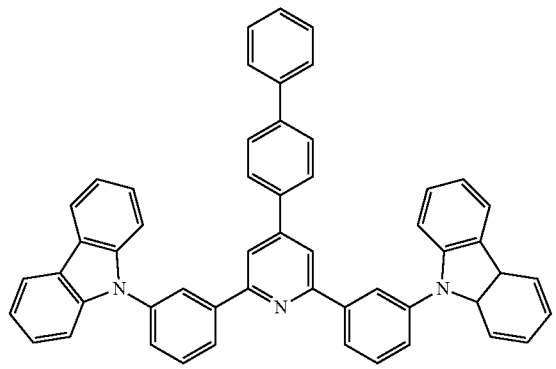

Furthermore, the organic compound (E1) having the structure shown below was deposited on the hole blocking layer 6 by vacuum deposition at a deposition rate of 0.8-1.2 Å/sec to obtain an electron transport layer 7 having a thickness of 20 nm.

[Chem. 45]

(E1)

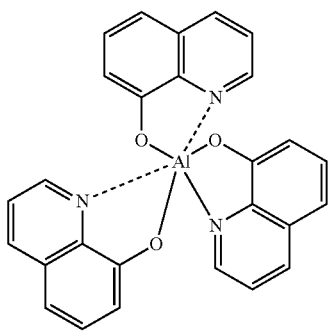

Here, the substrate on which layers including the electron transport layer 7 had been formed by deposition was transferred under vacuum to another chamber, which had been connected to the chamber in which the hole blocking layer 6 and the electron transport layer 7 had been vapor-deposited. A shadow mask in the form of stripes with a width of 2 mm was disposed, as a mask for cathode deposition, so that the mask was in close contact with the electron transport layer 7 and that these stripes were perpendicular to the ITO stripes of the anode 2.

First, using a molybdenum boat, lithium fluoride (LiF) was deposited at a deposition rate of 0.1-0.4 Å/sec to form a film thereof having a thickness of 0.5 nm as an electron injection layer 8 on the electron transport layer 7. Next, aluminum was heated in the same manner using a molybdenum boat to form an aluminum layer having a thickness of 80 nm, as a cathode 9, at a deposition rate of 0.7-5.3 Å/sec.

Subsequently, sealing was conducted in the following manner in order to prevent the element from being deteriorated by the action of atmospheric moisture, etc. during storage. In a gloved nitrogen box, a photocurable resin (30Y-437, manufactured by ThreeBond Co., Ltd.) was applied in a width of 1 mm to the periphery of a glass plate having a size of 23 mm×23 mm, and a moisture getter sheet (manufactured by Dynic Corp.) was disposed in a central part. The substrate on which the layers including the cathode had been formed was laminated thereto so that the side having the deposited layers faced the desiccant sheet. Thereafter, only the region where the photocurable resin had been applied was irradiated with ultraviolet light to cure the resin.

Thus, an organic electroluminescent element which had a luminescent area with a size of 2 mm×2 mm was obtained. The operating voltage of this element (operating voltage at a frontal luminance of 1,000 cd/m$^2$) is shown in Table 21.

Example 2

An organic electroluminescent element was produced in the same manner as in Example 1, except that in the formation of a hole injection/transport layer 4, the compound having the structure shown below (HIT-4) was used in place of the compound (HIT-2). The operating voltage of the element obtained (operating voltage at a frontal luminance of 1,000 cd/m$^2$) is shown in Table 21.

[Chem. 46]

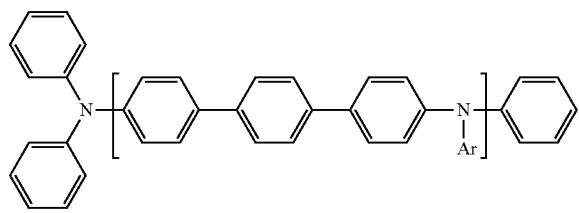

(HIT-4)

BCB = 0.88

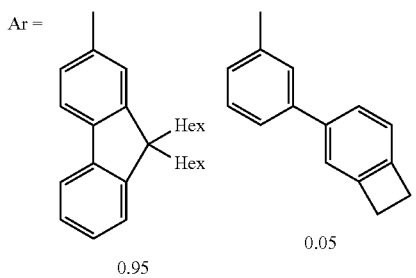

Example 3

An organic electroluminescent element was produced in the same manner as in Example 1, except that in the formation of a hole injection/transport layer 4, the compound having the structure shown below (HIT-5) was used in place of the compound (HIT-2). The operating voltage of the element obtained (operating voltage at a frontal luminance of 1,000 cd/m$^2$) is shown in Table 21.

<Coating Fluid for Forming Hole Injection/Transport Layer 3>

| Solvent | ethyl benzoate |
|---|---|
| Coating fluid concentrations | HIT-3: 2.0 wt % |
| | A1: 0.4 wt % |

<Coating Fluid for Forming Hole Injection/Transport Layer 4>

| Solvent | cyclohexylbenzene |
|---|---|
| Coating fluid concentrations | HIT-1: 0.75 wt % |
| | HIT-5: 0.25 wt % |

Comparative Example 2

An organic electroluminescent element was produced in the same manner as in Example 1, except that the coating fluid for forming a hole injection/transport layer 4 was changed as shown below. The operating voltage of the element obtained (operating voltage at a frontal luminance of 1,000 cd/m$^2$) is shown in Table 21.

<Coating Fluid for Forming Hole Injection/Transport Layer 4>

| Solvent | cyclohexylbenzene |
|---|---|
| Coating fluid concentration | HIT-3: 1.0 wt % |

[Chem. 47]

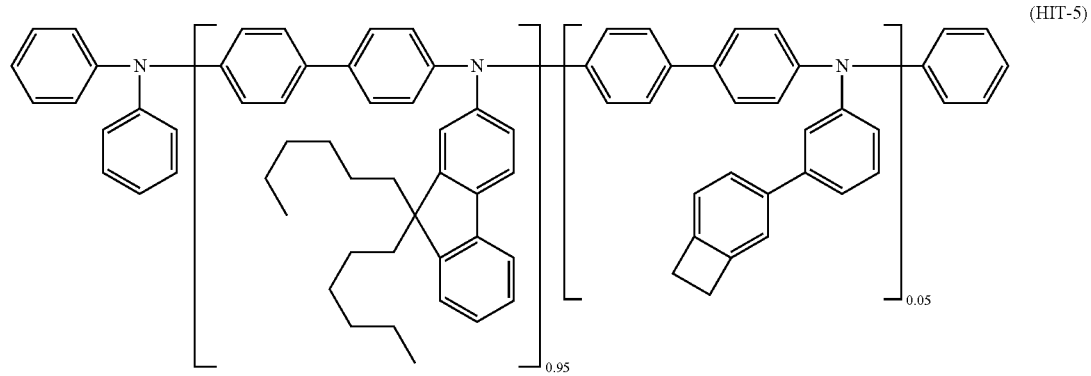

(HIT-5)

Comparative Example 1

An organic electroluminescent element was produced in the same manner as in Example 1, except that the coating fluids for forming a hole injection/transport layer 3 and for forming a hole injection/transport layer 4 were changed as shown below. The operating voltage of the element obtained (operating voltage at a frontal luminance of 1,000 cd/m$^2$) is shown in Table 21.

Comparative Example 3

An organic electroluminescent element was produced in the same manner as in Example 1, except that the compound having the structure shown below (HIT-12) was used in place of the HIT-2 and the coating fluid for forming a hole injection/transport layer 4 was changed as shown below. The operating voltage of the element obtained (operating voltage at a frontal luminance of 1,000 cd/m$^2$) is shown in Table 21.

[Chem. 48]

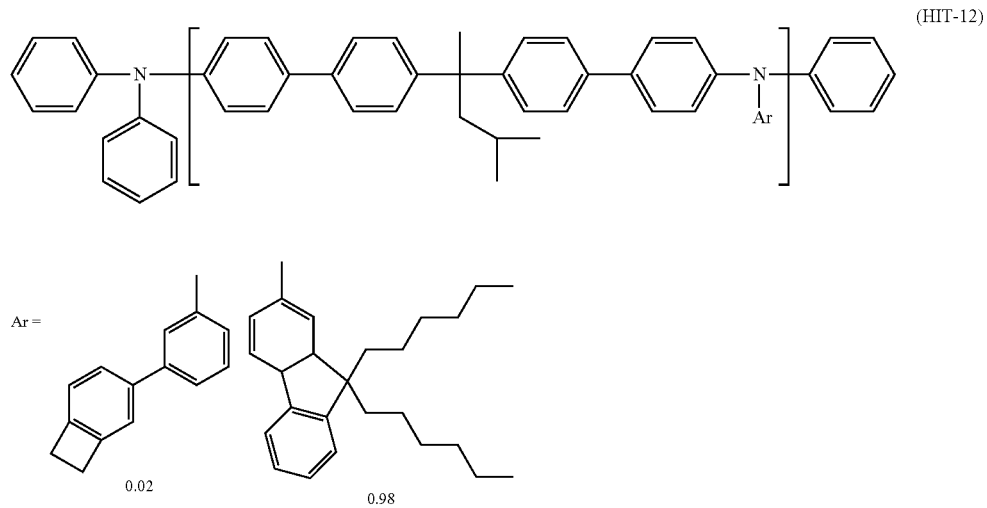

(HIT-12)

<Coating Fluid for Forming Hole Injection/Transport Layer 4>

| Solvent | cyclohexylbenzene |
|---|---|
| Coating fluid concentrations | HIT-3: 0.5 wt % |
| | HIT-12: 0.5 wt % |

The materials of the hole injection/transport layers formed in Examples 1 to 3 and Comparative Examples 1 to 3 and the minimum number of atoms between nitrogen atoms for each of these materials are shown in Table 20.

TABLE 20

| | Anode-side hole injection/ transport layer | | Cathode-side hole injection/transport layer | |
|---|---|---|---|---|
| | Material | Minimum number of atoms between nitrogen atoms | Material | Minimum number of atoms between nitrogen atoms |
| Example 1 | HIT-1 | 4 | HIT-2/HIT-3 | 8/17 |
| Example 2 | HIT-1 | 4 | HIT-4/HIT-3 | 12/17 |
| Example 3 | HIT-1 | 4 | HIT-5/HIT-3 | 8/17 |
| Comparative Example 1 | HIT-3 | 17 | HIT-1/HIT-5 | 4/8 |
| Comparative Example 2 | HIT-1 | 4 | HIT-3 | 17 |
| Comparative Example 3 | HIT-1 | 4 | HIT-3/HIT-12 | 17/17 |

TABLE 21

| | Operating voltage (V) at frontal luminance of 1,000 cd/m² |
|---|---|
| Example 1 | 6.4 |
| Example 2 | 6.7 |
| Example 3 | 6.7 |

TABLE 21-continued

| | Operating voltage (V) at frontal luminance of 1,000 cd/m² |
|---|---|
| Comparative Example 1 | 11.3 |
| Comparative Example 2 | 7.2 |
| Comparative Example 3 | 7.4 |

It can be seen from Table 20 and Table 21 that the organic electroluminescent elements of the invention each have a low operating voltage.

Example 4

An organic electroluminescent element was produced in the following manner.

In the same manner as in Example 1, an anode 2 was formed on a glass substrate 1 and the surface thereof was cleaned.

Next, a hole injection/transport layer 3 was formed in the same manner as in Example 1, except that the layer was formed in a thickness of 25 nm.

Subsequently, the following coating fluid for hole injection/transport layer 4A formation, which contained the compound having the structure shown below (HIT-6), was prepared, and this coating fluid was applied on the hole injection/transport layer 3 by spin coating and heated under the following conditions to thereby polymerize the compound. Thus, a hole injection/transport layer 4A having a thickness of 10 nm was formed.

[Chem. 49]

(HIT-6)

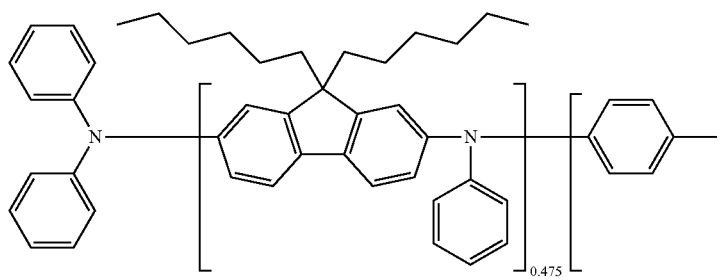

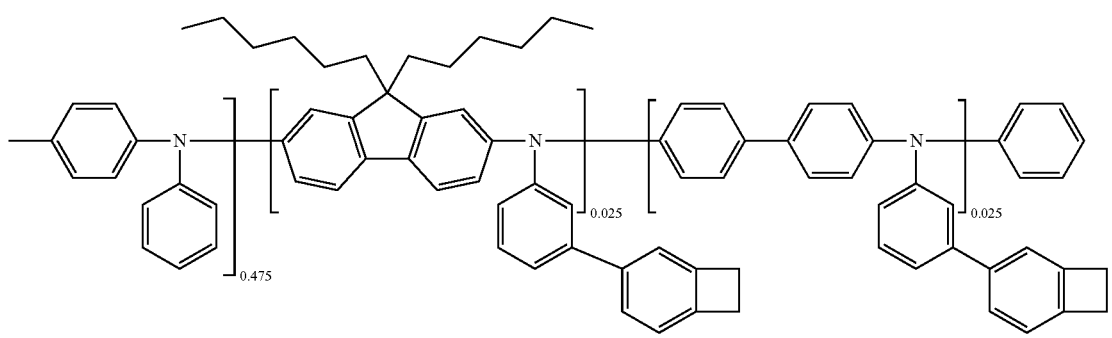

<Coating Fluid for Forming Hole Injection/Transport Layer 4A>

| Solvent | cyclohexylbenzene |
|---|---|
| Coating fluid concentration | HIT-6: 1 wt % |

<Conditions for Forming Hole Injection/Transport Layer 4A>

| Spinner rotation period | 120 sec |
|---|---|
| Spin coating atmosphere | in nitrogen |
| Heating conditions | 230° C.; 1 hr; in nitrogen |

Subsequently, the following coating fluid for hole injection/transport layer 4B formation, which contained (HIT-3), was prepared, and this coating fluid was applied on the hole injection/transport layer 4A by spin coating and heated under the following conditions to thereby polymerize the compound. Thus, a hole injection/transport layer 4B having a thickness of 10 nm was formed.

<Coating Fluid for Forming Hole Injection/Transport Layer 4B>

| Solvent | cyclohexylbenzene |
|---|---|
| Coating fluid concentration | HIT-3: 1 wt % |

<Conditions for Forming Hole Injection/Transport Layer 4B>

| Spinner rotation period | 120 sec |
|---|---|
| Spin coating atmosphere | in nitrogen |
| Heating conditions | 230° C.; 1 hr; in nitrogen |

Next, a luminescent layer 5, hole blocking layer 6, electron transport layer 7, electron injection layer 8, and cathode 9 were formed on the hole injection/transport layer 4B and sealing was conducted, in the same manner as in Example 1. Thus, an organic electroluminescent element which had a luminescent area with a size of 2 mm×2 mm was obtained. The operating voltage of this element (operating voltage at a frontal luminance of 1,000 cd/m$^2$) is shown in Table 23.

Example 5

An organic electroluminescent element was produced in the same manner as in Example 4, except that in the formation of a luminescent layer 5, the compounds having the structures shown below (RH-1, RH-2, GD-1, and RD-1) were used in place of the compounds (BH-1 and BD-1) to prepare the following coating fluid for luminescent layer 5 formation, and that a luminescent layer 5 was formed under the following conditions. The operating voltage of the element obtained (operating voltage at a frontal luminance of 1,000 cd/m$^2$) is shown in Table 23.

(RH-1)
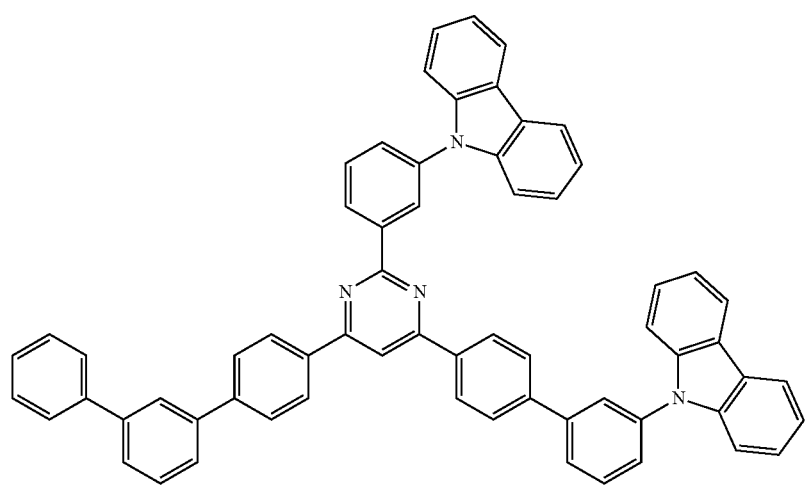
(RH-2)
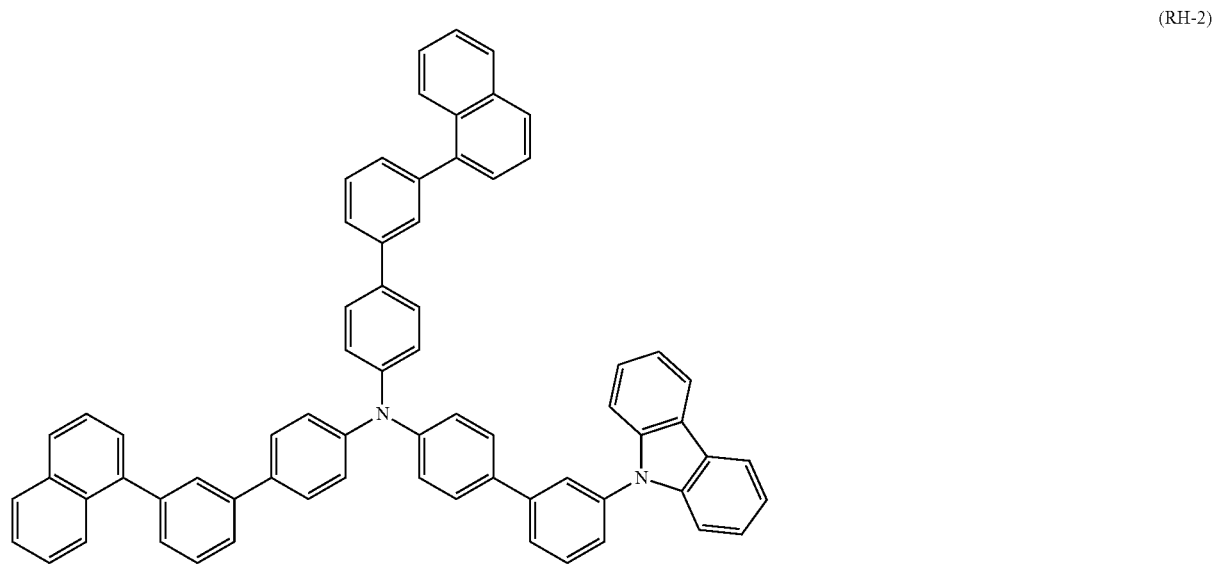
(GD-1)
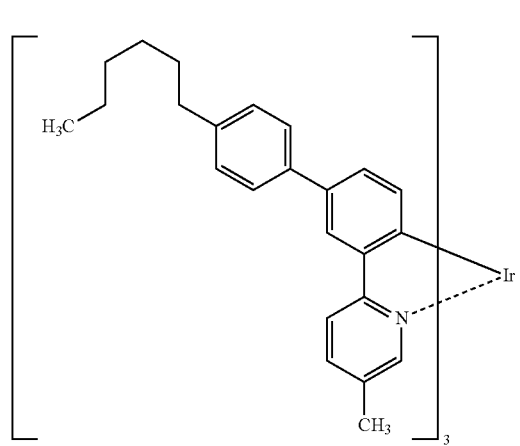
(RD-1)
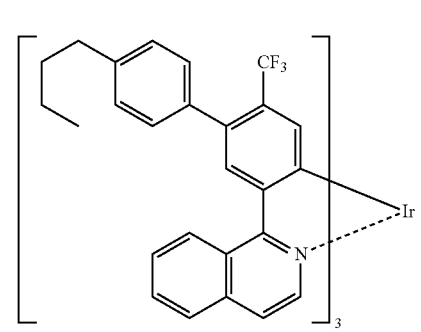

147

\<Coating Fluid for Forming Luminescent Layer 5\>

| Solvent | cyclohexylbenzene |
|---|---|
| Coating fluid concentrations | RH-1: 1.2 wt % |
| | RH-2: 3.6 wt % |
| | GD-1: 0.24 wt % |
| | RD-1: 0.34 wt % |

\<Conditions for Forming Luminescent Layer 5\>

| Spinner rotation period | 120 sec |
|---|---|
| Heating conditions | 130° C.; 20 min |

Example 6

An organic electroluminescent element was produced in the same manner as in Example 4, except that in the formation of a luminescent layer 5, the compounds having the structures shown below (GH-1, GH-2, and GD-1) were used in place of the compounds (BH-1 and BD-1) to prepare the following coating fluid for luminescent layer 5 formation, and that a luminescent layer 5 was formed therefrom. The operating voltage of the element obtained (operating voltage at a frontal luminance of 1,000 cd/m$^2$) is shown in Table 23.

[Chem. 51]

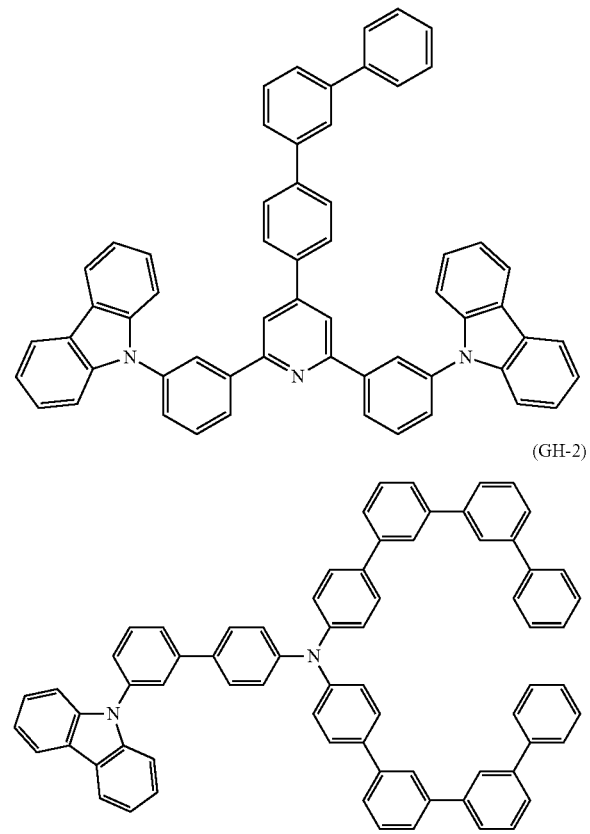

(GH-1)

(GH-2)

148

-continued

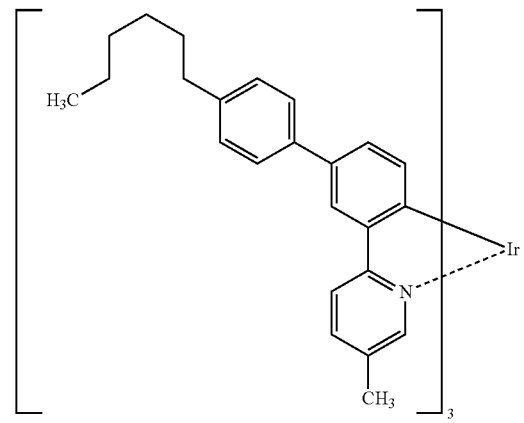

(GD-1)

\<Coating Fluid for Forming Luminescent Layer 5\>

| Solvent | cyclohexylbenzene |
|---|---|
| Coating fluid concentrations | GH-1: 1.2 wt % |
| | GH-2: 3.6 wt % |
| | GD-1: 0.48 wt % |

The materials of the hole injection/transport layers formed in Examples 4 to 6 and the minimum number of atoms between nitrogen atoms for each of these materials are shown in Table 22.

TABLE 22

| | Anode-side hole injection/ transport layer | | Intermediate hole injection/ transport layer | | Cathode-side hole injection/ transport layer | |
|---|---|---|---|---|---|---|
| | Material | Minimum number of atoms between nitrogen atoms | Material | Minimum number of atoms between nitrogen atoms | Material | Minimum number of atoms between nitrogen atoms |
| Example 4 | HIT-1 | 4 | HIT-6 | 8 | HIT-3 | 17 |
| Example 5 | HIT-1 | 4 | HIT-6 | 8 | HIT-3 | 17 |
| Example 6 | HIT-1 | 4 | HIT-6 | 8 | HIT-3 | 17 |

TABLE 23

| | Operating voltage (V) at frontal luminance of 1,000 cd/m$^2$ |
|---|---|
| Example 4 | 6.5 |
| Example 5 | 9 |
| Example 6 | 6.5 |

Example 7

An organic electroluminescent element was produced in the same manner as in Example 1, except that the compounds having the structures shown below (HIT-7 to HIT-9) were used in place of the HIT-1, that HIT-3 and the compounds having the structures shown below (HIT-11 and HIT-13) were used in place of the HIT-2 and HIT-3, and that the coating fluids for forming a hole injection/transport layer 3 and for forming a hole injection/transport layer 4 were changed as shown below. The operating voltage of the resultant element at an applied current of 10 mA is shown in Table 25 in terms of voltage relative to the operating voltage of the element of Comparative Example 3, which was taken as ±0 V, as measured at an applied current of 10 mA (i.e., in terms of difference in voltage from Comparative Example 3).
[Chem. 52]
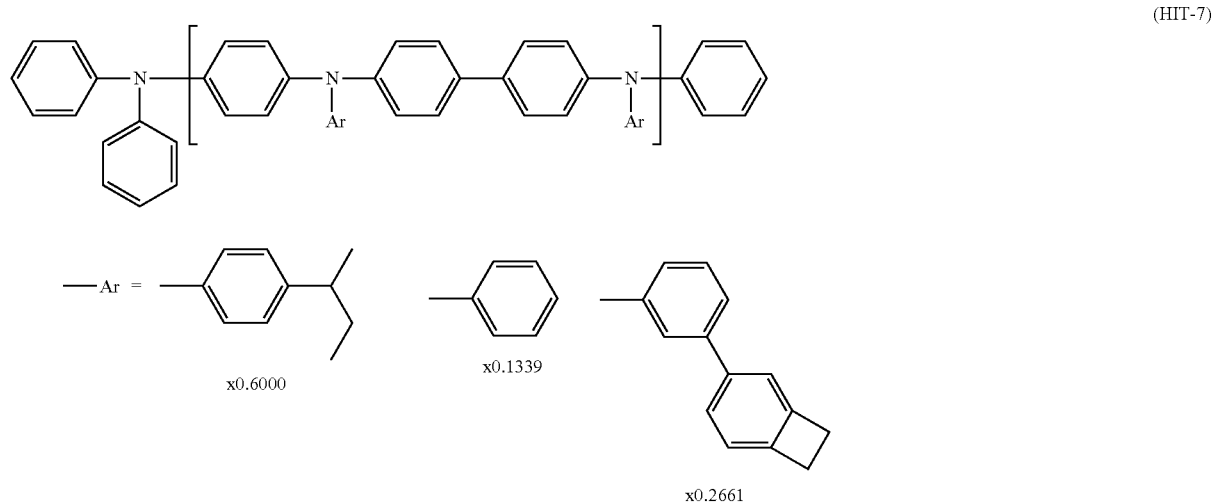
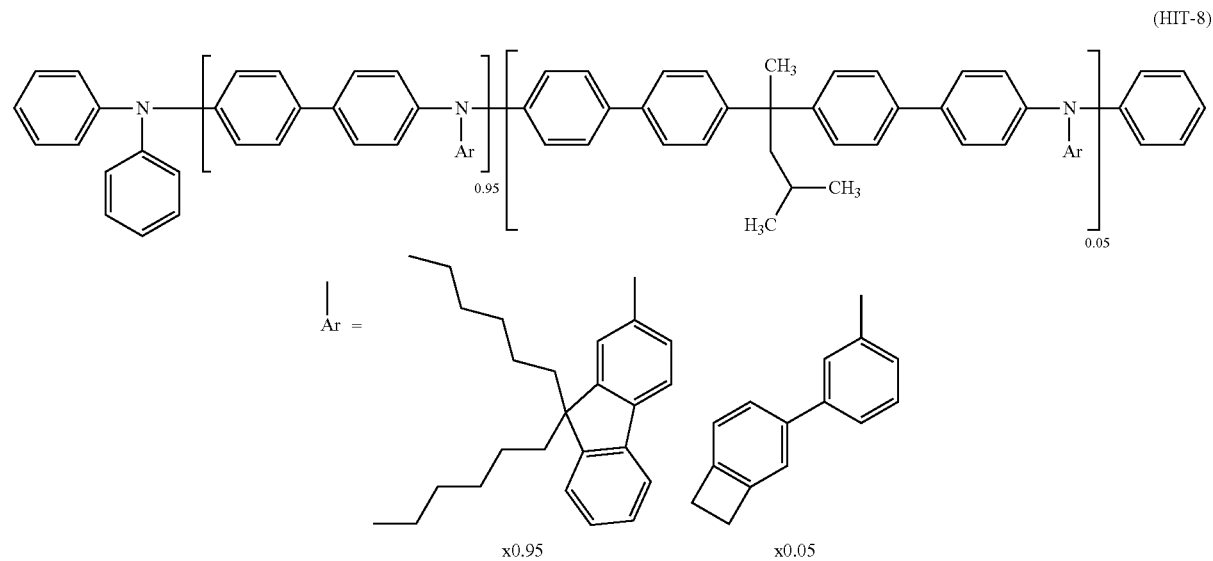

-continued
(HIT-9)
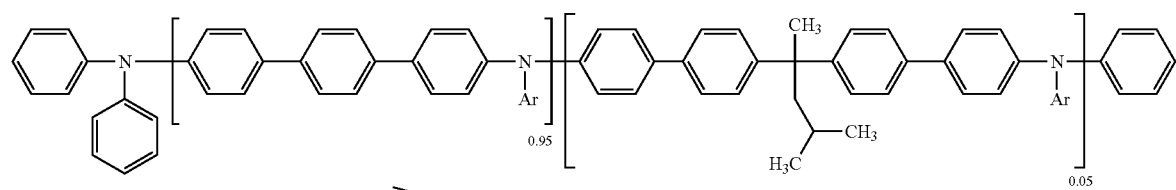
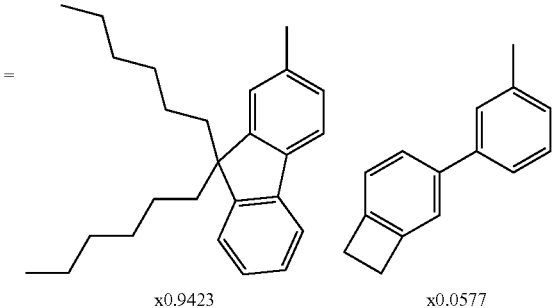
(HIT-11)
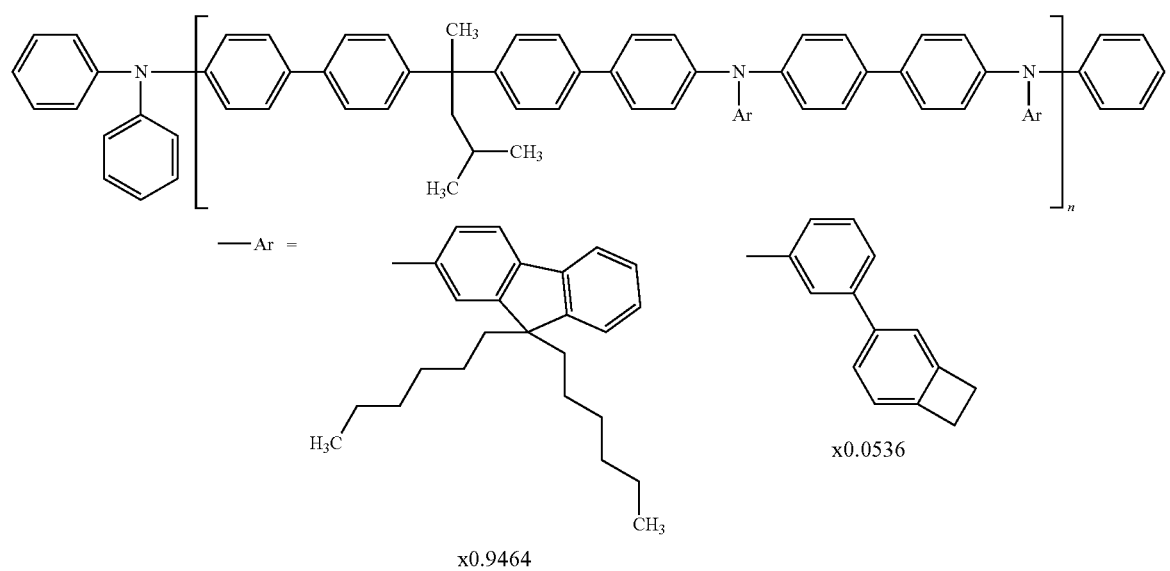
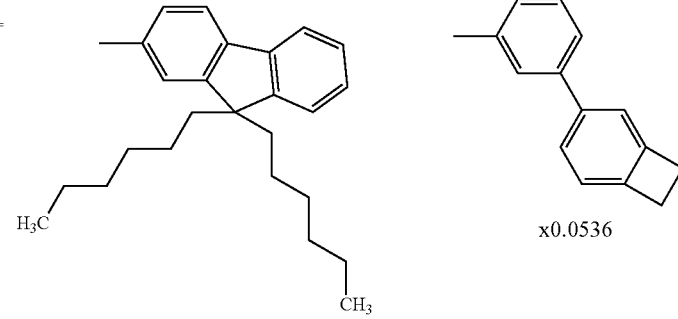
(HIT-13)
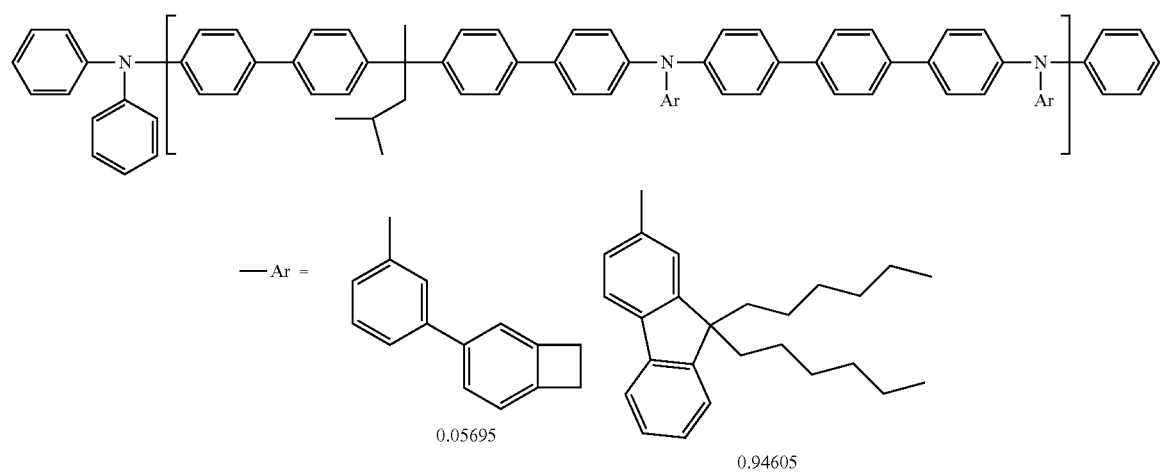
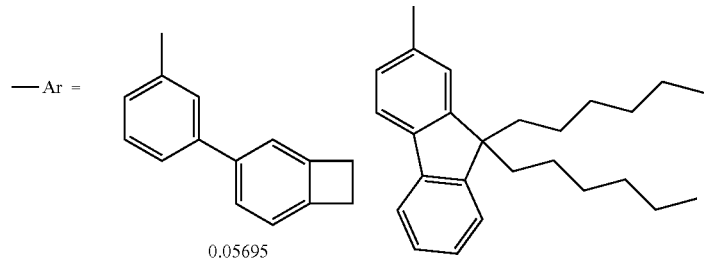

<Coating Fluid for Forming Hole Injection/Transport Layer 3>

| Solvent | ethyl benzoate |
|---|---|
| Coating fluid concentrations | HIT-7: 1.2 wt % |
| | HIT-8: 0.4 wt % |
| | HIT-9: 0.4 wt % |
| | A1: 0.4 wt % |

<Coating Fluid for Forming Hole Injection/Transport Layer 4>

| Solvent | cyclohexylbenzene |
|---|---|
| Coating fluid concentrations | HIT-3: 0.33 wt % |
| | HIT-11: 0.33 wt % |
| | HIT-13: 0.33 wt % |

Example 8

An organic electroluminescent element was produced in the same manner as in Example 1, except that HIT-1 and HIT-5 were used in place of the HIT-1 alone, that the compounds having the structures shown below (HIT-14 and HIT-15) were used in place of the HIT-2 and HIT-3, and that the coating fluids for forming a hole injection/transport layer 3 and for forming a hole injection/transport layer 4 were changed as shown below. The operating voltage of the resultant element at an applied current of 10 mA is shown in Table 25 in terms of voltage relative to the operating voltage of the element of Comparative Example 3, which was taken as ±0 V, as measured at an applied current of 10 mA (i.e., in terms of difference in voltage from Comparative Example 3).

<Coating Fluid for Forming Hole Injection/Transport Layer 3>

| Solvent | ethyl benzoate |
|---|---|
| Coating fluid concentrations | HIT-1: 1.5 wt % |
| | HIT-5: 0.5 wt % |
| | A1: 0.4 wt % |

<Coating Fluid for Forming Hole Injection/Transport Layer 4>

| Solvent | cyclohexylbenzene |
|---|---|
| Coating fluid concentrations | HIT-14: 0.1 wt % |
| | HIT-15: 0.9 wt % |

Example 9

An organic electroluminescent element was produced in the same manner as in Example 1, except that HIT-11 and the compounds having the structures shown below (HIT-18 and HIT-19) were used in place of the HIT-1, that HIT-4 and the compounds having the structures shown below (HIT-15 and HIT-17) were used in place of the HIT-2 and HIT-3, and that the coating fluids for forming a hole injection/transport layer 3 and for forming a hole injection/transport layer 4 were changed as shown below. The operating voltage of the resultant element at an applied current of 10 mA is shown in Table 25 in terms of voltage relative to the operating voltage of the element of Comparative Example 3, which was taken as ±0 V, as measured at an applied current of 10 mA (i.e., in terms of difference in voltage from Comparative Example 3).

[Chem. 53]

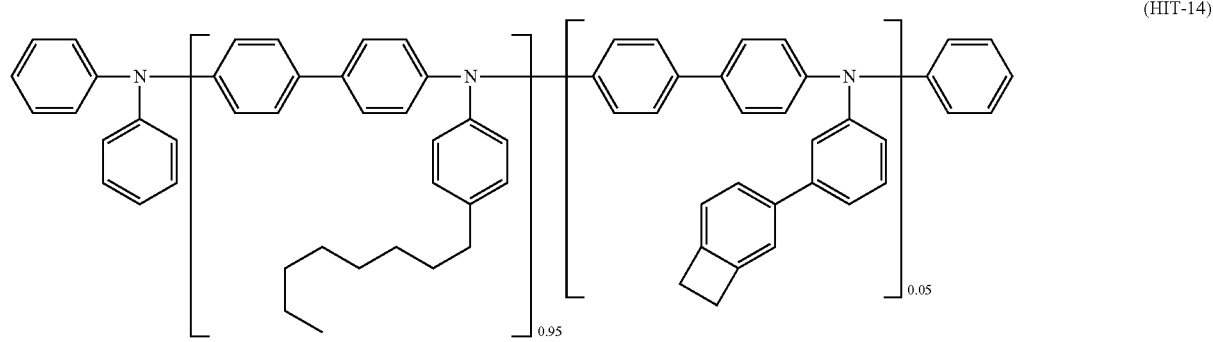

(HIT-14)

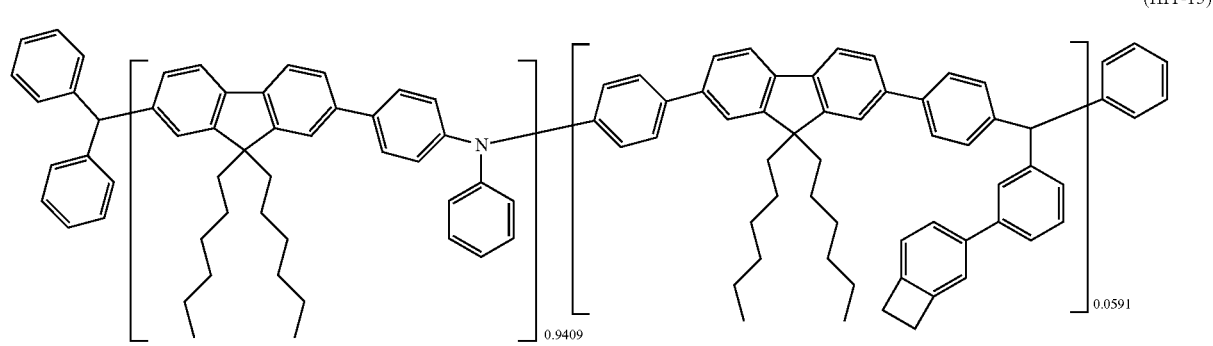

(HIT-15)

[Chem. 54]
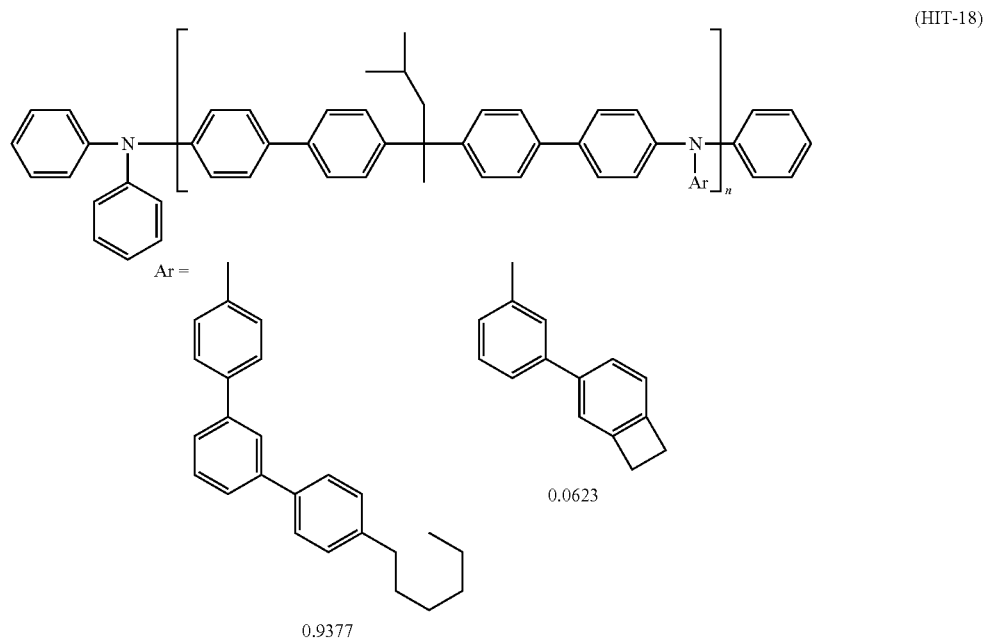
(HIT-18)
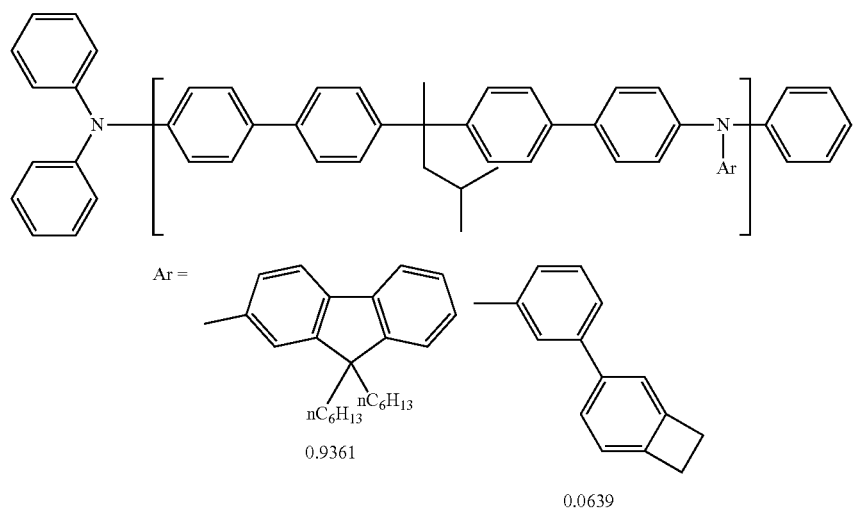
(HIT-19)

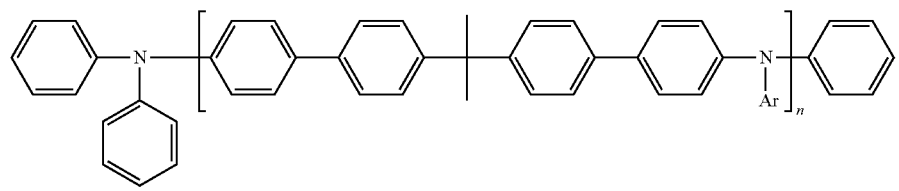

(HIT-17)

Ar =

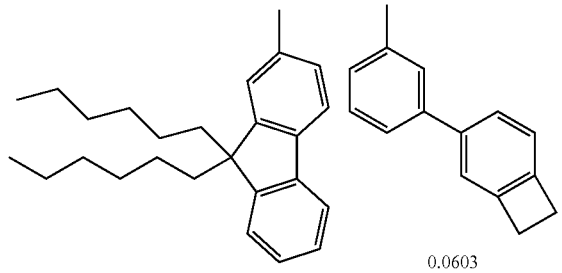

0.9397    0.0603

<Coating Fluid for Forming Hole Injection/Transport Layer 3>

| Solvent | ethyl benzoate |
|---|---|
| Coating fluid concentrations | HIT-18: 1.2 wt % |
| | HIT-19: 0.4 wt % |
| | HIT-11: 0.4 wt % |
| | A1: 0.4 wt % |

<Coating Fluid for Forming Hole Injection/Transport Layer 4>

| Solvent | cyclohexylbenzene |
|---|---|
| Coating fluid concentrations | HIT-4: 0.33 wt % |
| | HIT-15: 0.33 wt % |
| | HIT-17: 0.33 wt % |

The materials of the hole injection/transport layers formed in Examples 7 to 9 and the minimum number of atoms between nitrogen atoms for each of these materials are shown in Table 24.

In Table 25 are also shown the values of the operating voltage of the elements obtained in Comparative Examples 2 and 3, as measured at an applied current of 10 mA, in terms of voltage relative to the operating voltage of the element of Comparative Example 3, which was taken as ±0 V, as measured at an applied current of 10 mA (i.e., in terms of difference in voltage from Comparative Example 3).

TABLE 25

| | Operating voltage (V) at applied current of 10 mA |
|---|---|
| Example 7 | −0.8 |
| Example 8 | −0.2 |
| Example 9 | −0.5 |
| Comparative Example 1 | +3.7 |
| Comparative Example 2 | +0.1 |
| Comparative Example 3 | 0.0 |

Example 10

An organic electroluminescent element was produced in the same manner as in Example 1, except that the coating fluids for forming a hole injection/transport layer 3 and for forming a hole injection/transport layer 4 were changed as shown below, that compounds (RH-1 and RH-2) and the compound having the structure shown below (RD-2) were used in place of the compounds (BH-1 and BD-1) for the luminescent layer 5 to prepare the following coating fluid for luminescent layer 5 formation, and that a luminescent layer having a thickness of 50 nm was formed under the following conditions. The operating voltage of the resultant element at an applied current of 10 mA is shown in Table 27 in terms of voltage relative to the operating voltage at 10 mA of the element of Comparative Example 4, which will be given later, the latter operating voltage being taken as ±0 V (i.e., in terms of difference in voltage from Comparative Example 4).

TABLE 24

| | Anode-side hole injection/transport layer | | Cathode-side hole injection/transport layer | |
|---|---|---|---|---|
| | Material | Minimum number of atoms between nitrogen atoms | Material | Minimum number of atoms between nitrogen atoms |
| Example 7 | HIT-7/HIT-8/HIT-9 | 4/8/12 | HIT-11/HIT-13/HIT-3 | 8/12/17 |
| Example 8 | HIT-1/HIT-5 | 4/8 | HIT-14/HIT-15 | 8/15 |
| Example 9 | HIT-18/HIT-19/HIT-11 | 17/17/8 | HIT-4/HIT-15/HIT-17 | 12/15/17 |

<Coating Fluid for Forming Hole Injection/Transport Layer 3>

| Solvent | ethyl benzoate |
|---|---|
| Coating fluid concentrations | HIT-1: 1.5 wt % |
| | HIT-5: 0.5 wt % |
| | A1: 0.4 wt % |

<Coating Fluid for Forming Hole Injection/Transport Layer 4>

| Solvent | cyclohexylbenzene |
|---|---|
| Coating fluid concentration | HIT-3: 1.0 wt % |

[Chem. 55]

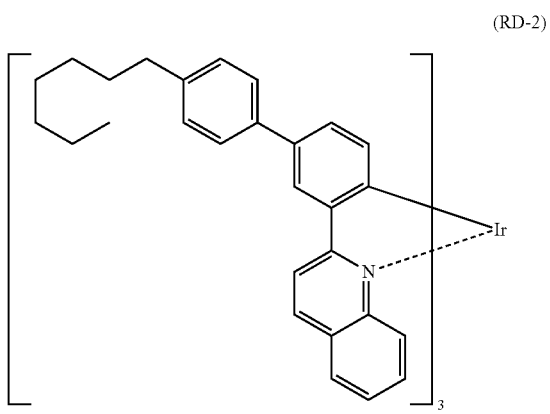

(RD-2)

<Coating Fluid for Forming Luminescent Layer 5>

| Solvent | cyclohexylbenzene |
|---|---|
| Coating fluid concentrations | RH-1: 1.2 wt % |
| | RH-2: 3.6 wt % |
| | RD-2: 0.48 wt % |

<Conditions for Forming Luminescent Layer 5>

| Spinner rotation period | 120 sec |
|---|---|
| Heating conditions | 130° C.; 20 min |

Example 11

An organic electroluminescent element was produced in the same manner as in Example 10, except that the coating fluid for forming a hole injection/transport layer 4 was changed as shown below. The operating voltage of the resultant element at an applied current of 10 mA is shown in Table 27 in terms of voltage relative to the operating voltage at 10 mA of the element of Comparative Example 4, which will be given later, the latter operating voltage being taken as ±0 V (i.e., in terms of difference in voltage from Comparative Example 4).

<Coating Fluid for Forming Hole Injection/Transport Layer 4>

| Solvent | cyclohexylbenzene |
|---|---|
| Coating fluid concentrations | HIT-3: 0.5 wt % |
| | HIT-4: 0.5 wt % |

Example 12

An organic electroluminescent element was produced in the same manner as in Example 10, except that the coating fluids for forming a hole injection/transport layer 3 and for forming a hole injection/transport layer 4 were changed as shown below. The operating voltage of the resultant element at an applied current of 10 mA is shown in Table 27 in terms of voltage relative to the operating voltage at 10 mA of the element of Comparative Example 4, which will be given later, the latter operating voltage being taken as ±0 V (i.e., in terms of difference in voltage from Comparative Example 4).

<Coating Fluid for Forming Hole Injection/Transport Layer 3>

| Solvent | ethyl benzoate |
|---|---|
| Coating fluid concentrations | HIT-1: 1.6 wt % |
| | HIT-4: 0.4 wt % |
| | A1: 0.4 wt % |

<Coating Fluid for Forming Hole Injection/Transport Layer 4>

| Solvent | cyclohexylbenzene |
|---|---|
| Coating fluid concentrations | HIT-3: 0.5 wt % |
| | HIT-11: 0.5 wt % |

Comparative Example 4

An organic electroluminescent element was produced in the same manner as in Example 10, except that the coating fluids for forming a hole injection/transport layer 3 and for forming a hole injection/transport layer 4 were changed as shown below. The operating voltage of the resultant element at an applied current of 10 mA is shown in Table 27 as a reference for the operating voltages at 10 mA of the elements of Examples 10 to 12.

<Coating Fluid for Forming Hole Injection/Transport Layer 3>

| Solvent | ethyl benzoate |
|---|---|
| Coating fluid concentrations | HIT-1: 2.0 wt % |
| | A1: 0.4 wt % |

<Coating Fluid for Forming Hole Injection/Transport Layer 4>

| Solvent | cyclohexylbenzene |
|---|---|
| Coating fluid concentration | HIT-3: 1.0 wt % |

The materials of the hole injection/transport layers formed in Examples 10 to 12 and Comparative Example 4 and the minimum number of atoms between nitrogen atoms for each of these materials are shown in Table 26.

TABLE 26

| | Anode-side hole injection/transport layer | | Cathode-side hole injection/transport layer | |
|---|---|---|---|---|
| | Material | Minimum number of atoms between nitrogen atoms | Material | Minimum number of atoms between nitrogen atoms |
| Example 10 | HIT-1/HIT-5 | 4/8 | HIT-3 | 17 |
| Example 11 | HIT-1/HIT-5 | 4/8 | HIT-4/HIT-3 | 12/17 |
| Example 12 | HIT-1/HIT-4 | 4/12 | HIT-11/HIT-3 | 8/17 |
| Comparative Example 4 | HIT-1 | 4 | HIT-3 | 17 |

TABLE 27

| | Operating voltage (V) at applied current of 10 mA |
|---|---|
| Example 10 | −0.6 |
| Example 11 | −1.4 |

TABLE 27-continued

| | Operating voltage (V) at applied current of 10 mA |
|---|---|
| Example 12 | −0.6 |
| Comparative Example 4 | 0 |

Example 13

An organic electroluminescent element was produced in the same manner as in Example 1, except that the compound having the structure shown below (HIT-10) was used and the coating fluid for forming a hole injection/transport layer 4 was changed as shown below, that the compounds (GH-2 and GD-1) and the compound having the structure shown below (GH-3) were used in place of the compounds (BH-1 and BD-1) for the luminescent layer 5 to prepare the following coating fluid for luminescent layer 5 formation, and that a luminescent layer 5 having a thickness of 50 nm was formed under the following conditions. The operating voltage of the resultant element at an applied current of 10 mA is shown in Table 29 in terms of voltage relative to the operating voltage at 10 mA of the element of Comparative Example 5, which will be given later, the latter operating voltage being taken as ±0 V (i.e., in terms of difference in voltage from Comparative Example 5).

[Chem. 56]

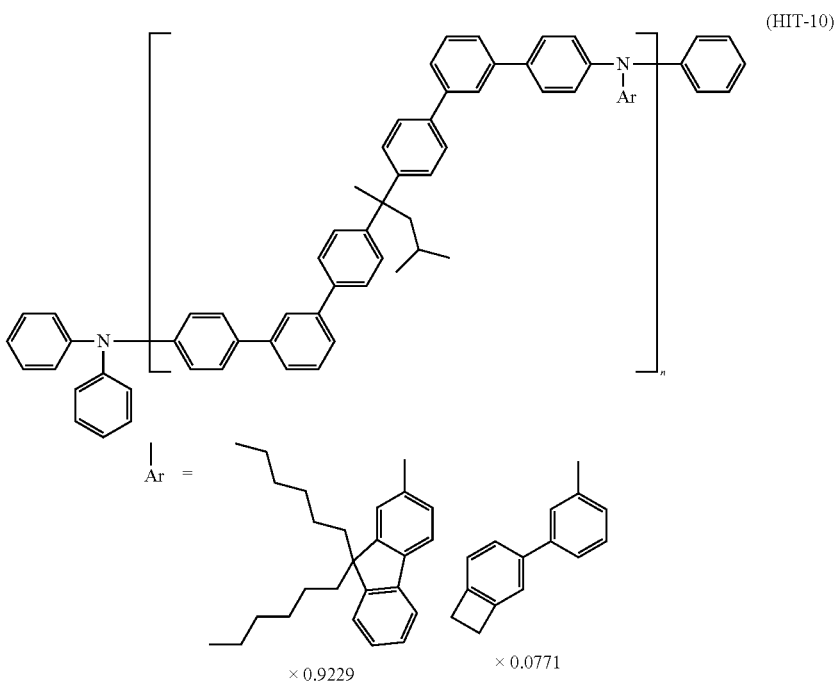

163

<Coating Fluid for Forming Hole Injection/Transport Layer 4>

| Solvent | cyclohexylbenzene |
|---|---|
| Coating fluid concentrations | HIT-3: 0.33 wt % |
| | HIT-10: 0.33 wt % |
| | HIT-11: 0.33 wt % |

[Chem. 57]

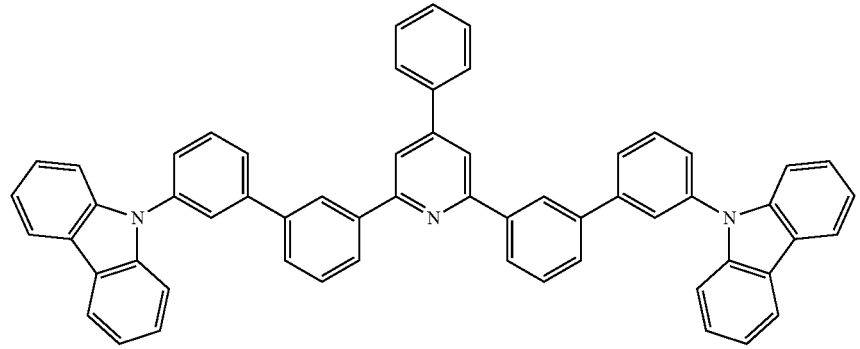

(GH-3)

<Coating Fluid for Forming Luminescent Layer 5>

| Solvent | cyclohexylbenzene |
|---|---|
| Coating fluid concentrations | GH-3: 1.2 wt % |
| | GH-2: 3.6 wt % |
| | GD-1: 0.48 wt % |

<Conditions for Forming Luminescent Layer 5>

| Spinner rotation period | 120 sec |
|---|---|
| Heating conditions | 130° C.; 20 min |

Example 14

An organic electroluminescent element was produced in the same manner as in Example 13, except that the coating fluids for forming a hole injection/transport layer 3 and for forming a hole injection/transport layer 4 were changed as shown below. The operating voltage of the resultant element at an applied current of 10 mA is shown in Table 29 in terms of voltage relative to the operating voltage at 10 mA of the element of Comparative Example 5, which will be given later, the latter operating voltage being taken as ±0 V (i.e., in terms of difference in voltage from Comparative Example 5).

<Coating Fluid for Forming Hole Injection/Transport Layer 3>

| Solvent | ethyl benzoate |
|---|---|
| Coating fluid concentrations | HIT-7: 1.2 wt % |
| | HIT-8: 0.4 wt % |
| | HIT-9: 0.4 wt % |
| | A1: 0.4 wt % |

164

<Coating Fluid for Forming Hole Injection/Transport Layer 4>

| Solvent | cyclohexylbenzene |
|---|---|
| Coating fluid concentration | HIT-10: 1.0 wt % |

Example 15

An organic electroluminescent element was produced in the same manner as in Example 13, except that the coating fluids for forming a hole injection/transport layer 3 and for forming a hole injection/transport layer 4 were changed as shown below. The operating voltage of the resultant element at an applied current of 10 mA is shown in Table 29 in terms of voltage relative to the operating voltage at 10 mA of the element of Comparative Example 5, which will be given later, the latter operating voltage being taken as ±0 V (i.e., in terms of difference in voltage from Comparative Example 5).

<Coating Fluid for Forming Hole Injection/Transport Layer 3>

| Solvent | ethyl benzoate |
|---|---|
| Coating fluid concentrations | HIT-1: 1.5 wt % |
| | HIT-5: 0.5 wt % |
| | A1: 0.4 wt % |

<Coating Fluid for forming Hole Injection/Transport Layer 4>

| Solvent | cyclohexylbenzene |
|---|---|
| Coating fluid concentrations | HIT-3: 0.33 wt % |
| | HIT-10: 0.33 wt % |
| | HIT-11: 0.33 wt % |

Comparative Example 5

An organic electroluminescent element was produced in the same manner as in Example 13, except that the coating fluid for forming a hole injection/transport layer 4 was changed as shown below. The operating voltage of the resultant element at an applied current of 10 mA is shown in Table 29 as a reference for the operating voltages at 10 mA of the elements of Examples 13 to 15.

<Coating Fluid for Forming Hole Injection/Transport Layer 4>

| Solvent | cyclohexylbenzene |
|---|---|
| Coating fluid concentration | HIT-10: 1.0 wt % |

The materials of the hole injection/transport layers formed in Examples 13 to 15 and Comparative Example 5 and the minimum number of atoms between nitrogen atoms for each of these materials are shown in Table 28.

TABLE 28

| | Anode-side hole injection/ transport layer | | Cathode-side hole injection/ transport layer | |
|---|---|---|---|---|
| | Material | Minimum number of atoms between nitrogen atoms | Material | Minimum number of atoms between nitrogen atoms |
| Example 13 | HIT-1 | 4 | HIT-11/HIT-3/ HIT-10 | 8/17/23 |
| Example 14 | HIT-7/HIT-8/ HIT-9 | 4/8/12 | HIT-10 | 23 |
| Example 15 | HIT-1/HIT-5 | 4/8 | HIT-11/HIT-3/ HIT-10 | 8/17/23 |
| Comparative Example 5 | HIT-1 | 4 | HIT-10 | 23 |

TABLE 29

| | Operating voltage (V) at applied current of 10 mA |
|---|---|
| Example 13 | −1.1 |
| Example 14 | −0.5 |
| Example 15 | −1.7 |
| Comparative Example 5 | 0.0 |

Example 16

An organic electroluminescent element was produced in the same manner as in Example 1, except that the coating fluid for forming a hole injection/transport layer 3 was changed as shown below and that after a hole injection/transport layer 3 was superposed, the organic compound (E1) was deposited by vacuum deposition on the hole injection/transport layer 3, without superposing the hole injection/transport layer 4, to obtain a luminescent layer 5 having a thickness of 60 nm. The operating voltage of the resultant element at a frontal luminance of 1,000 cd/m² is shown in Table 31 as a reference for the operating voltages at a frontal luminance of 1,000 cd/m² of the elements of Examples 17 and 18, which will be given later.
<Coating Fluid for Forming Hole Injection/Transport Layer 3>

| Solvent | ethyl benzoate |
|---|---|
| Coating fluid concentrations | HIT-7: 1.2 wt % |
| | HIT-8: 0.4 wt % |
| | HIT-9: 0.4 wt % |
| | A1: 0.4 wt % |

Example 17

An organic electroluminescent element was obtained in the same manner as in Example 1, except that the coating fluids for forming a hole injection/transport layer 3 and for forming a hole injection/transport layer 4 were changed as shown below and that the organic compound (E1) was deposited by vacuum deposition on the hole injection/transport layer 4 to obtain a luminescent layer 5 having a thickness of 60 nm. The operating voltage of the resultant element at a frontal luminance of 1,000 cd/m² is shown in Table 31 in terms of voltage relative to the operating voltage at a frontal luminance of 1,000 cd/m² of the element of Example 16, which was taken as ±0 V (i.e., in terms of difference in voltage from Example 16).
<Coating Fluid for Forming Hole Injection/Transport Layer 3>

| Solvent | ethyl benzoate |
|---|---|
| Coating fluid concentrations | HIT-11: 0.4 wt % |
| | HIT-18: 1.2 wt % |
| | HIT-19: 0.4 wt % |
| | A1: 0.4 wt % |

<Coating Fluid for Forming Hole Injection/Transport Layer 4>

| Solvent | cyclohexylbenzene |
|---|---|
| Coating fluid concentrations | HIT-3: 0.33 wt % |
| | HIT-10: 0.33 wt % |
| | HIT-11: 0.33 wt % |

Example 18

An organic electroluminescent element was obtained in the same manner as in Example 1, except that the coating fluids for forming a hole injection/transport layer 3 and for forming a hole injection/transport layer 4 were changed as shown below and that the organic compound (E1) was deposited by vacuum deposition on the hole injection/transport layer 4 to obtain a luminescent layer 5 having a thickness of 60 nm. The operating voltage of the resultant element at a frontal luminance of 1,000 cd/m² is shown in Table 31 in terms of voltage relative to the operating voltage at a frontal luminance of 1,000 cd/m² of the element of Example 16, which was taken as ±0 V (i.e., in terms of difference in voltage from Example 16).
<Coating Fluid for Forming Hole Injection/Transport Layer 3>

| Solvent | ethyl benzoate |
|---|---|
| Coating fluid concentrations | HIT-7: 1.2 wt % |
| | HIT-8: 0.4 wt % |
| | HIT-9: 0.4 wt % |
| | A1: 0.4 wt % |

<Coating Fluid for Forming Hole Injection/Transport Layer 4>

| Solvent | cyclohexylbenzene |
|---|---|
| Coating fluid concentration | HIT-3: 1.0% |

Comparative Example 6

An organic electroluminescent element was produced in the same manner as in Example 16, except that the coating fluid for forming a hole injection/transport layer 3 was changed as shown below. A voltage which was higher by 2 V than the voltage used for measuring the operating voltage of the element of Example 16 was applied to the element obtained. However, the element did not luminesce at a frontal luminance of 1,000 cd/m².

<Coating Fluid for Forming Hole Injection/Transport Layer 3>

| Solvent | ethyl benzoate |
|---|---|
| Coating fluid concentrations | HIT-1: 2.0 wt % |
|  | A1: 0.4 wt % |

The materials of the hole injection/transport layers formed in Examples 16 to 18 and Comparative Example 6 and the minimum number of atoms between nitrogen atoms for each of these materials are shown in Table 30.

TABLE 30

| | Anode-side hole injection/transport layer | | Cathode-side hole injection/transport layer | |
|---|---|---|---|---|
| | Material | Minimum number of atoms between nitrogen atoms | Material | Minimum number of atoms between nitrogen atoms |
| Example 16 | HIT-7/HIT-8/HIT-9 | 4/8/12 | — | — |
| Example 17 | HIT-18/HIT-19/HIT-11 | 17/17/8 | HIT-11/HIT-3/HIT-10 | 8/17/23 |
| Example 18 | HIT-7/HIT-8/HIT-9 | 4/8/12 | HIT-3 | 17 |
| Comparative Example 6 | HIT-1 | 4 | — | — |

TABLE 31

| | Operating voltage (V) at frontal luminance of 1,000 cd/m² |
|---|---|
| Example 16 | 0 |
| Example 17 | −0.5 |
| Example 18 | −0.4 |

It can be seen from the results of the Examples and Comparative Examples given above that in each of the elements according to the invention, a reduction in voltage can be attained.

While the invention has been described in detail and with reference to specific embodiments thereof, it will be apparent to one skilled in the art that various changes and modifications can be made therein without departing from the spirit and scope thereof. This application is based on a Japanese patent application filed on Jan. 14, 2011 (Application No. 2011-6014) and a Japanese patent application filed on Nov. 15, 2011 (Application No. 2011-249769), the contents thereof being incorporated herein by reference.

INDUSTRIAL APPLICABILITY

According to the invention, an organic electroluminescent element which can be operated at a low voltage can be provided. Use of this element makes it possible to obtain light sources for low-power-consumption flat-panel displays for OA computers, wall-mounting TVs, etc. or for display panels, marker lamps, and copiers and light sources which take advantage of the feature of a surface light emitter, e.g., the backlights of liquid-crystal displays and instruments, etc.

REFERENCE SIGNS LIST

1 Substrate
2 Anode
3, 4 Hole injection/transport layer
5 Luminescent layer
6 Hole blocking layer
7 Electron transport layer
8 Electron injection layer
9 Cathode
10 Hole injection/transport layer

The invention claimed is:

1. An organic electroluminescent element, which at least comprises an anode, a hole injection/transport layer A, a luminescent layer and a cathode, in this order, wherein the hole injection/transport layer A comprises two or more layers each formed by a wet film formation method using a composition which contains a hole-injecting/transporting compound, and satisfies all of the following requirements (a) to (c):

(a) the number of kind of the hole-injecting/transporting compound contained in the composition to be used for forming the hole injection/transport layer A is 3 or more in total, with the proviso that when the hole-injecting/transporting compound is a polymer compound, two or more polymer compounds which differ only in copolymerization ratio are regarded to be the same kind;

(b) the compositions to be used for forming the at least two layers included in the hole injection/transport layer A each contain, as a hole-injecting/transporting compound, at least one kind of arylamine polymer compound which has a repeating unit having a triarylamine structure therein, the arylamine polymer compounds being different from each other in kind; and (c) when the number of atom present on the path which is the smallest in the number of atoms present thereon, of the paths which each connect the nonaromatic tertiary nitrogen atoms contained in any two triarylamine structures present in each arylamine polymer compound, is taken as N: the minimum number of atoms between nitrogen atoms in the compound, and when the layer located most on the cathode side and the layer located most on the anode side, among the two or more layers each formed using a composition containing the arylamine polymer compound, are expressed by Lc and La, respectively, the maximum value of N for all arylamine polymer compounds contained in the composition to be used for forming the layer Lc is expressed by $Nc_{max}$, and the minimum value of N for all arylamine polymer compounds contained in the composition to be used for forming the layer La is expressed by $Na_{min}$, then the $Nc_{max}$ and the $Na_{min}$ satisfy $Nc_{max} \geq Na_{min}$, wherein:

with respect to any two adjoining layers among the two or more layers each formed by a wet film formation method using a composition containing the arylamine polymer compound, the composition to be used for forming the anode-side layer contains one or more kinds of the arylamine compounds, and the composition for forming the layer which adjoins the cathode-side surface contains two or more kinds of the arylamine polymer compounds; or wherein with respect to any two adjoining layers among the two or more layers each formed by a wet film formation method using a composition containing the arylamine polymer compound, the composition to be used for forming the cathode-side layer contains one or more kinds of the arylamine compounds, and the composition for forming the layer which adjoins the anode-side surface contains two or more kinds of the arylamine polymer compounds.

2. The organic electroluminescent element according to claim 1, wherein the $Nc_{max}$ and the $Na_{min}$ satisfy $Nc_{max} > Na_{min}$.

3. The organic electroluminescent element according to claim 1, wherein when, of any two or more of the layers each formed by a wet film formation method using a composition containing the arylamine polymer compound, the layer located more on the cathode side is expressed by Lc' and the layer located more on the anode side is expressed by La' and when the minimum value of N for all arylamine polymer compounds contained in the composition to be used for forming the layer Lc' is expressed by $Nc'_{min}$ and the maximum value of N for all arylamine polymer compounds contained in the composition to be used for forming the layer La' is expressed by $Na'_{max}$, then the $Nc'_{min}$ and the $Na'_{max}$ satisfy $Nc'_{min} \geq Na'_{max}$.

4. The organic electroluminescent element according to claim 3, wherein the $Nc'_{min}$ and the $Na'_{max}$ satisfy $Nc'_{min} > Na'_{max}$.

5. The organic electroluminescent element according to claim 1, wherein the $Na_{min}$ is 2 or more but 10 or less.

6. The organic electroluminescent element according to claim 1, wherein the $Nc_{max}$ is 9 or larger.

7. The organic electroluminescent element according to claim 1, wherein the hole injection/transport layer A comprises three or more layers.

8. The organic electroluminescent element according to claim 1, wherein the compositions to be used for forming all layers possessed by the hole injection/transport layer A each contain the arylamine polymer compound.

9. The organic electroluminescent element according to claim 1, wherein each of the compositions to be used for forming layers possessed by the hole injection/transport layer A contains arylamine polymer compounds which are different in kind from each other.

10. The organic electroluminescent element according to claim 1, wherein the nonaromatic tertiary nitrogen atoms possessed by each arylamine polymer compound each are contained in the main chain of the arylamine polymer compound.

11. The organic electroluminescent element according to claim 1, wherein at least one of the arylamine polymer compounds has a crosslinkable group.

12. The organic electroluminescent element according to claim 1, wherein the composition to be used for forming the layer La, among the layers possessed by the hole injection/transport layer A, contains an electron-accepting compound in an amount of 0.1% by weight or more but less than 50% by weight.

13. The organic electroluminescent element according to claim 12, wherein the electron-accepting compound forms an ion pair with the hole-injecting/transporting compound in the layer La.

14. A composition for organic electroluminescent element which is for forming a layer to be interposed between an anode and a luminescent layer of an organic electroluminescent element by a wet film formation method, and satisfies the following requirements (d) and (e):

(d) the composition contains three or more kinds of arylamine polymer compounds which have a repeating unit having a triarylamine structure therein, with the proviso that two or more arylamine polymer compounds which differ only in copolymerization ratio are regarded to be the same kind; and (e) when the number of atoms present on the path which is the smallest in the number of atoms present thereon, of the paths which each connect the nonaromatic tertiary nitrogen atoms contained in any two triarylamine structures present in each arylamine polymer compound, is taken as N: the minimum number of atoms between nitrogen atoms in the compound, then two or more of the three or more kinds of arylamine polymer compounds differ in N from each other.

15. The composition for organic electroluminescent element according to claim 14, which comprises three or more of the arylamine polymer compounds that differ in N from each other.

16. The composition for organic electroluminescent element according to claim 14, wherein when the minimum value and maximum value of N for the arylamine polymer compounds contained in the composition are expressed by $N_{min}$ and $N_{max}$, respectively, the $N_{max}$ is larger than 2.0 times the $N_{min}$ ($N_{max} > 2.0 N_{min}$).

17. The composition for organic electroluminescent element according to claim 14, wherein when the minimum value and maximum value of N for the arylamine polymer compounds contained in the composition are expressed by $N_{min}$ and $N_{max}$, respectively, then the composition contains an arylamine polymer compound in which the value of N is ($N_{max} - 4$) or less but ($N_{min} + 4$) or larger ($N_{max} - 4 \geq N \geq N_{min} + 4$).

18. An organic electroluminescent element comprising a layer formed by a wet film formation method using the composition for organic electroluminescent element according to claim 14.

19. An organic electroluminescent device comprising the organic electroluminescent element according to claim 1.

20. An organic electroluminescent device comprising two or more organic electroluminescent elements which differ from each other in the color of luminescence, wherein at least one of the organic electroluminescent elements is the organic electroluminescent element according to claim 1.

21. An organic electroluminescent device comprising a plurality of organic electroluminescent elements, wherein all of the organic electroluminescent elements are the organic electroluminescent element according to claim 1.

22. The organic electroluminescent device according to claim 20, wherein any of the hole injection/transport layers possessed by the two or more organic electroluminescent elements have the same composition.

23. An organic electroluminescent element, which at least comprises an anode, a hole injection/transport layer A, a luminescent layer and a cathode, in this order, wherein the hole injection/transport layer A comprises two or more layers each formed by a wet film formation method using a composition which contains a hole-injecting/transporting compound, and satisfies all of the following requirements (a) to (c):

(a) the number of kind of the hole-injecting/transporting compound contained in the composition to be used for forming the hole injection/transport layer A is 3 or more in total, with the proviso that when the hole-injecting/transporting compound is a polymer compound, two or more polymer compounds which differ only in copolymerization ratio are regarded to be the same kind;

(b) the compositions to be used for forming the at least two layers included in the hole injection/transport layer A each contain, as a hole-injecting/transporting compound, at least one kind of arylamine polymer compound which has a repeating unit having a triarylamine structure therein, the arylamine polymer compounds being different from each other in kind; and (c) when the number of atom present on the path which is the smallest in the number of atoms present thereon, of the paths which each connect the nonaromatic tertiary nitrogen atoms contained in any two triarylamine structures present in each arylamine polymer compound, is taken as N: the minimum number of atoms between nitrogen atoms in the compound, and when the layer located most on the cathode side and the layer located most on the anode side, among the two or more layers each formed using a composition containing the arylamine polymer compound, are expressed by Lc and La, respectively, the maximum value of N for all arylamine polymer compounds contained in the composition to be used for forming the layer Lc is expressed by $Nc_{max}$, and the minimum value of N for all arylamine polymer compounds contained in the composition to be used for forming the layer La is expressed by $Na_{min}$, then the $Nc_{max}$ and the $Na_{min}$ satisfy $Nc_{max} \geq Na_{min}$, wherein the $Nc_{max}$ is 9 or larger.

24. The organic electroluminescent element according to claim 23, wherein the $Nc_{max}$ and the $Na_{min}$ satisfy $Nc_{min} > Na_{min}$.

25. The organic electroluminescent element according to claim 23, wherein when, of any two or more of the layers each formed by a wet film formation method using a composition containing the arylamine polymer compound, the layer located more on the cathode side is expressed by Lc' and the layer located more on the anode side is expressed by La' and when the minimum value of N for all arylamine polymer compounds contained in the composition to be used for forming the layer Lc' is expressed by $Nc'_{min}$ and the maximum value of N for all arylamine polymer compounds contained in the composition to be used for forming the layer La' is expressed by $Na'_{max}$, then the $Nc'_{min}$ and the $Na'_{max}$ satisfy $Nc'_{min} \geq Na'_{max}$.

26. The organic electroluminescent element according to claim 25, wherein the $Nc'_{min}$ and the $Na'_{max}$ satisfy $Nc'_{min} > Na'_{max}$.

27. The organic electroluminescent element according to claim 23, wherein the $Na_{min}$ is 2 or more but 10 or less.

28. The organic electroluminescent element according to claim 23, wherein the hole injection/transport layer A comprises three or more layers.

29. The organic electroluminescent element according to claim 23, wherein the compositions to be used for forming all layers possessed by the hole injection/transport layer A each contain the arylamine polymer compound.

30. The organic electroluminescent element according to claim 23, wherein each of the compositions to be used for forming layers possessed by the hole injection/transport layer A contains arylamine polymer compounds which are different in kind from each other.

31. The organic electroluminescent element according to claim 23, wherein the nonaromatic tertiary nitrogen atoms possessed by each arylamine polymer compound each are contained in the main chain of the arylamine polymer compound.

32. The organic electroluminescent element according to claim 23, wherein at least one of the arylamine polymer compounds has a crosslinkable group.

33. The organic electroluminescent element according to claim 23, wherein the composition to be used for forming the layer La, among the layers possessed by the hole injection/transport layer A, contains an electron-accepting compound in an amount of 0.1% by weight or more but less than 50% by weight.

34. The organic electroluminescent element according to claim 33, wherein the electron-accepting compound forms an ion pair with the hole-injecting/transporting compound in the layer La.

35. An organic electroluminescent device comprising the organic electroluminescent element according to claim 23.

36. An organic electroluminescent device comprising two or more organic electroluminescent elements which differ from each other in the color of luminescence, wherein at least one of the organic electroluminescent elements is the organic electroluminescent element according to claim 23.

37. An organic electroluminescent device, wherein all of the organic electroluminescent elements are the organic electroluminescent element according to claim 23.

38. The organic electroluminescent device according to claim 36, wherein any of the hole injection/transport layers possessed by the two or more organic electroluminescent elements have the same composition.

39. An organic electroluminescent element, which at least comprises an anode, a hole injection/transport layer A, a luminescent layer and a cathode, in this order, wherein the hole injection/transport layer A comprises three or more layers each formed by a wet film formation method using a composition which contains a hole-injecting/transporting compound, and satisfies all of the following requirements (a) to (c):

(a) the number of kind of the hole-injecting/transporting compound contained in the composition to be used for forming the hole injection/transport layer A is 3 or more in total, with the proviso that when the hole-injecting/transporting compound is a polymer compound, two or more polymer compounds which differ only in copolymerization ratio are regarded to be the same kind;

(b) the compositions to be used for forming the at least two layers included in the hole injection/transport layer A each contain, as a hole-injecting/transporting compound, at least one kind of arylamine polymer compound which has a repeating unit having a triarylamine structure therein, the arylamine polymer compounds being different from each other in kind; and (c) when the number of atom present on the path which is the smallest in the number of atoms present thereon, of the paths which each connect the nonaromatic tertiary nitrogen atoms contained in any two triarylamine structures present in each arylamine polymer compound, is taken as N: the minimum number of atoms between nitrogen atoms in the compound, and when the layer located most on the cathode side and the layer located most on the anode side, among the two or more layers each formed using a composition containing the arylamine polymer compound, are expressed by Lc and La, respectively, the maximum value of N for all arylamine polymer compounds contained in the composition to be used for forming the layer Lc is expressed by $Nc_{max}$, and the minimum value of N for all arylamine polymer compounds contained in the composition to be used for forming the layer La is expressed by $Na_{min}$, then the $Nc_{max}$ and the $Na_{min}$ satisfy $Nc_{max} \geq Na_{min}$.

40. The organic electroluminescent element according to claim 39, wherein the $Nc_{max}$ and the $Na_{min}$ satisfy $Nc_{max} > Na_{min}$.

41. The organic electroluminescent element according to claim 39, wherein when, of any two or more of the layers each formed by a wet film formation method using a composition containing the arylamine polymer compound, the layer located more on the cathode side is expressed by Lc' and the layer located more on the anode side is expressed by La' and when the minimum value of N for all arylamine polymer compounds contained in the composition to be used for forming the layer Lc' is expressed by $Nc'_{min}$ and the maximum value of N for all arylamine polymer compounds contained in the composition to be used for forming the layer La' is expressed by $Na'_{max}$, then the $Nc'_{min}$ and the $Na'_{max}$ satisfy $Nc'_{min} \geq Na'_{max}$.

42. The organic electroluminescent element according to claim 41, wherein the $Nc'_{min}$ and the $Na'_{max}$ satisfy $Nc'_{min} > Na'_{max}$.

43. The organic electroluminescent element according to claim 39, wherein the $Na_{min}$ is 2 or more but 10 or less.

44. The organic electroluminescent element according to claim 39, wherein the compositions to be used for forming all layers possessed by the hole injection/transport layer A each contain the arylamine polymer compound.

45. The organic electroluminescent element according to claim 39, wherein each of the compositions to be used for forming layers possessed by the hole injection/transport layer A contains arylamine polymer compounds which are different in kind from each other.

46. The organic electroluminescent element according to claim 39, wherein the nonaromatic tertiary nitrogen atoms possessed by each arylamine polymer compound each are contained in the main chain of the arylamine polymer compound.

47. The organic electroluminescent element according to claim 39, wherein at least one of the arylamine polymer compounds has a crosslinkable group.

48. The organic electroluminescent element according to claim 39, wherein the composition to be used for forming the layer La, among the layers possessed by the hole injection/transport layer A, contains an electron-accepting compound in an amount of 0.1% by weight or more but less than 50% by weight.

49. An organic electroluminescent element according to claim 48, wherein the electron-accepting compound forms an ion pair with the hole-injecting/transporting compound in the layer La.

50. An organic electroluminescent device comprising the organic electroluminescent element according to claim 39.

51. An organic electroluminescent device comprising two or more organic electroluminescent elements which differ from each other in the color of luminescence, wherein at least one of the organic electroluminescent elements is the organic electroluminescent element according to claim 39.

52. An organic electroluminescent device comprising a plurality of organic electroluminescent elements, wherein all of the organic electroluminescent elements are the organic electroluminescent element according to claim 39.

53. The organic electroluminescent device according to claim 51, wherein any of the hole injection/transport layers possessed by the two or more organic electroluminescent elements have the same composition.

* * * * *